United States Patent
Kwon et al.

(10) Patent No.: US 8,963,308 B2
(45) Date of Patent: Feb. 24, 2015

(54) SEMICONDUCTOR PACKAGES INCLUDING A PLURALITY OF UPPER SEMICONDUCTOR DEVICES ON A LOWER SEMICONDUCTOR DEVICE

(71) Applicants: Heung-Kyu Kwon, Seongnam-si (KR); Young-Bae Kim, Hwaseong-si (KR); Yun-Hee Lee, Hwaseong-si (KR)

(72) Inventors: Heung-Kyu Kwon, Seongnam-si (KR); Young-Bae Kim, Hwaseong-si (KR); Yun-Hee Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/188,417

(22) Filed: Feb. 24, 2014

(65) Prior Publication Data

US 2014/0167260 A1 Jun. 19, 2014

Related U.S. Application Data

(63) Continuation of application No. 13/550,921, filed on Jul. 17, 2012, now Pat. No. 8,698,301.

(30) Foreign Application Priority Data

Oct. 25, 2011 (KR) ........................ 10-2011-0109548

(51) Int. Cl.
*H01L 23/02* (2006.01)
*H01L 23/498* (2006.01)
(Continued)

(52) U.S. Cl.
CPC ...... *H01L 23/49811* (2013.01); *H01L 25/0652* (2013.01); *H01L 25/0655* (2013.01); *H01L 25/105* (2013.01); *H01L 23/36* (2013.01); *H01L 2225/06537* (2013.01); *H01L 2224/04042* (2013.01); *H01L 2224/06155* (2013.01); *H01L 2224/16225* (2013.01); *H01L 2224/32145* (2013.01); *H01L 2224/32225* (2013.01); *H01L 2224/49175* (2013.01); *H01L 2224/49433* (2013.01); *H01L 2224/73204* (2013.01); *H01L 2224/73253* (2013.01); *H01L 2224/73265* (2013.01); *H01L 2225/0651* (2013.01); *H01L 2225/06517* (2013.01);
(Continued)

(58) Field of Classification Search
USPC .................. 257/685, 686, 723, 777, E25.006, 257/E25.013, E25.021, E25.027, E23.085, 257/E25.005, E25.011, E25.012, E25.015, 257/E25.016, E25.02
See application file for complete search history.

(56) References Cited

U.S. PATENT DOCUMENTS

| | | | |
|---|---|---|---|
| 6,836,021 B2 | 12/2004 | Ishikawa et al. | |
| 6,979,905 B2 | 12/2005 | Nishida et al. | |

(Continued)

FOREIGN PATENT DOCUMENTS

| | | |
|---|---|---|
| JP | 2004-273963 A | 9/2004 |
| JP | 2007-180587 | 7/2007 |

(Continued)

*Primary Examiner* — Jasmine Clark
(74) *Attorney, Agent, or Firm* — Myers Bigel Sibley & Sajovec, PA

(57) ABSTRACT

Semiconductor packages are provided. The semiconductor packages may include an upper package including a plurality of upper semiconductor devices connected to an upper package substrate. The semiconductor packages may also include a lower package including a lower semiconductor device connected to a lower package substrate. The upper and lower packages may be connected to each other.

15 Claims, 47 Drawing Sheets

(51) Int. Cl.
*H01L 25/065* (2006.01)
*H01L 25/10* (2006.01)
*H01L 23/36* (2006.01)

(52) U.S. Cl.
CPC ............ *H01L 2225/06589* (2013.01); *H01L 2225/1023* (2013.01); *H01L 2225/1058* (2013.01); *H01L 2924/15192* (2013.01); *H01L 2924/15311* (2013.01); *H01L 2924/15331* (2013.01); *H01L 2924/18161* (2013.01); *H01L 2225/06558* (2013.01); *H01L 2225/06562* (2013.01); *H01L 23/49816* (2013.01); *H01L 23/49822* (2013.01); *H01L 2224/48229* (2013.01); *H01L 2224/48235* (2013.01); *H01L 2924/3025* (2013.01)
USPC ............ 257/685; 257/686; 257/E25.005; 257/E25.006; 257/E25.011; 257/E25.012; 257/E25.015; 257/E25.016; 257/E25.02; 257/E25.027; 257/E23.085

(56) References Cited

U.S. PATENT DOCUMENTS

| | | | | |
|---|---|---|---|---|
| 7,459,776 | B1 * | 12/2008 | St. Amand et al. | 257/686 |
| 7,492,039 | B2 * | 2/2009 | Seng | 257/686 |
| RE41,826 | E | 10/2010 | Nishida et al. | |
| 8,304,880 | B2 | 11/2012 | Chow et al. | 257/686 |
| 2004/0027869 | A1 * | 2/2004 | Miwa et al. | 365/199 |
| 2006/0060954 | A1 * | 3/2006 | Meyer-Berg | 257/685 |
| 2009/0057917 | A1 | 3/2009 | Takaike | |
| 2009/0321908 | A1 | 12/2009 | Song et al. | 257/686 |

FOREIGN PATENT DOCUMENTS

| | | |
|---|---|---|
| JP | 4149289 B2 | 9/2008 |
| JP | 2009-054970 | 3/2009 |
| KR | 1020080088094 | 10/2008 |

\* cited by examiner

SEMICONDUCTOR PACKAGES INCLUDING A PLURALITY OF UPPER SEMICONDUCTOR DEVICES ON A LOWER SEMICONDUCTOR DEVICE

CROSS-REFERENCE TO RELATED APPLICATIONS

This U.S. non-provisional application is a continuation of U.S. application Ser. No. 13/550,921, filed on Jul. 17, 2012, now U.S. Pat. No. 8,698,301, which claims priority under 35 U.S.C. §119(a) to Korean Patent Application No. 10-2011-0109548, filed on Oct. 25, 2011, the disclosures of which are hereby incorporated herein by reference in their entireties.

BACKGROUND

The present disclosure relates to semiconductor packages, and more particularly, to semiconductor packages including a plurality of upper semiconductor devices on a lower semiconductor device.

As the use of compact, lightweight, and thin/ultrathin communication devices (e.g., mobile phones and tablet personal computers (PCs)) has increased, the use of smaller, lighter, and thinner components therein has also increased.

SUMMARY

A semiconductor package according to various embodiments may include an upper package including an upper package substrate that includes first through fourth upper sides, the upper package further including first through fourth upper semiconductor devices on the upper package substrate. The semiconductor package may further include a lower package including a lower package substrate, a lower semiconductor device that is on the lower package substrate and that includes first through fourth inner sides corresponding respectively to the first through fourth upper sides of the upper package substrate, and first through fourth lower chip connection elements respectively connected to the lower semiconductor device at positions nearest the first through fourth inner sides of the lower semiconductor device. Each of the first through fourth lower chip connection elements may electrically connect the corresponding one of the first through fourth upper semiconductor devices with the lower semiconductor device.

In various embodiments, a longest side of each of the first through fourth upper semiconductor devices may be nearest the corresponding one of the first through fourth upper sides of the upper package substrate.

According to various embodiments, the first through fourth upper semiconductor devices may include first through fourth chip pads on surfaces thereof at positions respectively nearest the first through fourth upper sides of the upper package substrate. Also, the first through fourth chip pads may be configured to transmit data signals and address/control signals of the first through fourth semiconductor devices, respectively.

In various embodiments, the first through fourth chip pads may be only on one half of the respective surfaces of the first through fourth upper semiconductor devices.

According to various embodiments, each of the first through fourth chip pads may include first through third groups of chip pads. Also, each second group of chip pads may be between the respective first and third groups of chip pads. Additionally, the first and third groups of chip pads may be configured to transmit the data signals. Furthermore, the second group of chip pads may be configured to transmit the address/control signals.

In various embodiments, the respective longest sides of the first and second upper semiconductor devices may be opposite and parallel to each other. Also, the respective longest sides of the third and fourth upper semiconductor devices may be opposite and parallel each other. Additionally, the respective longest sides of the first and second upper semiconductor devices may be perpendicular to the respective longest sides of the third and fourth upper semiconductor devices.

According to various embodiments, of the inventive concept provide wires respectively disposed near four sides of a semiconductor device.

In various embodiments, the third and fourth upper semiconductor devices may be mounted on the upper package substrate. Also, the first and second upper semiconductor devices may be mounted on the third and fourth upper semiconductor devices.

According to various embodiments, the upper package substrate may include a metal core layer. The upper package substrate may also include an upper metal interconnection layer above the metal core layer. The upper package substrate may further include a lower metal interconnection layer below the metal core layer. Also, the metal core layer may include a ground plane, and each of the upper and lower metal interconnection layers may include a signal transmission interconnection.

In various embodiments, the upper package substrate may further include an uppermost metal interconnection layer above the upper metal interconnection layer. The upper package substrate may also include a lowermost metal interconnection layer below the lower metal interconnection layer. The uppermost metal interconnection layer may provide a ground plane and substrate pads, and the lowermost metal interconnection layer may provide a ground plane and upper bump lands.

According to various embodiments, each of the first through fourth lower chip connection elements may include first through third groups of lower chip bumps. Also, the second group of lower chip bumps may be between the first and third groups of lower chip bumps. Furthermore, the first and third groups of lower chip bumps may be configured to transmit data signals. Additionally, the second group of lower chip bumps may be configured to transmit address/control signals.

In various embodiments, each of the first through fourth lower chip connection elements may further include lower chip bump lands on the lower package substrate and electrically connected to the first through third groups of lower chip bumps.

According to various embodiments, the lower package substrate may include a metal core layer. The lower package substrate may also include an upper metal interconnection layer over the metal core layer. The lower package substrate may further include an uppermost metal interconnection layer on the upper metal interconnection layer. The lower package substrate may additionally include a lower metal interconnection layer below the metal core layer. The lower package substrate may also include a lowermost metal interconnection layer below the lower metal interconnection layer.

In various embodiments, the metal core layer may provide a ground plane. Also, the uppermost metal interconnection layer may provide a ground plane and the first through fourth lower chip bump lands. Furthermore, the upper metal interconnection layer and the lower metal interconnection layer may include signal transmission interconnections. Additionally, the lowermost metal interconnection layer may provide a ground plane and board bump lands.

According to various embodiments, the upper package substrate may further include first through fourth bumps nearest the first through fourth upper sides, respectively. Additionally, the first through fourth bumps may be electrically connected to the first through fourth lower chip connection elements, respectively.

A semiconductor package according to various embodiments may include an upper package including an upper package substrate that includes first through fourth upper sides, the upper package further including first through fourth upper semiconductor devices on the upper package substrate. The semiconductor package may also include a lower package including a lower package substrate that includes first through fourth lower sides respectively corresponding to the first through fourth upper sides, the lower package further including a lower semiconductor device on the lower package substrate. The semiconductor package may further include first through fourth channels configured to electrically connect the first through fourth upper semiconductor devices with the lower semiconductor device. The first through fourth channels may be nearest the first through fourth upper sides and the first through fourth lower sides, respectively.

A semiconductor package according to various embodiments may include an upper package including a plurality of upper semiconductor devices connected to an upper package substrate via non-overlapping respective upper package substrate interconnections. The semiconductor package may also include a lower package including a lower semiconductor device connected to a lower package substrate via non-overlapping lower package substrate interconnections. The semiconductor package may additionally include a plurality of channels connecting the upper package to the lower package.

In various embodiments, the plurality of channels may include at least four independent channels.

According to various embodiments, the non-overlapping upper package substrate interconnections may share at least one metal interconnection layer.

In various embodiments, the plurality of upper semiconductor devices may include uncovered chip pads.

According to various embodiments, the non-overlapping lower package substrate interconnections may include only single-level metal interconnection layers.

In accordance with another aspect of the inventive concept, there is provided a semiconductor package. The semiconductor package includes a package substrate having first through fourth outer sides, a lower semiconductor device mounted on the package substrate and having first through fourth inner sides corresponding respectively to the first through fourth outer sides, first through fourth upper semiconductor devices stacked on the lower semiconductor device to be near the first through fourth outer sides, respectively, and first through fourth lower chip connection elements disposed between the package substrate and the lower semiconductor device to overlap one another. Each of the first through fourth lower chip connection elements may be disposed near the corresponding one of the first through fourth inner sides and electrically connected to the corresponding one of the first through fourth upper semiconductor devices.

The semiconductor package may further include first through fourth upper chip connection elements configured to electrically connect the first through fourth upper semiconductor devices with the first through fourth lower chip connection elements, respectively.

Each of the first through fourth upper chip connection elements may be disposed near the corresponding one of the first through fourth outer sides.

The first through fourth upper chip connection elements may respectively include first through fourth chip pads disposed on the first through fourth upper semiconductor devices, first through fourth substrate pads disposed on the package substrate, and first through fourth wires configured to electrically connect the first through fourth chip pads with the first through fourth substrate pads.

The first through fourth chip pads may be disposed in ones of first regions and second regions disposed on both sides of imaginary central lines by which top surfaces of the respective first through fourth upper semiconductor devices are bisected.

Each of the first through fourth chip pads may be disposed near the corresponding one of the first through fourth outer sides.

In other embodiments, the first through fourth lower chip connection elements may respectively include first through fourth lower chip bump lands disposed on the package substrate and first through fourth lower chip bumps disposed on the first through fourth lower chip bump lands.

In other embodiments, the semiconductor package may further include fifth lower chip connection elements disposed between the package substrate and the lower semiconductor device. The fifth lower chip connection elements may not be connected to the first through fourth upper semiconductor devices.

In other embodiments, each of the first through fourth lower chip connection elements may transmit data signals and/or address/control signals of the corresponding one of the first through fourth upper semiconductor devices.

In other embodiments, the third and fourth upper semiconductor devices may be mounted on the package substrate in a side-by-side manner, and the first and second upper semiconductor devices may be stacked on the third and fourth upper semiconductor devices in a side-by-side manner.

The first through fourth upper semiconductor devices may have overhang shapes. That is, lateral surfaces of the first through fourth upper semiconductor devices may horizontally protrude from lateral surfaces of the lower semiconductor device.

In other embodiments, the semiconductor package may further include a heat sink disposed on the lower semiconductor device.

The heat sink may be in direct contact with a top surface of the lower semiconductor device and have an overhang shape extending above the first through fourth upper semiconductor devices.

In other embodiments, the package substrate may include a core layer, an upper metal interconnection layer disposed on the core layer, and an uppermost metal interconnection layer disposed on the upper metal interconnection layer. At least two lower chip connection elements of the first through fourth lower chip connection elements may be electrically connected to the uppermost metal interconnection layer.

In accordance with another aspect of the inventive concept, there is provided a semiconductor package. The semiconductor package includes a package substrate, a lower semiconductor device mounted on the package substrate and having first through fourth inner sides, first through fourth upper semiconductor devices stacked on the lower semiconductor device to be near the first through fourth inner sides, respectively, first through fourth substrate pads disposed on the package substrate to be near the first through fourth inner sides, respectively, and first through fourth wires configured to electrically connect the first through fourth upper semiconductor devices with the first through fourth substrate pads, respectively.

In accordance with another aspect of the inventive concept, there is provided a semiconductor package. The semiconductor package includes a package substrate having first through fourth outer sides, a central semiconductor device mounted on a central region of the package substrate and having first through fourth inner sides corresponding respectively to the first through fourth outer sides, first through fourth peripheral semiconductor devices disposed between the first through fourth outer sides and the first through fourth inner sides, respectively, and first through fourth central chip connection elements disposed between the package substrate and the central semiconductor device to be near the first through fourth inner sides, respectively. Each of the first through fourth central chip connection elements may be electrically connected to the corresponding one of the first through fourth peripheral semiconductor devices.

The semiconductor package may further include first through fourth peripheral chip connection elements configured to electrically connect the first through fourth peripheral semiconductor devices with the first through fourth central chip connection elements, respectively.

Each of the first through fourth peripheral chip connection elements may be disposed on the package substrate to overlap the corresponding one of the first through fourth peripheral semiconductor devices.

The first through fourth peripheral chip connection elements may respectively include first through fourth peripheral chip bump lands disposed on the package substrate and first through fourth peripheral chip bumps disposed on the first through fourth peripheral chip bump lands.

In other embodiments, the first through fourth central chip connection elements may respectively include first through fourth central chip bump lands disposed on the package substrate and first through fourth central chip bumps disposed on the first through fourth central chip bump lands.

In other embodiments, the semiconductor package may further include fifth central chip connection elements disposed between the package substrate and the central semiconductor device. The fifth central chip connection elements may not be connected to the first through fourth peripheral semiconductor devices.

In other embodiments, each of the first through fourth central chip connection elements may transmit data signals and address/control signals of the corresponding one of the first through fourth peripheral semiconductor devices.

In other embodiments, the semiconductor package may further include a heat sink disposed on the central semiconductor device.

The heat sink may be in direct contact with a top surface of the central semiconductor device and have an overhang shape extending above the first through fourth peripheral semiconductor devices.

In other embodiments, the package substrate may include a core layer, an upper metal interconnection layer disposed on the core layer, and an uppermost metal interconnection layer disposed on the upper metal interconnection layer. At least two central chip connection elements of the first through fourth central chip connection elements may be electrically connected to the uppermost metal interconnection layer.

In accordance with another aspect of the inventive concept, there is provided a semiconductor package. The semiconductor package includes a package substrate, a central semiconductor device mounted on the package substrate and having first through fourth inner sides, first through fourth peripheral semiconductor devices disposed in the vicinity of the central semiconductor device to be near the first through fourth inner sides, respectively, and first through fourth channels configured to electrically connect the central semiconductor device with the first through fourth peripheral semiconductor devices, respectively. Each of the first through fourth channels may be disposed near the corresponding one of the first through fourth inner sides.

In other embodiments, the first through fourth channels may be disposed between the package substrate and the central semiconductor device and include first through fourth central chip bumps configured to electrically connect the package substrate and the central semiconductor package.

In other embodiments, the first through fourth channels may be disposed between the package substrate and the first through fourth peripheral semiconductor devices, respectively, and include first through fourth peripheral chip bumps configured to electrically connect the package substrate with the first through fourth peripheral semiconductor devices, respectively.

In other embodiments, the first through fourth channels may respectively include first through fourth metal interconnections disposed in the package substrate.

In other embodiments, the central semiconductor device may include first through fourth I/O parts disposed near the first through fourth sides, respectively.

Specific particulars of other embodiments are included in detailed descriptions and drawings.

BRIEF DESCRIPTION OF THE DRAWINGS

The above and other features and advantages of the disclosure will become more apparent in view of the attached drawings and accompanying detailed description.

DETAILED DESCRIPTION

Figure 1A:
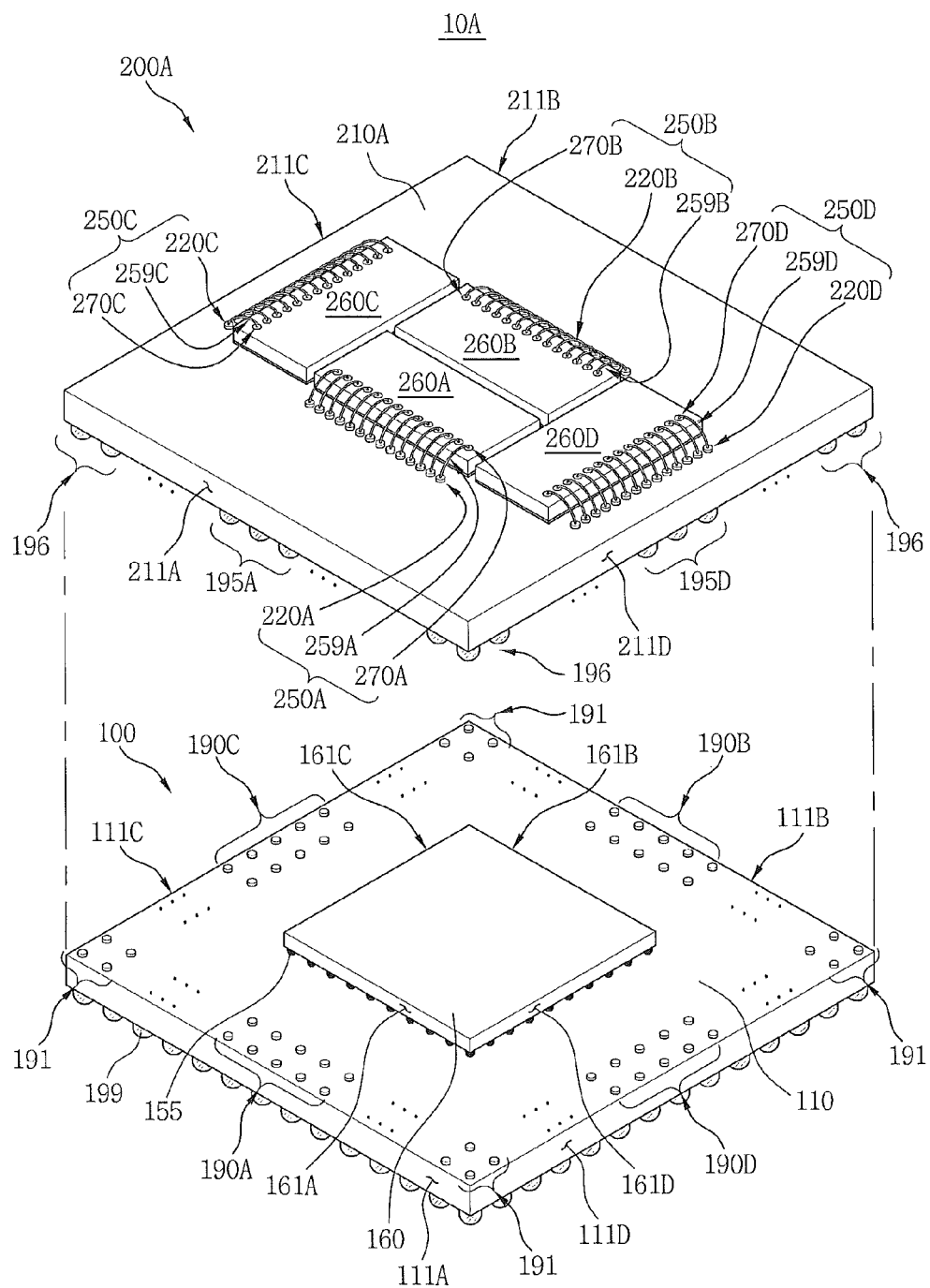
FIG. 1A is a conceptual perspective view of a semiconductor package according to various embodiments.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Various embodiments may be described herein with reference to cross-sectional and/or plane illustrations that are schematic illustrations of idealized embodiments of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. For example, an etched region illustrated as a rectangle may have rounded or curved features. Thus, the regions illustrated in the figures are schematic in nature and their shapes are not intended to illustrate the precise shape of a region of a device and are not intended to limit the scope of the inventive concept.

In the present disclosure, an expression "near an element" may be interpreted as nearer to or more adjacent to the element than other similar elements. As an example, when first through fourth subjects are near first through fourth objects, respectively, the first subject may be nearest to the first object, the second subject may be nearest to the second object, the third subject may be nearest to the third object, and the fourth subject may be nearest to the fourth object.

FIG. 1A is a conceptual perspective view of a semiconductor package 10A according to various embodiments of the inventive concept.

Referring to FIG. 1A, a package-on-package (POP) 10A according to various embodiments of the inventive concept may include a lower package 100 and an upper package 200A. Although the upper package 200A may be stacked directly on the lower package 100, for ease of illustration, FIG. 1A illustrates the upper package 200A as separated from the lower package 100.

The lower package 100 may include a lower package substrate 110 and a lower semiconductor device 160 mounted on the lower package substrate 110.

The lower package substrate 110 may include a printed circuit board (PCB). The lower package substrate 110 may have first through fourth sides (e.g., edges) 111A to 111D. For example, the first side 111A may be a front side, the second side 111B may be a rear side, the third side 111C may be a left side, and the fourth side 111D may be a right side. The first side 111A and the second side 111B may be opposite and parallel to each other, and the third side 111C and the fourth side 111D may be opposite and parallel to each other. Each of the first side 111A and the second side 111B may be adjacent the third side 111C and/or the fourth side 111D to be vertical/perpendicular to the third side 111C and/or the fourth side 111D (e.g., such that the first side 111A and the fourth side 111D converge to form approximately a 90 degree angle). For brevity, the first through fourth sides 111A to 111D of the lower package substrate 110 may be referred to as the first through fourth lower sides 111A through 111D, respectively.

The lower package substrate 110 may include first through fourth lower bump lands 190A to 190D. Each of the first through fourth lower bump lands 190A to 190D may be disposed near the corresponding one of the first through fourth lower sides 111A to 111D. In addition, fifth lower bump lands 191 may be disposed in corner regions of the lower package substrate 110. The first through fifth lower bump lands 190A to 190D and 191 may include a metal, such as copper (Cu), nickel (Ni), silver (Ag), or a solder. The first through fifth lower bump lands 190A to 190D and 191 may be portions of metal interconnection layers or vias included in the lower package substrate 110.

The lower semiconductor device 160 may include a logic device. The lower semiconductor device 160 may have first through fourth sides 161A to 161D, respectively disposed near (and substantially in parallel with) the first through fourth lower sides 111A to 111D of the lower package substrate 110. For brevity, the first through fourth sides 161A to 161D of the lower semiconductor device 160 may be referred to as first through fourth inner sides 161A to 161D, respectively.

The lower semiconductor device 160 may be electrically connected to the lower package substrate 110 and/or the first through fifth lower bump lands 190A to 190D and 191 through lower chip bumps 155. However, some of the first through fifth lower bump lands 190A to 190D and 191 may not be electrically connected to the lower semiconductor device 160. For example, some of the first through fifth lower bump lands 190A to 190D and 191 may be directly connected to board bumps 199. The lower chip bumps 155 may include a metal, such as Cu, Ni, Ag, or a solder.

The upper package 200A may include an upper package substrate 210A and a plurality of upper semiconductor devices 260A to 260D mounted on the upper package substrate 210A.

For instance, the first through fourth upper semiconductor devices 260A to 260D may be disposed on the upper package substrate 210A. Each of the first through fourth upper semiconductor devices 260A to 260D may include a memory such as a dynamic random access memory (DRAM), a magnetic RAM (MRAM), a resistive RAM (RRAM), a phase-change RAM (PRAM), or a flash memory. The first through fourth upper semiconductor devices 260A to 260D may be semiconductor devices of the same kind (e.g., DRAM). Alternatively, the first through fourth upper semiconductor devices 260A to 260D may be different kinds of semiconductor devices.

The upper package substrate 210A may include a PCB. The upper package substrate 210A may have first through fourth sides 211A to 211D. The first through fourth sides 211A to 211D of the upper package substrate 210A may respectively correspond to the first through fourth lower sides 111A to 111D of the lower package substrate 110. For brevity, the first through fourth sides 211A to 211D of the upper package substrate 210A may be referred to as first through fourth upper sides 211A to 211D, respectively.

Thus, the four upper semiconductor devices 260A to 260D may be respectively disposed near the first through fourth upper sides 211A to 211D of the upper package substrate 210A. For example, the first upper semiconductor device 260A may be disposed near the first upper side 211A, the second upper semiconductor device 260B may be disposed near the second upper side 211B, the third upper semiconductor device 260C may be disposed near the third upper side 211C, and the fourth upper semiconductor device 260D may be disposed near the fourth upper side 211D. Moreover, long sides of the first and second upper semiconductor devices 260A and 260B may be disposed in parallel with each other, while long sides of the third and fourth upper semiconductor devices 260C and 260D may be disposed in parallel with each other. The long sides may refer to the two relatively long sides among the four sides along the perimeter of a semiconductor device. Thus, one of the two long sides may be near a corresponding one of the chip pads 270A to 270D, and the other one thereof may be far from the corresponding one of the chip pads 270A to 270D. For example, long sides of the first and second upper semiconductor devices 260A and 260B that are far from the first and second chip pads 270A and 270B, may be disposed near each other, and long sides of the third and fourth upper semiconductor devices 260C and 260D that are far from the third and fourth chip pads 270C and 270D, may be disposed near each other. In other words, the first and second upper semiconductor devices 260A and 260B may be disposed in a side-by-side manner opposite to each other, and the third and fourth upper semiconductor devices 260C and 260D may be disposed in a side-by-side manner opposite to each other.

Thus, the long sides of the first and second upper semiconductor devices 260A and 260B may be disposed vertically/perpendicularly to the long sides of the third and fourth upper semiconductor devices 260C and 260D.

The upper package substrate 210A may include first through fourth upper substrate pads 220A to 220D respectively disposed near the first through fourth upper sides 211A to 211D of the upper substrate package 210A. For example, the first upper substrate pad 220A may be disposed near the first upper side 211A, the second upper substrate pad 220B may be disposed near the second upper side 211B, the third upper substrate pad 220C may be disposed near the third upper side 211C, and the fourth upper substrate pad 220D may be disposed near the fourth upper side 211D. The first through fourth upper substrate pads 220A to 220D may be interpreted as first through fourth bonding lands or first through fourth bonding fingers, respectively. In other words, the first through fourth upper substrate pads 220A to 220D may be disposed between the first through fourth upper sides 211A to 211D and the first through fourth upper semiconductor devices 260A to 260D, respectively.

The first through fourth upper semiconductor devices 260A to 260D may respectively include the first through fourth chip pads 270A to 270D disposed near any one of the sides thereof. Each of the first through fourth chip pads 270A to 270D of the first through fourth upper semiconductor devices 260A to 260D may be disposed near any one of the first through fourth upper sides 211A to 211D of the upper package substrate 210A. Alternatively, each of the first through fourth chip pads 270A to 270D of the first through fourth upper semiconductor devices 260A to 260D may be disposed toward any one of the first through fourth upper sides 211A to 211D of the upper package substrate 210A. For example, the first through fourth chip pads 270A to 270D may be disposed on the first through fourth upper semiconductor devices 260A to 260D near respective sides of the first through fourth upper semiconductor devices 260A to 260D. The respective sides of the first through fourth upper semiconductor devices 260A to 260D, which are near the first through fourth chip pads 270A to 270D, respectively, may be disposed near and parallel to the first through fourth upper sides 211A to 211D, respectively.

The first upper substrate pads 220A may be electrically connected to the first chip pads 270A through first wires 259A, and the second upper substrate pads 220B may be electrically connected to the second chip pads 270B through second wires 259B. The third upper substrate pads 220C may be electrically connected to the third chip pads 270C through third wires 259C, and the fourth upper substrate pads 220D may be electrically connected to the fourth chip pads 270D through fourth wires 259D. The first through fourth wires 259A to 259D may include gold (Au) or aluminum (Al).

Thus, the upper package 200A may include upper chip connection elements 250A to 250D respectively disposed near the first through fourth upper sides 211A to 211D thereof. The first through fourth upper chip connection elements 250A to 250D may include the first through fourth chip pads 270A to 270D, the first through fourth upper substrate pads 220A to 220D, and the first through fourth wires 259A to 259D, respectively.

Upper bump lands may be formed on a bottom surface of the upper package substrate 210A.

The lower package 100 and the upper package 200A may be electrically connected to each other using first through fifth bumps 195A to 195D and 196. The first through fourth bumps 195A to 195D may be disposed near the first through fourth upper sides 211A to 211D and/or the first through fourth lower sides 111A to 111D. For example, the first bumps 195A may be disposed near the first upper side 211A of the upper package substrate 210A or the first lower side 111A of the lower package substrate 110, and the second bumps 195B may be disposed near the second upper side 211B of the upper package substrate 210A or the second lower side 111B of the lower package substrate 110. The third bumps 195C may be disposed near the third upper side 211C of the upper package substrate 210A or the third lower side 111C of the lower package substrate 110. The fourth bumps 195D may be disposed near the fourth upper side 211D of the upper package substrate 210A or the fourth lower side 111D of the lower package substrate 110. The fifth bumps 196 may be disposed in corner regions of the upper package substrate 210A and/or the lower package substrate 110.

The first bumps 195A may electrically connect the first lower bump lands 190A and the first upper substrate pads 220A, and the second bumps 195B may electrically connect the second lower bump lands 190B and the second upper substrate pads 220B. The third bumps 195C may electrically connect the third lower bump lands 190C and the third upper substrate pads 220C, and the fourth bumps 195D may electrically connect the fourth lower bump lands 190D and the fourth upper substrate pads 220D. The fifth bumps 196 may be selectively electrically connected to some of the first through fourth upper substrate pads 220A to 220D. The first through fifth bumps 195A to 195D and 196 may include a metal, such as Cu, Ni, Ag, or a solder.

The board bumps 199 may be disposed under the lower package 100 (e.g., under the lower package substrate 110). The board bumps 199 may electrically connect the semiconductor package 10A with an electronic circuit substrate, such as a mother board or a system board. The board bumps 199 may include a metal, such as Cu, Ni, Ag, or a solder.

Figure 1B:
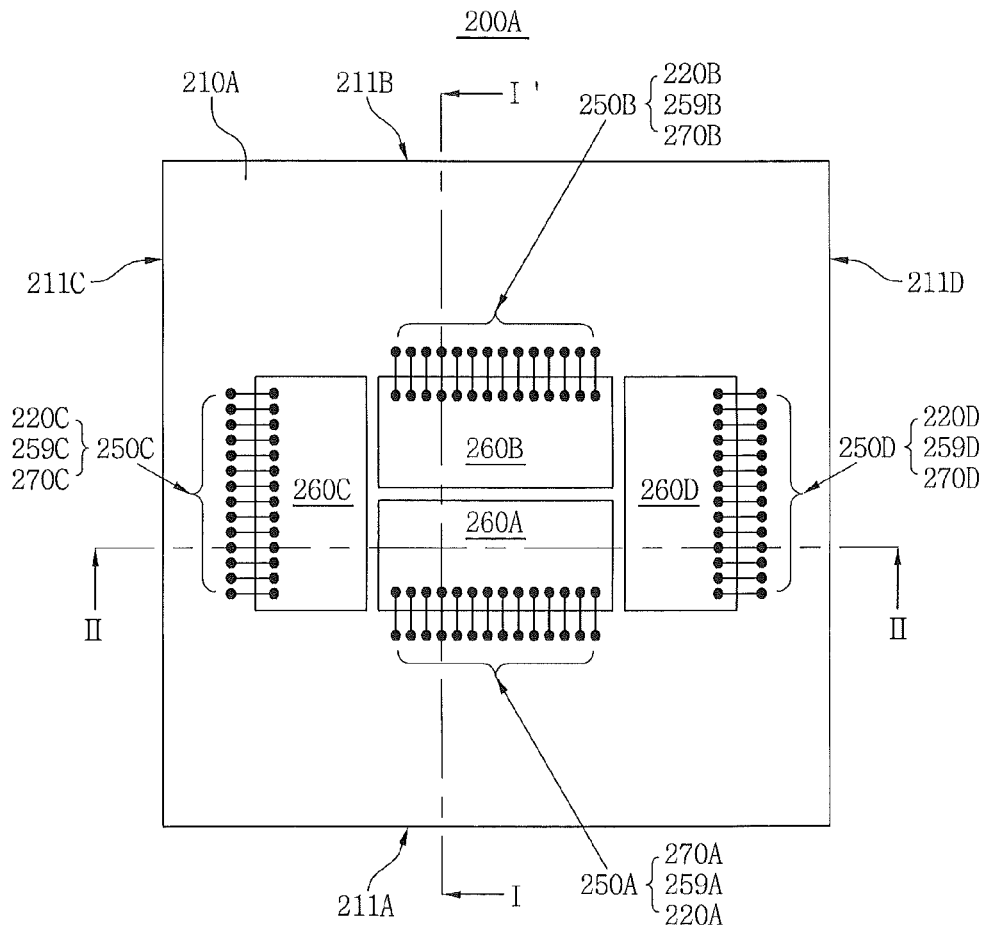
FIG. 1B is a conceptual top view of an upper package of FIG. 1A according to various embodiments.

FIG. 1B is a conceptual top view of the upper package 200A of FIG. 1A according to various embodiments. Referring to FIG. 1B, the upper package 200A may include a plurality of upper semiconductor devices 260A to 260D disposed on the upper package substrate 210A such that the first through fourth upper chip connection elements 250A to 250D are opposite, parallel, or vertical/perpendicular to one another. As described herein, the upper package 200A may include the four upper semiconductor devices 260A to 260D disposed on the upper package substrate 210A such that each of the first through fourth upper chip connection elements 250A to 250D is disposed near the corresponding one of the first through fourth upper sides 211A to 211D of the upper package substrate 210A. In other words, the first through fourth upper semiconductor devices 260A to 260D may be disposed such that sides far from the first through fourth chip pads 270A to 270D corresponding respectively to the first through fourth upper semiconductor devices 260A to 260D are adjacent one another. Although it is illustrated that sides of the first through fourth upper semiconductor devices 260A to 260D are horizontally aligned with one another, the sides of the first through fourth upper semiconductor devices 260A to 260D may alternatively not be aligned with one another. According to various embodiments, each of the first through fourth chip pads 270A to 270D may be disposed near any one side of the first through fourth upper semiconductor devices 260A to 260D. The first through fourth upper chip connection elements 250A to 250D may further include vias.

Figure 1C:
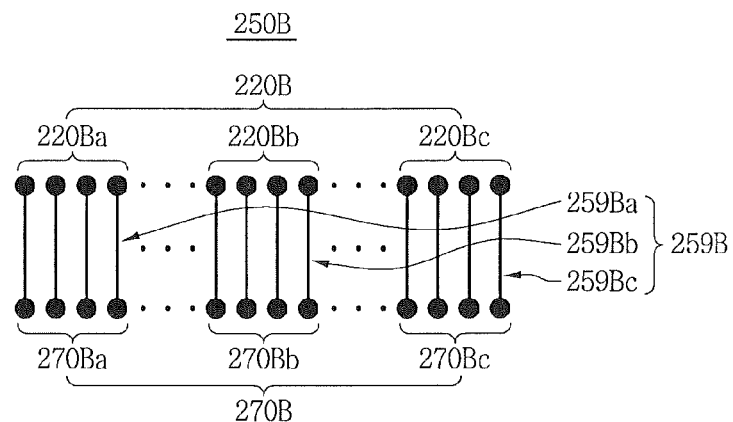
FIG. 1C is a detailed diagram of second upper chip connection elements of FIG. 1B according to various embodiments.

FIG. 1C is a detailed diagram of the second upper chip connection elements 250B of FIG. 1B according to various embodiments. Referring to FIG. 1C, the second upper chip connection elements 250B may include first through third groups of substrate pads 220Ba to 220Bc, first through third groups of wires 259Ba to 259Bc, and first through third groups of chip pads 270Ba to 270Bc.

Among the first through third groups of substrate pads 220Ba to 220Bc, two groups may transmit data signals and/or voltages for the data signals, and the remaining one group may transmit address/control signals. Among the first through third groups of wires 259Ba to 259Bc, two groups may transmit data signals and/or voltages for the data signals, and the remaining one group may transmit address/control signals. Among the first through third groups of chip pads 270Ba to 270Bc, two groups may transmit data signals and/or voltages for the data signals, and the remaining one group may transmit address/control signals.

For instance, the first and third groups of substrate pads 220Ba and 220Bc, the first and third groups of wires 259Ba and 259Bc, and the first and third groups of chip pads 270Ba and 270Bc may transmit data signals and/or voltages for the data signals. The second group of substrate pads 220Bb, the second group of wires 259Bb, and the second group of chip pads 270Bb may transmit address/control signals. For example, the first and third groups of chip pads 270Ba and 270Bc may be disposed on sides of the second upper chip connection elements 250B, and the second group of chip pads 270Bb may be disposed in a middle region between the first and third groups of chip pads 270Ba and 270Bc. The address/control signals may be transmitted to the middle region and the data signals may be transmitted to both of the sides so that a signal balance may be symmetrically stabilized.

In another example, the first and second groups of substrate pads 220Ba and 220Bb, the first and second groups of wires 259Ba and 259Bb, and the first and second groups of chip pads 270Ba and 270Bb may transmit data signals and/or voltages for the data signals. The third group of substrate pads 220Bc, the third group of wires 259Bc, and the third group of chip pads 270Bc may transmit address/control signals.

In a further example, the second and third groups of substrate pads 220Bb and 220Bc, the second and third groups of wires 259Bb and 259Bc, and the second and third groups of chip pads 270Bb and 270Bc may transmit data signals and/or voltages for the data signals. The first group of substrate pads 220Ba, the first group of wires 259Ba, and the first group of chip pads 270Ba may transmit address/control signals.

In various embodiments, in the first through third groups of substrate pads 220Ba to 220Bc, the first through third groups of wires 259Ba to 259Bc, and the first through third groups of chip pads 270Ba to 270Bc, two groups configured to transmit data signals and/or reference voltages for the data signals may include the same number of conductive elements. In other words, all of the elements configured to transmit the data signals and/or the reference voltages for the data signals may be divided into two groups by half (i.e., such that each of the two groups includes half of the elements).

The concept of upper chip connection elements described with reference to FIG. 1C (regarding the second upper chip connection elements 250B) may be expansively applied to the remaining upper chip connection elements 250A, 250C, and 250D.

Figure 1D:
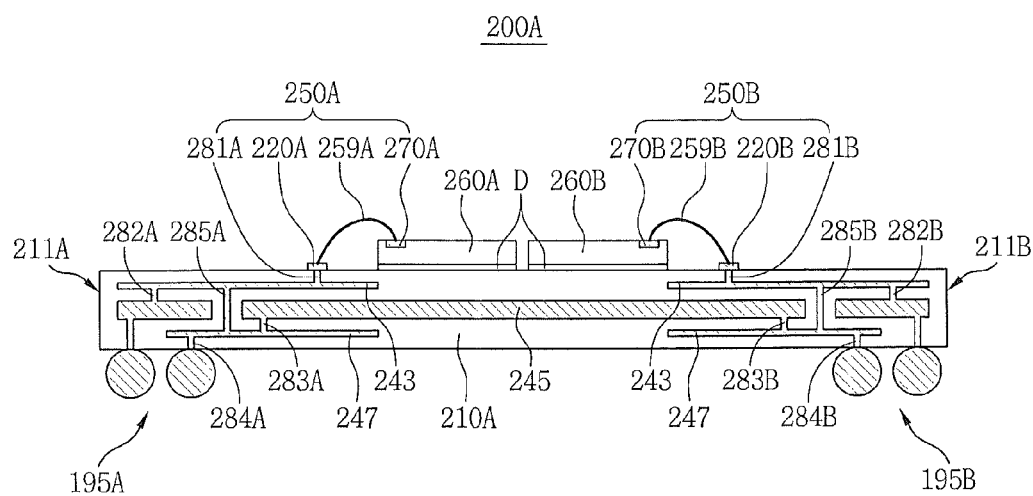
FIG. 1D is a conceptual longitudinal sectional view or side view taken along a direction I-I' of the upper package of FIG. 1B according to various embodiments.
Figure 1E:
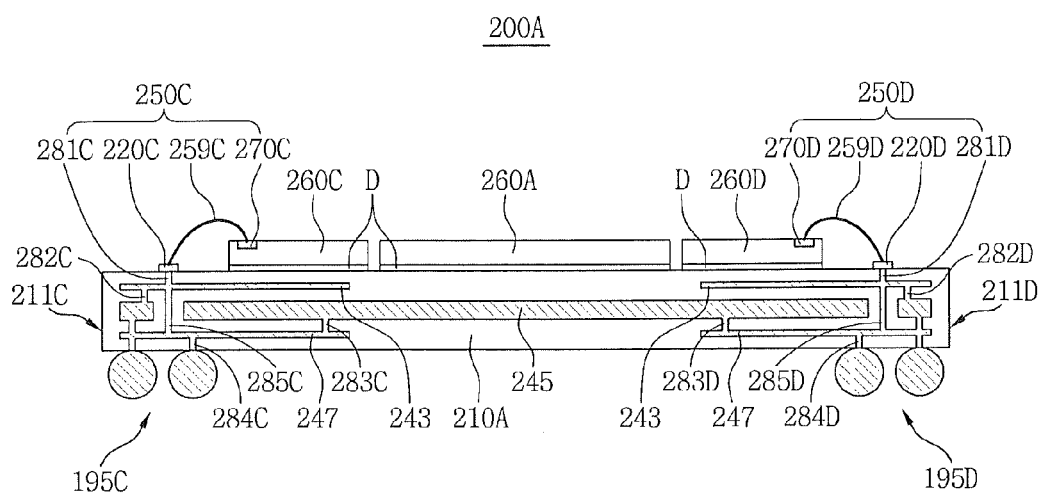
FIG. 1E is a conceptual longitudinal sectional view or side view taken along a direction II-II' of the upper package of FIG. 1B according to various embodiments.

FIG. 1D is a conceptual longitudinal sectional view or side view taken along a direction I-I' of the upper package 200A of FIG. 1B, and FIG. 1E is a conceptual longitudinal sectional view or side view taken along a direction II-II' of the upper package 200A of FIG. 1B.

Referring to FIGS. 1D and 1E, the upper package 200A may include first through fourth upper semiconductor devices 260A to 260D disposed on an upper package substrate 210A in a side-by-side manner. The first and second upper semiconductor devices 260A and 260B may be disposed opposite and parallel to each other, and the third and fourth upper semiconductor devices 260C and 260D may be disposed opposite and parallel to each other. As described herein, the first and second upper semiconductor devices 260A and 260B may be disposed vertically/perpendicularly to the third and fourth upper semiconductor devices 260C and 260D.

Top surfaces of the first through fourth upper semiconductor devices 260A to 260D may be disposed at the same level such that the first through fourth upper semiconductor devices 260A to 260D neither overlap one another nor are stacked. The first through fourth upper semiconductor devices 260A to 260D may be mounted on the upper package substrate 210A using a die-attach film (DAF) D.

The upper package substrate 210A may include a core layer 245, an upper metal interconnection layer 243, a lower metal interconnection layer 247, and a plurality of various vias 281A to 281D, 282A to 282D, 283A to 283D, 284A to 284D, and 285A to 285D. Other portions of the upper package substrate 210A may be formed of an insulating material, such as a plastic or ceramic. The core layer 245 may include a metal. The core layer 245 may be thicker than the upper and lower metal interconnection layers 243 and 247.

The upper and lower metal interconnection layers 243 and 247 may transmit electrical signals or voltages to the first through fourth upper semiconductor devices 260A to 260D. For example, the upper and lower metal interconnection layers 243 and 247 may transmit data signals, supply voltages Vddq for data signals, and address/control signals from the first through fourth upper semiconductor devices 260A to 260D.

In addition, a portion of the core layer 245 may be used to transmit the data signals, the supply voltages Vddq for the data signals, reference voltages Vssq for the data signals, and/or the address/control signals of the first through fourth upper semiconductor devices 260A to 260D.

In various embodiments, the upper metal interconnection layer 243 may mainly (e.g., primarily) transmit electrical signals for the first and second upper semiconductor devices 260A and 260B, while the lower metal interconnection layer 247 may mainly transmit electrical signals for the third and fourth upper semiconductor devices 260C and 260D.

In various embodiments, the upper metal interconnection layer 243 may mainly transmit the data signals and the supply voltages Vddq for the data signals from the first through fourth upper semiconductor devices 260A to 260D, while the lower metal interconnection layer 247 may mainly transmit the address/control signals from the first through fourth upper semiconductor devices 260A to 260D.

First through fourth uppermost vias 281A to 281D may electrically connect the first through fourth upper substrate pads 220A to 220D with the upper metal interconnection layer 243. The first through fourth upper vias 282A to 282D may electrically connect the upper metal interconnection layer 243 with the core layer 245. Thus, a portion of the core layer 245 may transmit the data signals and/or the address/control signals from the first through fourth upper semiconductor devices 260A to 260D. In various embodiments, the first through fourth uppermost vias 281A to 281D may be included in the first through fourth upper chip connection elements 250A to 250D, respectively. Alternatively, the first through fourth uppermost vias 281A to 281D may be a portion of an uppermost metal layer 241 (see, e.g., FIG. 1Q). In addition, the first through fourth upper substrate pads 220A to 220D may also be a portion of the uppermost metal layer 241.

First through fourth lower vias 283A to 283D may electrically connect the core layer 245 with the lower metal interconnection layer 247. First through fourth lowermost vias 284A to 284D may electrically connect the lower metal interconnection layer 247 with the first through fourth upper bumps 195A to 195D. The first through fourth lowermost vias 284A to 284D may be interpreted as lands to be electrically connected to the first through fourth bumps 195A to 195D. Alternatively, the first through fourth lowermost vias 284A to 284D may be a portion of the lower metal interconnection layer 247. In other drawings, the first through fourth lowermost vias 284A to 284D may be referred to as first through fourth upper bump lands 290A to 290D, respectively.

First through fourth through vias 285A to 285D may electrically connect the upper metal interconnection layer 243 and the lower metal interconnection layer 247 through the core layer 245. Although FIGS. 1C and 1D illustrate that the vias 281A to 281D, 282A to 282D, 283A to 283D, 284A to 284D, and 285A to 285D and the metal layers 243, 245, and 247 are electrically connected to one another, FIGS. 1C and 1D are provided for brevity. In other words, the vias 281A to 281D, 282A to 282D, 283A to 283D, 284A to 284D, and 285A to 285D and the metal layers 243, 245, and 247 may be optionally connected to one another. In addition, the core layer 245 may be used to transmit or provide various supply voltages Vdd and reference voltages Vss. For example, the core layer 245 may be used as a power plane or ground plane. For example, the vias 282A to 282D and 283A to 283D connected to the core layer 245 may transmit or provide reference voltages. The core layer 245 may be used as a signal transmission interconnection when necessary.

Although it is illustrated that all of the first through fourth upper substrate pads 220A to 220D are connected to the upper metal interconnection layer 243, the illustration is provided for the purposes of example only. As such, some of the first through fourth upper substrate pads 220A to 220D may be connected not to the upper metal interconnection layer 243 but rather to the lower metal interconnection layer 247. For example, the first and second upper substrate pads 220A and 220B may be connected to the first and second upper bump lands 290A and 290B mainly through the upper metal interconnection layer 243, while the third and fourth upper substrate pads 220C and 220D may be connected to the third and fourth upper bump lands 290C and 290D mainly through the lower metal interconnection layer 247. Moreover, the first and second upper substrate pads 220A and 220B may be connected to the first and second upper bump lands 290A and 290B mainly through the lower metal interconnection layer 247, while the third and fourth upper substrate pads 220C and 220D may be connected to the third and fourth upper bump lands 290C and 290D mainly through the lower metal interconnection layer 247.

Figure 1F:
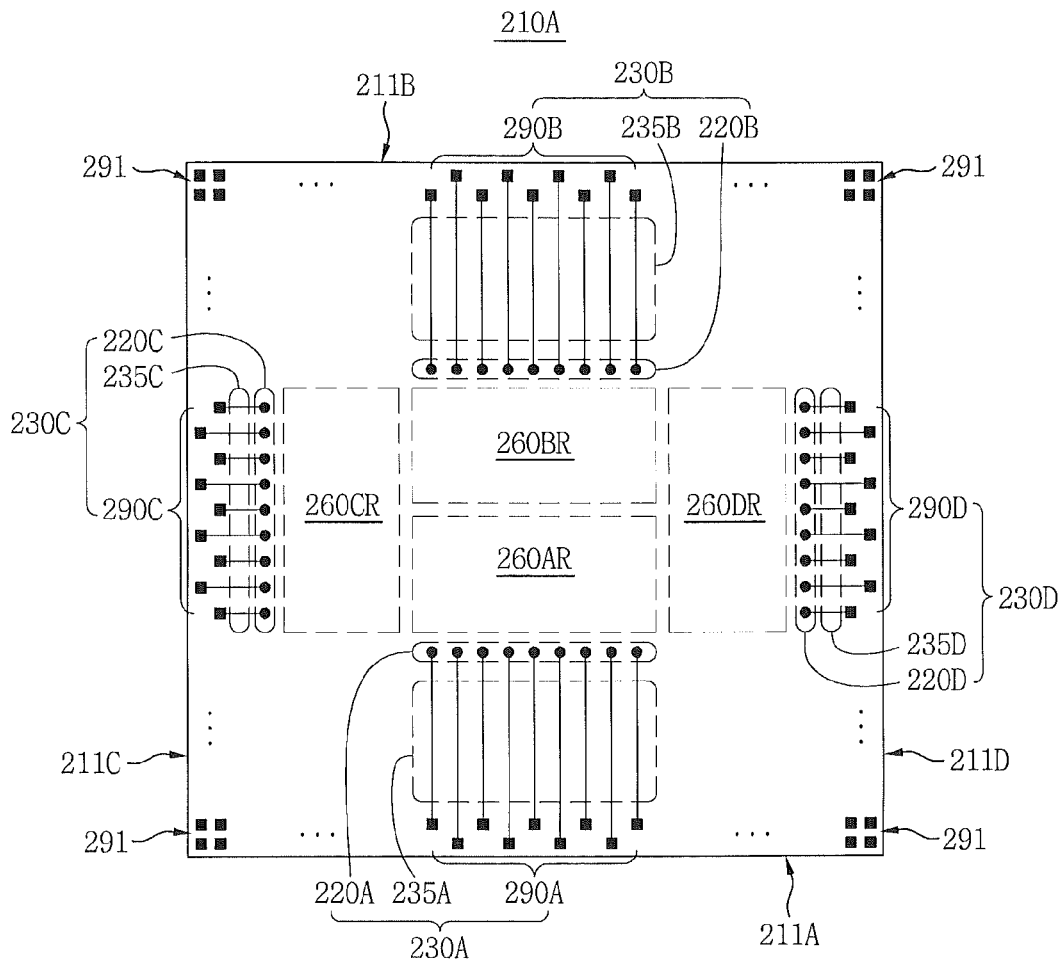
FIG. 1F is a conceptual top view illustrating routing concepts of an upper package substrate according to various embodiments.

FIG. 1F is a conceptual top view illustrating routing concepts of the upper package substrate 210A according to various embodiments. Referring to FIG. 1F, the upper package substrate 210A may include first through fourth upper package substrate interconnection elements 230A to 230D. The first through fourth upper package substrate interconnection elements 230A to 230D may respectively include the first through fourth upper substrate pads 220A to 220D, the first through fourth upper bump lands 290A to 290D, and first through fourth upper package substrate interconnections 235A to 235D configured to electrically connect the first through fourth upper substrate pads 220A to 220D with the first through fourth upper bump lands 290A to 290D.

Each of the first through fourth upper package substrate interconnections 235A to 235D may include at least one of the core layer 245, the upper metal interconnection layer 243, the lower metal interconnection layer 247, and the plurality of vias 281A to 281D, 282A to 282D, 283A to 283D, 284A to 284D, and 285A to 285D illustrated in FIGS. 1D and 1E.

Fifth upper bump lands 291 may be connected to any one of the first through fourth upper substrate pads 220A to 220D. However, description of the connection of the fifth upper bump lands 291 with the first through fourth upper substrate pads 220A to 220D may be omitted for brevity. Regions 260AR to 260DR where the first through fourth upper semiconductor devices 260A to 260D are respectively disposed are illustrated with dotted lines.

As described herein, the first through fifth upper bump lands 290A to 290D and 291 may be a portion of the lower metal interconnection layer 247 or portions of the lowermost vias 284A to 284D.

According to various embodiments, the first through fourth upper package substrate interconnections 235A to 235D may include only the upper metal interconnection layer 243 or the lower metal interconnection layer 247.

Moreover, the upper package substrate 210A may be thinned out (e.g., reduced in size). For example, when the upper package 200A includes a plurality of upper semiconductor devices 260A to 260D, each of the upper semiconductor devices 260A to 260D may exclusively have a large number of conductive elements. Assuming that the conductive elements of the upper semiconductor devices 260A to 260D overlap one another or use different metal interconnection layers 243 and 247, the metal interconnection layers 243 and 247 included in the upper package substrate 210A may be provided at multiple levels (e.g., five or more levels). According to various embodiments of the present disclosure, however, because the first through fourth upper package substrate interconnections 235A to 235D do not overlap one another and may share the metal interconnection layers 243 and 247, even if the metal interconnection layers 243 and 247 included in the upper package substrate 210A are not provided at four levels, conductive connection elements for the plurality of upper semiconductor devices 260A to 260D may be formed.

In various embodiments, the first through fourth upper package substrate interconnections 235A to 235D may benefit from an increased number of metal interconnection layers 243 and 247. For example, a large number of the first through fourth upper package substrate interconnections 235A to 235D may be used, such that all of the first through fourth upper package substrate interconnections 235A to 235D may not be formed in the two-level upper metal interconnection layers 243 and 247. Thus, the metal interconnection layers 243 and 247 may be needed at two or more levels. In this case, according to various embodiments of the inventive concept, because the first through fourth upper package substrate interconnections 235A to 235D do not overlap one another, the number of the metal interconnection layers 243 and 247 needed may be reduced/minimized. In addition, when a ground plane is required between the metal interconnection layers 243 and 247 out of concern for signal interference between the metal interconnection layers 243 and 247, the number of metal interconnection layers 243 and 247 needed may be reduced/minimized according to various embodiments of the inventive concept.

Figure 1G:
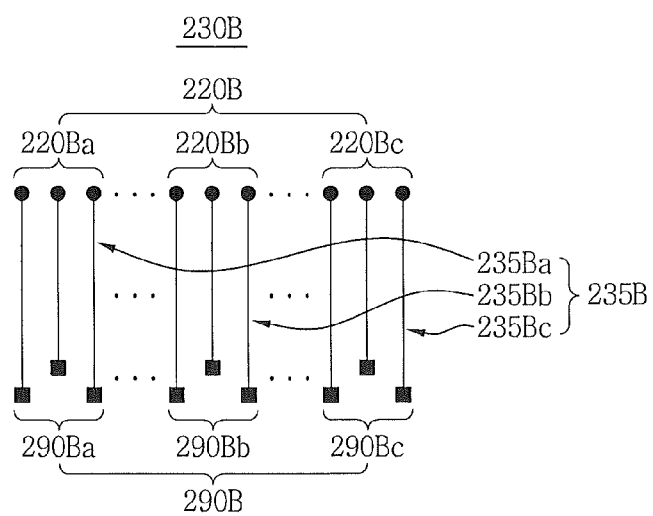
FIG. 1G is a detailed diagram of second upper package substrate interconnection elements of FIG. 1F according to various embodiments.

FIG. 1G is a detailed diagram of the second upper package substrate interconnection elements 230B of FIG. 1F. Referring to FIG. 1G the second upper package substrate interconnection elements 230B may include first through third groups of upper substrate pads 220Ba to 220Bc, first through third groups of upper package substrate interconnections 235Ba to 235Bc, and first through third groups of upper bump lands 290Ba to 290Bc.

Among the first through third groups of upper substrate pads 220Ba to 220Bc, two groups may transmit data signals and/or voltages for the data signals, while the remaining one group may transmit address/control signals. Among the first through third groups of upper package substrate interconnections 235Ba to 235Bc, two groups may transmit data signals and/or voltages for the data signals, while the remaining one group may transmit address/control signals. Among the first through third groups of upper bump lands 290Ba to 290Bc, two groups may transmit data signals and/or voltages for the data signals, while the remaining one group may transmit address/control signals.

For example, the first and third groups of upper substrate pads 220Ba and 220Bc, the first and third groups of upper package substrate interconnections 235Ba and 235Bc, and the first and third groups of upper bump lands 290Ba and 290Bc may transmit data signals and/or a supply voltage Vddq for the data signals. The second group of upper substrate pads 220Bb, the second group of upper package substrate interconnections 235Bb, and the second group of upper bump lands 290Bb may transmit address/control signals. Specifically, the first and third groups of upper package substrate interconnection elements 230Ba and 230Bc may be disposed on both sides of the second upper package substrate interconnection elements 230B, while the second group of upper package substrate interconnection elements 230Bb may be disposed in a middle region between the first and third groups of upper package substrate interconnection elements 230Ba and 230Bc. The address/control signals may be transmitted to the middle region, and the data signals may be transmitted to both of the sides so that a signal balance may be symmetrically stabilized.

Alternatively, the first and second groups of upper substrate pads 220Ba and 220Bb, the first and second groups of upper package substrate interconnections 235Ba and 235Bb, and the first and second groups of upper bump lands 290Ba and 290Bb may transmit data signals and/or voltages for the data signals. The third group of substrate pads 220Bc, the third group of upper package substrate interconnections 235Bc, and the third group of upper bump lands 290Bc may transmit address/control signals.

In another example, the second and third groups of upper substrate pads 220Bb and 220Bc, the second and third groups of upper package substrate interconnections 235Bb and 235Bc, and the second and third groups of upper bump lands 290Bb and 290Bc may transmit data signals and/or voltages for the data signals. The first group of upper substrate pads 220Ba, the first group of upper package substrate interconnections 235Ba, and the first group of upper bump lands 290Ba may transmit address/control signals.

In various embodiments, among the first through third groups of upper substrate pads 220Ba to 220Bc, the first through third groups of upper package substrate interconnections 235Ba to 235Bc, and the first through third groups of upper bump lands 290Ba to 290Bc, two groups configured to transmit data signals and/or reference voltages for the data signals may include the same number of conductive elements. In other words, all of the elements configured to transmit the data signals and/or the reference voltages for the data signals may be divided into two groups by half.

The routing concept of the upper package substrate 210 described with reference to FIGS. 1F and 1G may be expansively applied to the remaining upper package substrate interconnection elements 230A, 230C, and 230D.

Figure 1H:
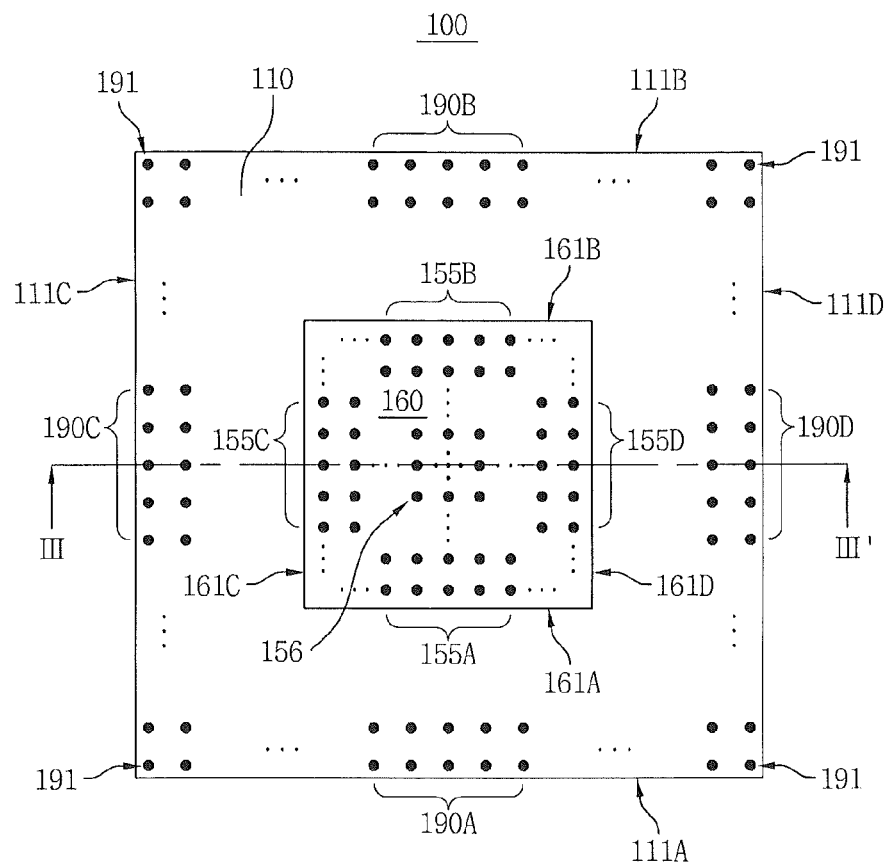
FIG. 1H is a conceptual top view of a lower package of FIG. 1A according to various embodiments.

FIG. 1H is a conceptual top view of the lower package 100 of FIG. 1A. Referring to FIG. 1H, the lower package 100 may include the lower semiconductor device 160 mounted in a central region of the lower package substrate 110. The lower chip bumps 155 may be disposed as island types between the lower package substrate 110 and the lower semiconductor device 160. In implementation, the lower chip bumps 155 may be covered by the lower semiconductor device 160 and thus unseen.

The first through fourth lower bump lands 190A to 190D may be disposed in regions near the first through fourth lower sides 111A to 111D of the lower package substrate 110. The fifth lower bump lands 191 may be arranged in the four corner regions of the lower package substrate 110.

The lower chip bumps 155 may include first through fourth lower chip bumps 155A to 155D. The first through fourth lower chip bumps 155A to 155D may be respectively disposed near the first through fourth inner sides 161A to 161D of the lower semiconductor device 160 within a region where the lower semiconductor device 160 is mounted. The first through fourth lower chip bumps 155A to 155D may be disposed in positions near the first through fourth lower sides 111A to 111D of the lower package substrate 110. According to various embodiments, the first through fourth lower chip bumps 155A to 155D may be electrically connected to the first through fourth lower bump lands 190A to 190D, respectively. Thus, each of the first through fourth lower chip bumps 155A to 155D may be electrically connected to the corresponding one of the first through fourth upper semiconductor devices 260A to 260D.

Fifth lower chip bumps 156 may be disposed in the region where the lower semiconductor device 160 is mounted, for example, in a central region among the first through fourth lower chip bumps 155A to 155D. According to various embodiments, the fifth lower chip bumps 156 may not be connected to the first through fourth upper semiconductor devices 260A to 260D.

Figure 1I:
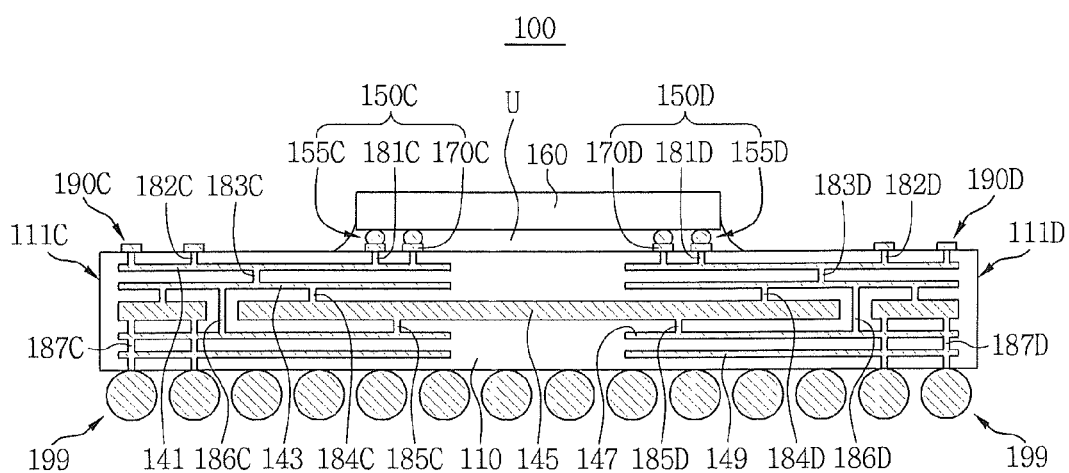
FIG. 1I is a conceptual longitudinal sectional view taken along a direction III-III' of the lower package of FIG. 1H and a direction perpendicular to the direction III-III', according to various embodiments.

FIG. 1I is a conceptual longitudinal sectional view taken along a direction III-III' of the lower package 100 of FIG. 1H and a direction perpendicular to the direction III-III'. Because two sectional views taken along the direction III-III' of the lower package of FIG. 1H and the direction perpendicular to the direction III-III' are substantially the same, both of them are illustrated as a single diagram in FIG. 1I. Numbers that are not denoted in FIG. 1I may be illustrated in FIG. 1J. Referring to FIG. 1I, the lower package 100 may include the lower semiconductor device 160 disposed on the lower package substrate 110. The lower package 100 may include first through fourth lower chip connection elements 150A to 150D respectively disposed near the first through fourth lower sides 111A to 111D. The first through fourth lower chip connection elements 150A to 150D may include the first through fourth lower chip bumps 155A to 155D and first through fourth lower chip bump lands 170A to 170D, respectively. The first through fourth lower chip bump lands 170A to 170D may be a portion of an uppermost metal interconnection layer 141 or portions of first through fourth bump vias 182A to 182D in the lower package substrate 110.

The lower semiconductor device 160 may be electrically connected to at least one of metal interconnection layers 141, 143, 147, and 149 of the lower package substrate 110 using the first through fourth lower chip bumps 155A to 155D and the first through fourth lower chip bump lands 170A to 170D.

The lower package substrate 110 may include a core layer 145, an uppermost metal interconnection layer 141, an upper metal interconnection layer 143, a lower metal interconnection layer 147, and a lowermost metal interconnection layer 149. The core layer 145 may include a metal. The core layer 145 may be thicker than the uppermost metal interconnection layer 141, the upper metal interconnection layer 143, the lower metal interconnection layer 147, and the lowermost metal interconnection layer 149.

The lower package substrate 110 may include first through fourth uppermost chip connection vias 181A to 181D configured to respectively electrically connect the first through fourth lower chip bump lands 170A to 170D with the uppermost metal interconnection layer 141. The lower package substrate 110 may include first through fourth bump vias 182A to 182D configured to electrically connect the uppermost metal layer 141 with the first through fourth lower bump lands 190A to 190D, respectively. Furthermore, the lower package substrate 110 may include various vias 183A to 183D, 184A to 184D, 185A to 185D, 186A to 186D, and 187A to 187D configured to optionally connect the first through fourth lower bump lands 190A to 190D, the core layer 145, the uppermost metal interconnection layer 141, the upper metal interconnection layer 143, the lower metal interconnection layer 147, the lowermost metal interconnection layer 149, and the board bumps 199. It will be understood that it may not be necessary to illustrate each of the various vias 183A to 183D, 184A to 184D, 185A to 185D, 186A to 186D, and 187A to 187D in the drawings. Functions of the various vias 183A to 183D, 184A to 184D, 185A to 185D, 186A to 186D, and 187A to 187D may be understood with reference to FIGS. 1D and 1E.

The first through fourth uppermost chip connection vias 181A to 181D may be included in the respective first through fourth lower chip connection elements 150A to 150D. To avoid complexity of the drawings, lands for the board bumps 199 may be omitted but will be understood by those skilled in the art. The lands for the board bumps 199 may be a portion of the lowermost metal interconnection layer 149.

The uppermost metal interconnection layer 141 may mainly transmit electrical signals between the first through fourth upper semiconductor devices 260A to 260D and the lower semiconductor device 160. Specifically, the electrical signals may be transmitted between the first through fourth upper semiconductor devices 260A to 260D and the lower semiconductor devices 160 through the first through fourth chip pads 270A to 270D, the first through fourth wires 259A to 259D, the first through fourth upper substrate pads 220A to 220D, the conductive elements 243, 247, 281A to 281D, 282A to 282D, 283A to 283D, 284A to 284D, and 285A to 285D of the upper package substrate 210A, inter-package connecting conductive elements 195A to 195D, 190A to 190D, and 290A to 290D, conductive elements 141, 143, 147, 149, 181A-181D, 182A-182D, 183A-183D, 184A-184D, 185A-185D, 186A-186D, 187A-187D of the lower package substrate 110, and the first through fourth lower chip bumps 155A to 155D. The electrical signals transmitted between the first through fourth upper semiconductor devices 260A to 260D and the lower semiconductor device 160 may include data signals and address/control signals.

An under-fill material U may be filled between the lower package substrate 110 and the lower semiconductor device 160 to surround sidewalls of the first through fourth lower chip bumps 155A to 155D.

Figure 1J:
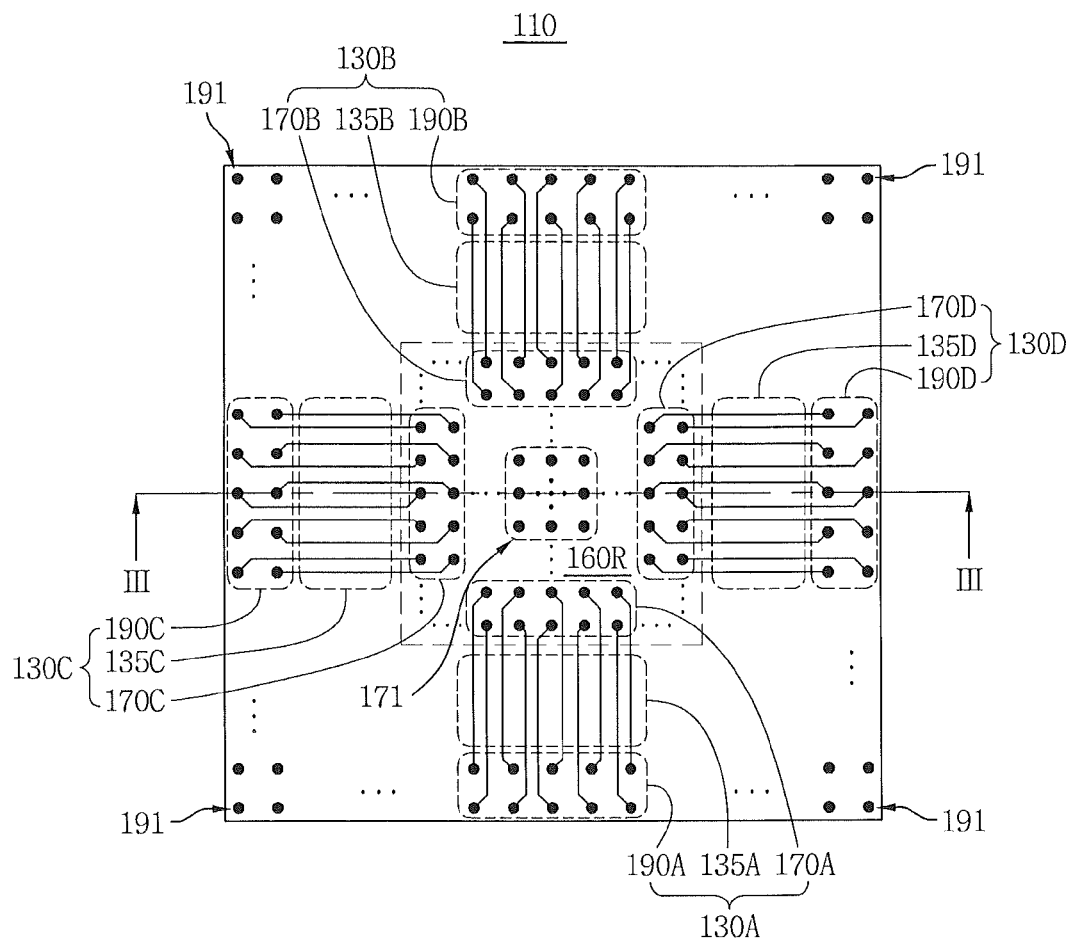
FIG. 1J is a conceptual top view illustrating routing concepts of a lower package substrate according to various embodiments.

FIG. 1J is a conceptual top view illustrating routing concepts of a lower package substrate according to various embodiments of the inventive concept. Referring to FIG. 1J, the lower package substrate 110 may include first through fourth lower package substrate interconnection elements 130A to 130D. The first through fourth lower package substrate interconnection elements 130A to 130D may include the first through fourth lower chip bump lands 170A to 170D, the first through fourth lower bump lands 190A to 190D, and first through fourth lower package substrate interconnections 135A to 135D, respectively. The first through fourth lower package substrate interconnections 135A to 135D may electrically connect the first through fourth lower chip bump lands 170A to 170D with the first through fourth lower bump lands 190A to 190D, respectively. The first through fourth lower package substrate interconnections 135A to 135D may include the core layer 145, the uppermost metal interconnection layer 141, the upper metal interconnection layer 143, the lower metal interconnection layer 147, and the lowermost metal interconnection layer 149 of FIG. 1I. A region 160R where the lower semiconductor device 160 is disposed is illustrated with dotted lines. The first through fourth lower chip bump lands 170A to 170D may overlap the first through fourth lower chip bumps 155A to 155D, respectively. The first through fourth lower chip bump lands 170A to 170D may be a portion of the uppermost metal interconnection layer 141 and/or portions of the first through fourth uppermost chip connection vias 181A to 181D.

According to various embodiments of the inventive concept, the first through fourth lower package substrate interconnections 135A to 135D may be disposed not to overlap one another (i.e., they may be non-overlapping). Thus, the first through fourth lower package substrate interconnections 135A to 135D may include only the uppermost metal interconnection layer 141. In this case, the lower package substrate 110 may be thinned out (i.e., reduced in size). For example, when the first through fourth lower package substrate interconnections 135A to 135D, which are configured to connect the lower semiconductor device 160 with a plurality of upper semiconductor devices, overlap one another, the lower package substrate 110 may include a plurality of metal interconnection layers. However, according to various embodiments of the inventive concept, because the first through fourth lower package substrate interconnections 135A to 135D do not overlap one another, even if the metal interconnection layers 141 to 149 included in the lower package substrate 110 are not provided at multiple levels, conductive connection elements for the lower semiconductor device 160 and the plurality of upper semiconductor devices 260A to 260D may be formed. In contrast, when the first through fourth lower package substrate interconnections 135A to 135D overlap one another, the uppermost metal interconnection layer 141 should be provided at multiple levels. However, according to various embodiments of the inventive concept, the first through fourth lower package substrate interconnections 135A to 135D may not overlap one another. Accordingly, the first through fourth lower package substrate interconnections 135A to 135D may be formed using the single-level uppermost metal interconnection layer 141.

In various embodiments, the first through fourth lower package substrate interconnections 135A to 135D may be formed using both the uppermost metal interconnection layer 141 and the upper metal interconnection layer 143 of the lower package substrate 110. For example, the first through fourth lower package substrate interconnections 135A to 135D may be used in such large numbers that all of the first through fourth lower package substrate interconnections 135A to 135D may not be formed in a one-level metal interconnection layer. Thus, metal interconnection layers may be used at two or more levels. In this case, according to various embodiments of the inventive concept, because the first through fourth lower package substrate interconnections 135A to 135D do not overlap one another, the number of the metal interconnection layers 143 and 147 needed may be reduced/minimized.

The lower package substrate 110 may further include fifth lower chip bump lands 171 to be electrically connected to the fifth lower chip bumps 156 of FIG. 1H. The fifth lower chip bump lands 171 may be disposed in a central region among the first through fourth lower chip bump lands 170A to 170D. The fifth lower chip bump lands 171 may not be connected to the first through fourth lower bump lands 190A to 190D. In various embodiments, the fifth lower chip bump lands 171 may be disposed in the corner regions of the lower semiconductor device region 160R.

In various embodiments, the first through fourth lower package substrate interconnection elements 130A to 130D may be formed using the upper metal interconnection layer 143 and the lower metal interconnection layer 147. In this case, the uppermost metal interconnection layer 141 may be used as a ground plane, as the first through fifth lower chip bump lands 170A to 170D and 171, and/or as the first through fifth lower bump lands 190A to 190D and 191. Also, the lowermost metal interconnection layer 149 may be used as the ground plane and/or as lands for the board bumps 199. In various embodiments, the core layer 145 may be used as a power interconnection, a ground interconnection, and/or a signal transmission interconnection.

Figure 1K:
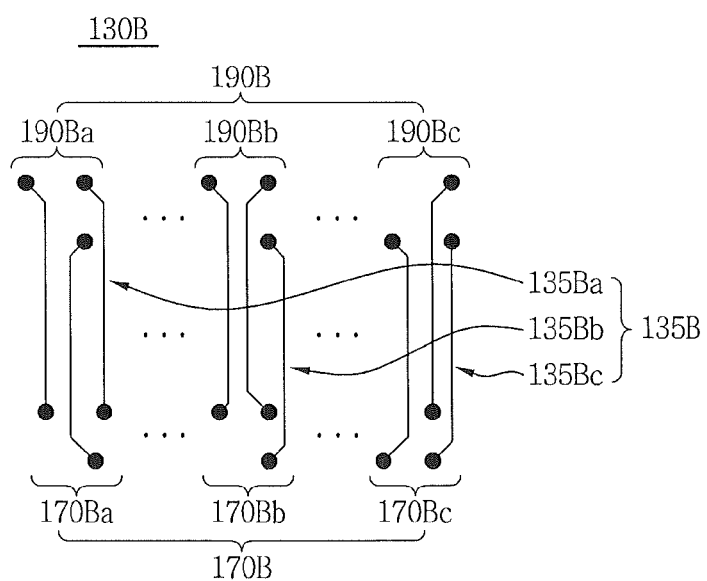
FIG. 1K is a detailed diagram of second lower package substrate interconnection elements of FIG. 1H according to various embodiments.

FIG. 1K is a detailed diagram of the second lower package substrate interconnection elements 130B of FIG. 1H. Referring to FIG. 1K, the second lower package substrate interconnection elements 130B may include first through third groups of lower chip bump lands 170Ba to 170Bc, first through third groups of lower package substrate interconnections 135Ba to 135Bc, and first through third groups of lower bump lands 190Ba to 190Bc.

Among the first through third groups of lower chip bump lands 170Ba to 170Bc, two groups may transmit data signals and/or voltages for the data signals, and the remaining one group may transmit address/control signals. Among the first through third groups of lower package substrate interconnections 135Ba to 135Bc, two groups may transmit data signals and/or voltages for the data signals, and the remaining one group may transmit address/control signals. Among the first through third groups of lower bump lands 190Ba to 190Bc, two groups may transmit data signals and/or voltages for the data signals, and the remaining one group may transmit address/control signals.

For instance, the first and third groups of lower chip bump lands 170Ba and 170Bc, the first and third groups of lower package substrate interconnections 135Ba to 135Bc, and the first and third groups of lower bump lands 190Ba and 190Bc may transmit data signals and/or a supply voltage Vddq for the data signals. The second group of lower chip bump lands 170Bb, the second group of lower package substrate interconnections 135Bb, and the second group of lower bump lands 190Bb may transmit address/control signals. For example, the first and third groups of lower package substrate interconnection elements 130Ba and 130Bc may be disposed on both sides of the second lower package substrate interconnection elements 130B, and the second group of lower package substrate interconnection elements 130Bb may be disposed in a middle region between the first and third groups of lower package substrate interconnection elements 130Ba and 130Bc. The address/control signals may be transmitted to the middle region and the data signals may be transmitted to both of the sides so that a signal balance may be symmetrically stabilized.

In another example, the first and second groups of lower chip bump lands 170Ba and 170Bb, the first and second groups of lower package substrate interconnections 135Ba and 135Bb, and the first and second groups of lower bump lands 190Ba and 190Bb may transmit data signals and/or voltages for the data signals. The third group of lower chip bump lands 170Bc, the third group of lower package substrate interconnections 135Bc, and the third group of lower bump lands 190Bc may transmit address/control signals.

In a further example, the second and third groups of lower chip bump lands 170Bb and 170Bc, the second and third groups of lower package substrate interconnections 135Bb and 135Bc, and the second and third groups of lower bump lands 190Bb and 190Bc may transmit data signals and/or voltages for the data signals. The first group of lower chip bump lands 170Ba, the first group of lower package substrate interconnections 135Ba, and the first group of lower bump lands 190Ba may transmit address/control signals.

In various embodiments, among the first and third groups of lower chip bump lands 170Ba to 170Bc, the first through third groups of lower package substrate interconnections 135Ba to 135Bc, and the first through third groups of lower bump lands 190Ba to 190Bc, two groups configured to transmit data signals and/or reference voltages for the data signals may include the same number of conductive elements. In other words, all the elements configured to transmit the data signals and/or the reference voltages for the data signals may be divided into two groups by half.

The routing concept of the lower package substrate 110 described with reference to FIGS. 1J and 1K may be expansively applied to the remaining lower package substrate interconnection elements 130A, 130C, and 130D.

Figure 1L:
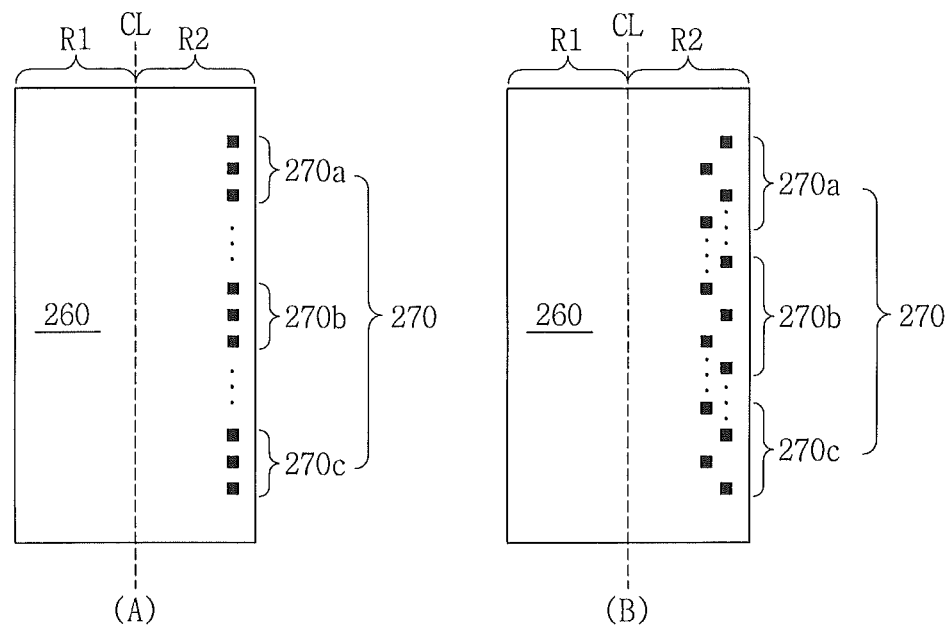
FIGS. 1L (A) and (B) are conceptual diagrams of upper semiconductor devices according to various embodiments.

FIGS. 1L (A) and (B) are conceptual diagrams of one of the upper semiconductor devices 260A to 260D according to various embodiments of the inventive concept. Referring to FIGS. 1L (A) and (B), an upper semiconductor device 260 according to various embodiments of the inventive concept may include chip pads 270 disposed near any one of four sides thereof. For example, when the upper semiconductor device 260 is bisected into two regions R1 and R2 by an imaginary central line CL, the chip pads 270 may be disposed in any one of the two regions R1 and R2. It will be understood that the first and second regions R1 and R2 interchanged. The imaginary central line CL may be provided parallel to a major direction (e.g., parallel to the longest side) of the upper semiconductor device 260. As described herein, the chip pads 270 may transmit or provide a data signal, reference voltages for the data signal, address/control signals, and/or reference voltages for the address/control signals. Thus, according to various embodiments of the inventive concept, each of the first through fourth upper substrate pads 220A to 220D to be electrically connected to the chip pads 270 of the upper semiconductor device 260 may be disposed near any one of the four sides 211A to 211D of the upper package substrate 210A. The chip pads 270 of the upper semiconductor device 260 according to various embodiments of the inventive concept may be arranged using a redistribution structure. Referring further to FIG. 1L(B), the chip pads 270 may be disposed in a zigzag/weaving pattern. In various embodiments, because the chip pads 270 may be provided in such a large quantity that they may not be arranged in a row, the chip pads 270 may be arranged in a zigzag/weaving pattern. Although FIG. 1L(B) illustrates the chip pads 270 arranged in two row or columns, the chip pads 270 may be arranged in three or more rows or columns.

The chip pads 270 may include a first group of chip pads 270a, a second group of chip pads 270b, and a third group of chip pads 270c. The first and third groups of chip pads 270a and 270c may be disposed on both sides of the chip pads 270, and the second group of chip pads 270b may be disposed in a middle region between the first and third groups of chip pads 270a and 270c. Among the first through third groups of chip pads 270a to 270c, two groups may transmit data signals and/or reference voltages for the data signals, and the remaining one group may transmit address/control signals.

For instance, the first and third groups of chip pads 270a and 270c may transmit data signals and a supply voltage Vddq for the data signals, and the second group of chip pads 270b may transmit address/control signals. The address/control signals may be transmitted to a middle region and the data signals may be transmitted to both sides so that a signal balance may be symmetrically stabilized. Alternatively, the first and second groups of chip pads 270a and 270b may transmit data signals and a supply voltage Vddq for the data signals, and the third group of chip pads 270c may transmit address/control signals. In yet another example, the second and third groups of chip pads 270b and 270c may transmit data signals and a supply voltage Vddq for the data signals, while the first group of chip pads 270a may transmit address/control signals.

In various embodiments, among the first through third groups of chip pads 270a to 270c, two groups configured to transmit data signals and/or reference voltages for the data signals may be disposed in the same number. In other words, all of the chip pads configured to transmit the data signals and/or the reference voltages for the data signals may be divided into two groups by half.

Figure 1M:
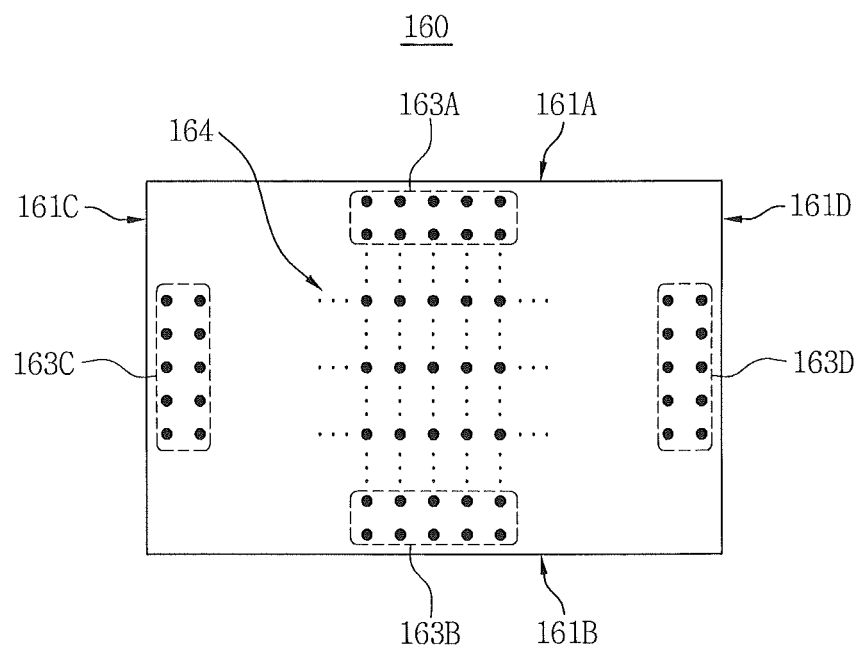
FIG. 1M is a conceptual bottom view of a lower semiconductor device according to various embodiments.

FIG. 1M is a conceptual bottom view of a lower semiconductor device 160 according to various embodiments of the inventive concept. Referring to FIG. 1M, the lower semiconductor device 160 according to various embodiments of the inventive concept may include first through fourth lower chip input output (I/O) parts 163A to 163D disposed near first through fourth inner sides 161A to 161D of the lower semiconductor device 160, and fifth I/O parts 164 disposed in a central region of the lower semiconductor device 160. Each of the first through fourth lower chip I/O parts 163A to 163D may enable the lower semiconductor device 160 to communicate with the corresponding one of the first through fourth upper semiconductor devices 260A to 260D. For example, each of the first through fourth lower chip I/O parts 163A to 163D may enable the lower semiconductor device 160 to transmit and receive data signals and address/control signals to and from the corresponding one of the first through fourth upper semiconductor devices 260A to 260D. Moreover, it will be understood that each of the first through fourth lower chip connection elements 150A to 150D (e.g., of FIG. 1I) may include the corresponding one of the first through fourth lower chip I/O parts 163A to 163D. Also, all of the first through fourth lower chip I/O parts 163A to 163D may be connected to a memory control circuit within the lower semiconductor device 160.

The fifth I/O parts 164 may enable the lower semiconductor device 160 to transmit and receive electrical signals to and from a mother board. For example, in various embodiments, the fifth I/O parts 164 may not be used by the lower semiconductor device 160 to transmit and receive electrical signals to and from the first through fourth upper semiconductor devices 260A to 260D.

Figure 1N:
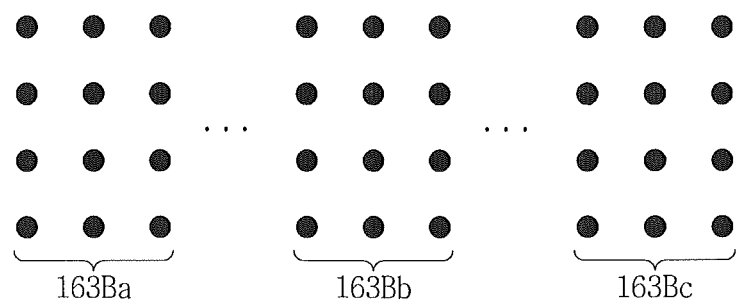
FIG. 1N is a detailed diagram of second lower chip input/output (I/O) parts of FIG. 1M according to various embodiments.

FIG. 1N is a detailed diagram of the second lower chip I/O parts 163B of FIG. 1M. Referring to FIG. 1N, each of the second lower chip I/O parts 163B may include the corresponding one of the first through third groups of lower chip I/O parts 163Ba to 163Bc.

Among the first through third groups of lower chip I/O parts 163Ba to 163Bc, two groups may transmit data signals and/or reference voltages for the data signals, and the remaining one group may transmit address/control signals.

For instance, the first and third groups of the lower chip I/O parts 163Ba and 163Bc may transmit data signals and/or a supply voltage Vddq for the data signals. The second group of lower chip I/O parts 163Bb may transmit address/control signals. The concept of the lower chip I/O parts 163Ba to 163Bc described with reference to FIG. 1N may be expansively applied to the remaining lower package substrate interconnection elements 163A, 163C, and 163D. Alternatively, the first and second groups of lower chip I/O parts 163Ba and 163Bb may transmit data signals and a supply voltage Vddq for the data signals, and the third group of lower chip I/O parts 163Bc may transmit address/control signals. In yet another example, the second and third groups of lower chip I/O parts 163Bb and 163Bc may transmit data signals and a supply voltage Vddq for the data signals, and the first group of lower chip I/O parts 163Ba may transmit address/control signals.

The first and third groups of lower chip I/O parts 163Ba and 163Bc may be disposed on both sides of the second lower chip I/O parts 163B, and the second group of lower chip I/O parts 163Bb may be disposed in a middle region between the first through third groups of lower chip I/O parts 163Ba and 163Bc. The first and third groups of lower chip I/O parts 163Ba and 163Bc may transmit data signals and a supply voltage Vddq for the data signals, and the second group of lower chip I/O parts 163Bb may transmit address/control signals. The address/control signals may be transmitted to the middle region and the data signals may be transmitted to both of the sides so that a signal balance may be symmetrically stabilized. Moreover, it will be understood that because FIG. 1N is a bottom view of the lower semiconductor device 160, the elements therein are turned upside down.

Figure 1O:
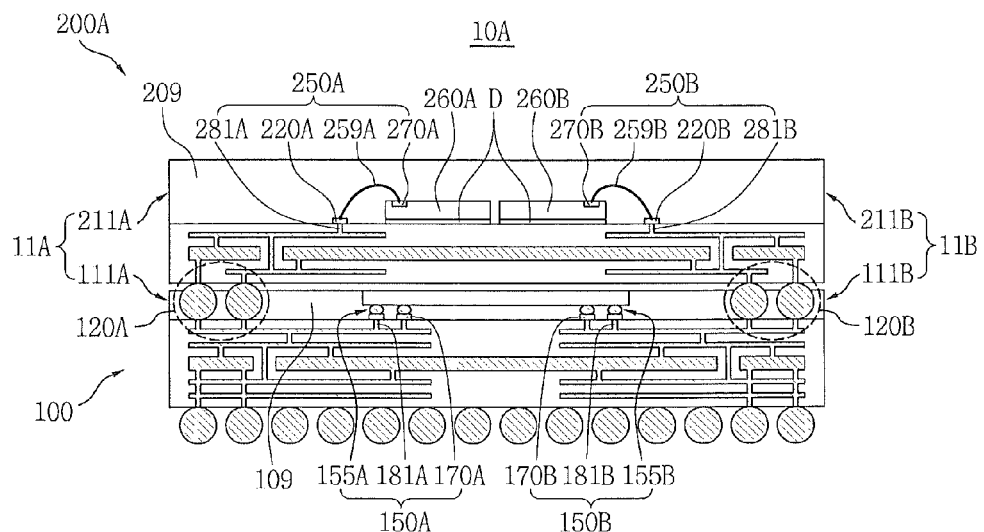
FIGS. 1O and 1P are conceptual longitudinal sectional or side views of the semiconductor package of FIG. 1A according to various embodiments.
Figure 1P:
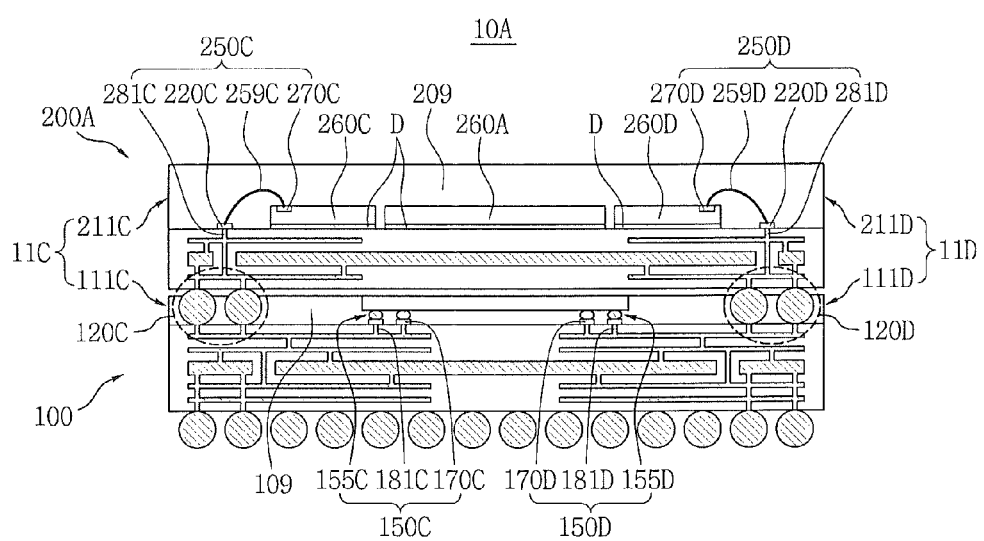

FIGS. 1O and 1P are conceptual longitudinal sectional or side views of the semiconductor package 10A of FIG. 1A, which illustrate a combination of the lower package 100 and the upper package 200A. The semiconductor package 10A may have first through fourth sides 11A to 11D. For brevity, the first through fourth sides 11A to 11D of the semiconductor package 10A may be referred to as first through fourth outer sides 11A to 11D, respectively. The first through fourth outer sides 11A to 11D may include first through fourth upper sides 211A to 211D and first through fourth lower sides 111A and 111D, respectively.

The semiconductor package 10A may include first through fourth channels 120A to 120D, 150A to 150D, and 250A to 250D respectively disposed near the first through fourth outer sides 11A to 11D thereof. The first through fourth channels 120A to 120D, 150A to 150D, and 250A to 250D may include first through fourth inter-package connection elements 120A to 120D, first through fourth lower chip connection elements 150A to 150D, and first through fourth upper chip connection elements 250A to 250D, respectively.

The first through fourth inter-package connection elements 120A to 120D may include the first through fourth bumps 195A to 195D, first through fourth lower bump lands 190A to 190D, and first through fourth upper bump lands 290A to 290D, respectively. As described herein, the first through fourth inter-package connection elements 120A to 120D may further include first through fourth bump vias 182A to 182D, respectively.

The first through fourth lower chip connection elements 150A to 150D may include the first through fourth lower chip bumps 155A to 155D and lower chip bump lands 170A to 170D, respectively. As described herein, the first through fourth lower chip connection elements 150A to 150D may further include the first through fourth uppermost chip connection vias 181A to 181D, respectively.

The first through fourth upper chip connection elements 250A to 250D may further include first through fourth uppermost vias 281A to 281D, respectively.

According to various embodiments of the inventive concept, the first through fourth channels 120A to 120D, 150A to 150D, and 250A to 250D may electrically connect the upper semiconductor devices 260A to 260D with the lower semiconductor device 160. For example, the first through fourth inter-package connection elements 120A to 120D, the first through fourth lower chip connection elements 150A to 150D, and the first through fourth upper chip connection elements 250A to 250D may transmit data signals, address signals, and control signals between the upper semiconductor devices 260A to 260D and the lower semiconductor device 160.

The lower package 100 may be molded with a lower package encapsulant 109, while the upper package 200A may be molded with an upper package encapsulant 209. The lower package encapsulant 109 may expose a surface of the lower semiconductor device 160. For example, the lower package encapsulant 109 may not cover the surface of the lower semiconductor device 160. The upper package encapsulant 209 may completely cover the first through fourth upper semiconductor devices 260A to 260B. The lower package encapsulant 109 and the upper package encapsulant 209 may include resin, epoxy, or benzocyclobutene (BCB).

Figure 1Q:
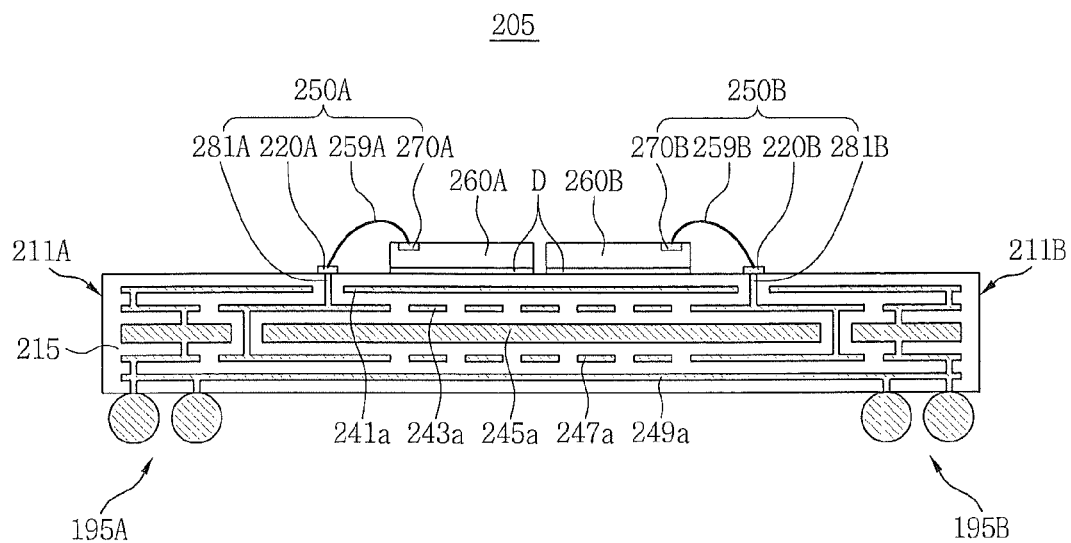
FIGS. 1Q and 1R are conceptual longitudinal sectional or side views of an upper package according to various embodiments.
Figure 1R:
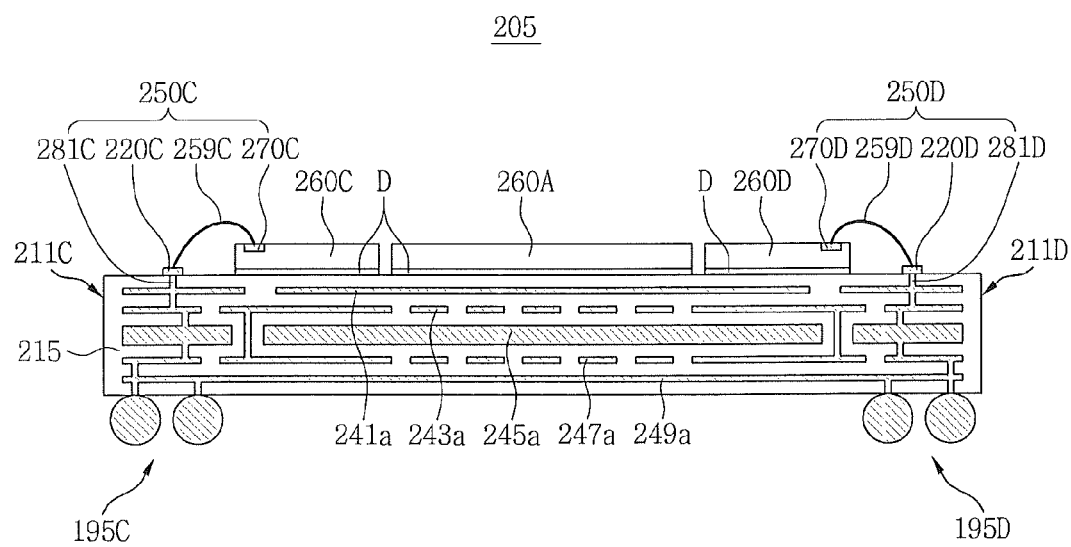

FIGS. 1Q and 1R are conceptual longitudinal sectional or side views of an upper package 205 according to various embodiments of the inventive concept. Referring to FIGS. 1Q and 1R, the upper package 205 may include an upper package substrate 215 having five-level metal interconnection layers 241a, 243a, 245a, 247a, and 249a. For example, the upper package 205 may include an uppermost metal interconnection layer 241a, an upper metal interconnection layer 243a, a core layer 245a, a lower metal interconnection layer 247a, and a lowermost metal interconnection layer 249a.

When the first through fourth channels 120A to 120D, 150A to 150D, and 250A to 250D of FIGS. 1O and 1P include a large number of conductive elements, it may be difficult for the metal interconnection layers 243, 245, and 247 of the upper package substrate 210 shown in FIGS. 1D and 1E to include all conductive elements. As described herein, multiple metal interconnection layers 241a, 243a, 245a, 247a, and 249a disposed at five or more levels may be needed. Moreover, when there is concern about signal interference between signal interconnections, the respective signal interconnections may be shielded. In this case, as shown in FIGS. 1Q and 1R, the upper package substrate 215 may include the metal interconnection layers 241a, 243a, 245a, 247a, and 249a disposed at five or more levels.

Each of the metal interconnection layers 241a, 243a, 245a, 247a, and 249a may contain the corresponding one of the channels, or the metal interconnection layers 241a, 243a, 245a, 247a, and 249a may be variously combined. For instance, the uppermost metal interconnection layer 241a may provide a ground plane, the first through fourth uppermost vias 281A to 281D, or the first through fourth upper substrate pads 220A to 220D. The upper metal interconnection layer 243a may contain at least one of the first through fourth channels 120A to 120D, 150A to 150D, and 250A to 250D. The core layer 245a may provide a portion of a power interconnection, a ground plane, or a signal transmission interconnection. The lower metal interconnection layer 247a may include at least one of the first through fourth channels 120A to 120D, 150A to 150D, and 250A to 250D. The lowermost metal interconnection layer 249a may provide a ground plane, the first through fourth lowermost vias 284A 284D, or the first through fifth upper bump lands 290A to 290D and 291.

Figure 2A:
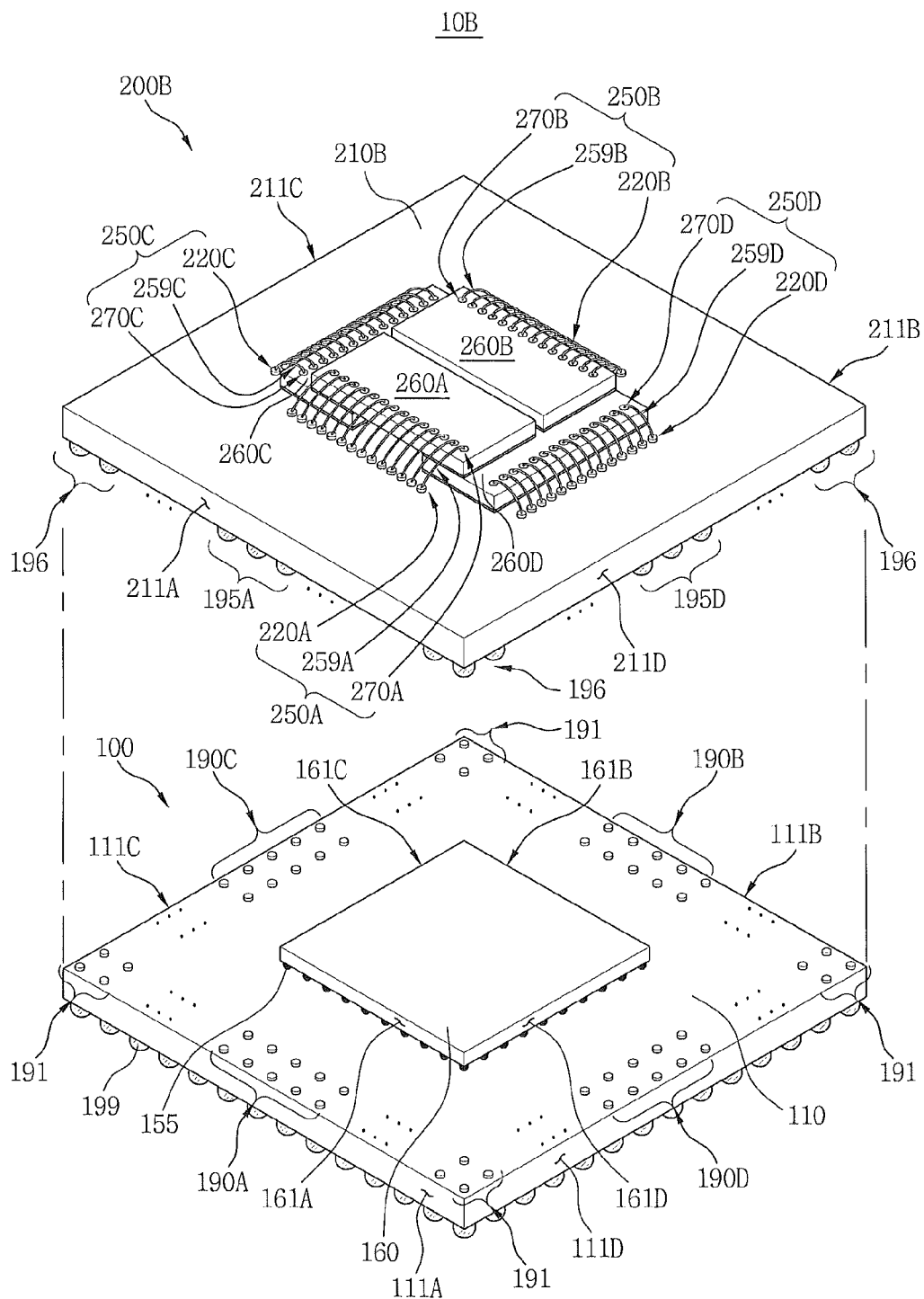
FIG. 2A is a conceptual perspective view of a semiconductor package according to various embodiments.
Figure 2B:
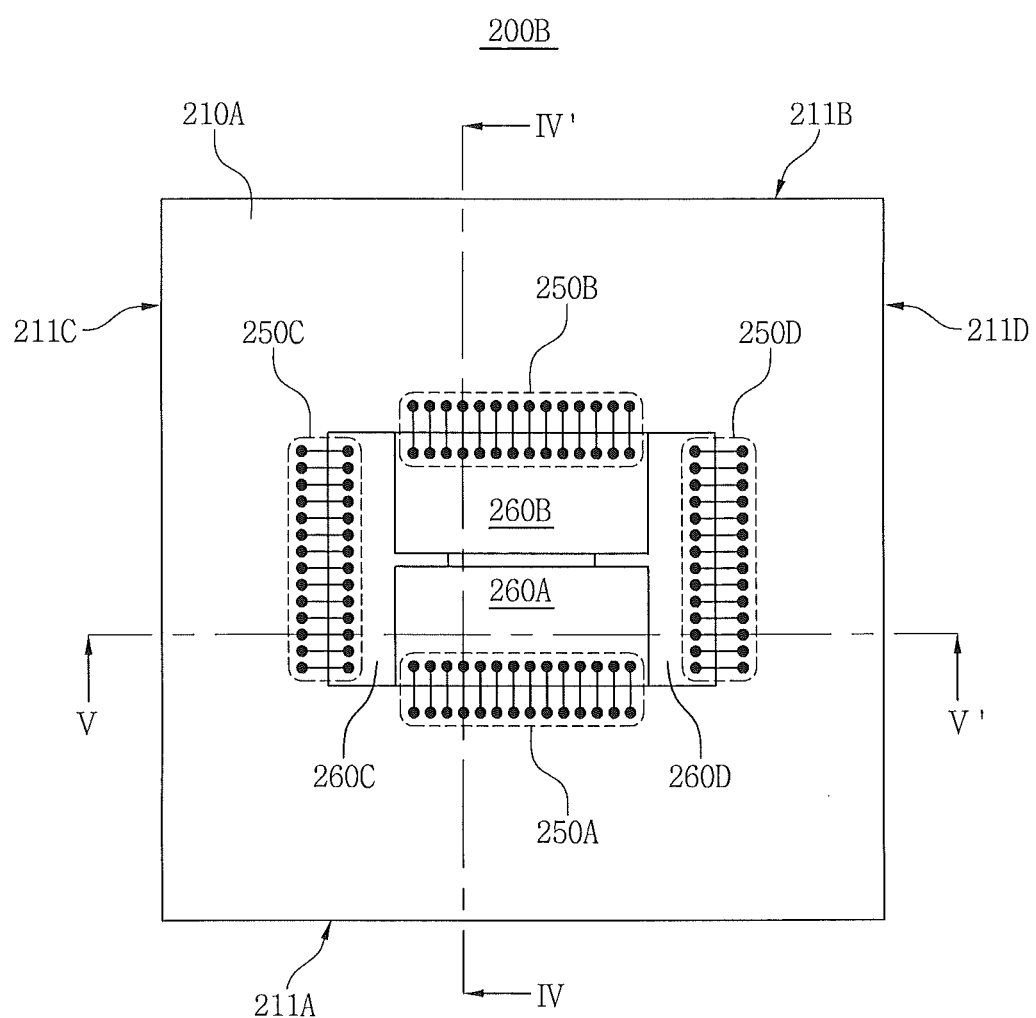
FIG. 2B is a top view of an upper package of the semiconductor package of FIG. 2A according to various embodiments.
Figure 2C:
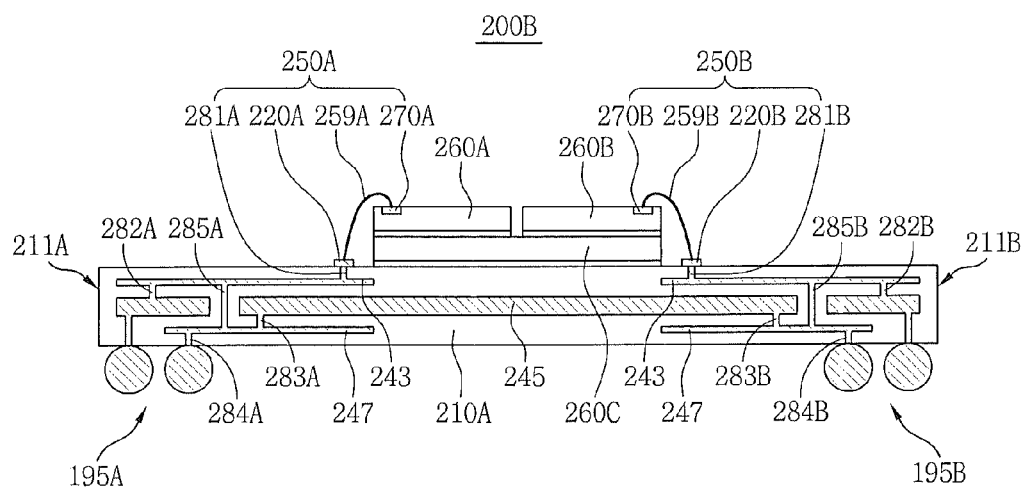
FIGS. 2C and 2D are longitudinal sectional or side views taken along directions IV-IV' and V-V' of FIG. 2B according to various embodiments.
Figure 2D:
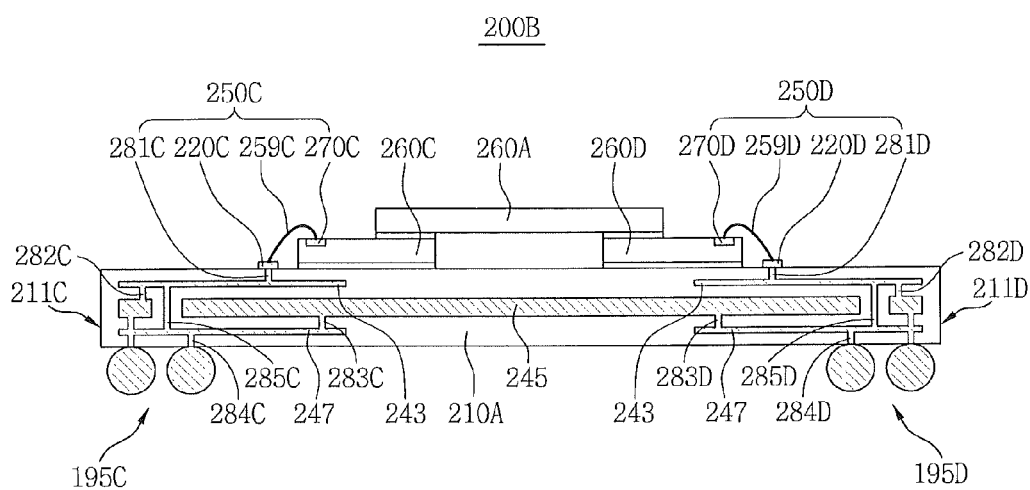

FIG. 2A is a conceptual perspective view of a semiconductor package 10B according to various embodiments of the inventive concept, FIG. 2B is a top view of an upper package 200B of the semiconductor package 10B of FIG. 2A, and FIGS. 2C and 2D are longitudinal sectional or side views of the upper package 200B, which are taken along directions IV-IV' and V-V' of FIG. 2B.

Referring to FIGS. 2A through 2D, the semiconductor package 10B according to various embodiments may include a lower package 100 and the upper package 200B stacked on the lower package 100. The lower package 100 may be understood with reference to FIGS. 1A, 1H through 1K, 1O, and 1P.

The upper package 200B may include first through fourth upper semiconductor devices 260A to 260D provided in a stacked manner. For example, the first and second upper semiconductor devices 260A and 260B may be stacked on the third and fourth upper semiconductor devices 260C and 260D to partially overlap the third and fourth upper semiconductor devices 260C and 260D. For instance, the third and fourth upper semiconductor devices 260C and 260D may be mounted on an upper package substrate 210B in a side-by-side manner, and the first and second upper semiconductor devices 260A and 260B may be stacked on the third and fourth upper semiconductor devices 260C and 260D in a side-by-side manner. Alternatively, the third and fourth upper semiconductor devices 260C and 260D may be mounted on the upper package substrate 210 opposite and parallel to each other, and the first and second upper semiconductor devices 260A and 260B may be stacked on the third and fourth upper semiconductor devices 260C and 260D opposite and parallel to each other. For example, the third and fourth upper semiconductor devices 260C and 260D may be disposed such that sides near the third and fourth chip pads 270C and 270D among four sides of the third and fourth upper semiconductor devices 260C and 260D are far from one another. Also, the first and second upper semiconductor devices 260A and 260B may be disposed such that sides near the first and second chip pads 270A and 270B among four sides of the first and second upper semiconductor devices 260A and 260B are far from one another.

Although it is illustrated that sides of the first through fourth upper semiconductor devices 260A to 260D are aligned with one another, the illustration is only exemplary. That is, according to various embodiments, the sides of the first through fourth upper semiconductor devices 260A to 260D may not be aligned with one another. The first through fourth upper semiconductor devices 260A to 260D may be connected to the upper package substrate 210B using the first through fourth upper chip connection elements 250A to 250D described herein. The upper package substrate 210B may be understood with reference to the upper package substrate 210A of FIGS. 1A through 1E. Moreover, some elements may be understood with reference to FIGS. 1A through 1P.

Figure 3A:
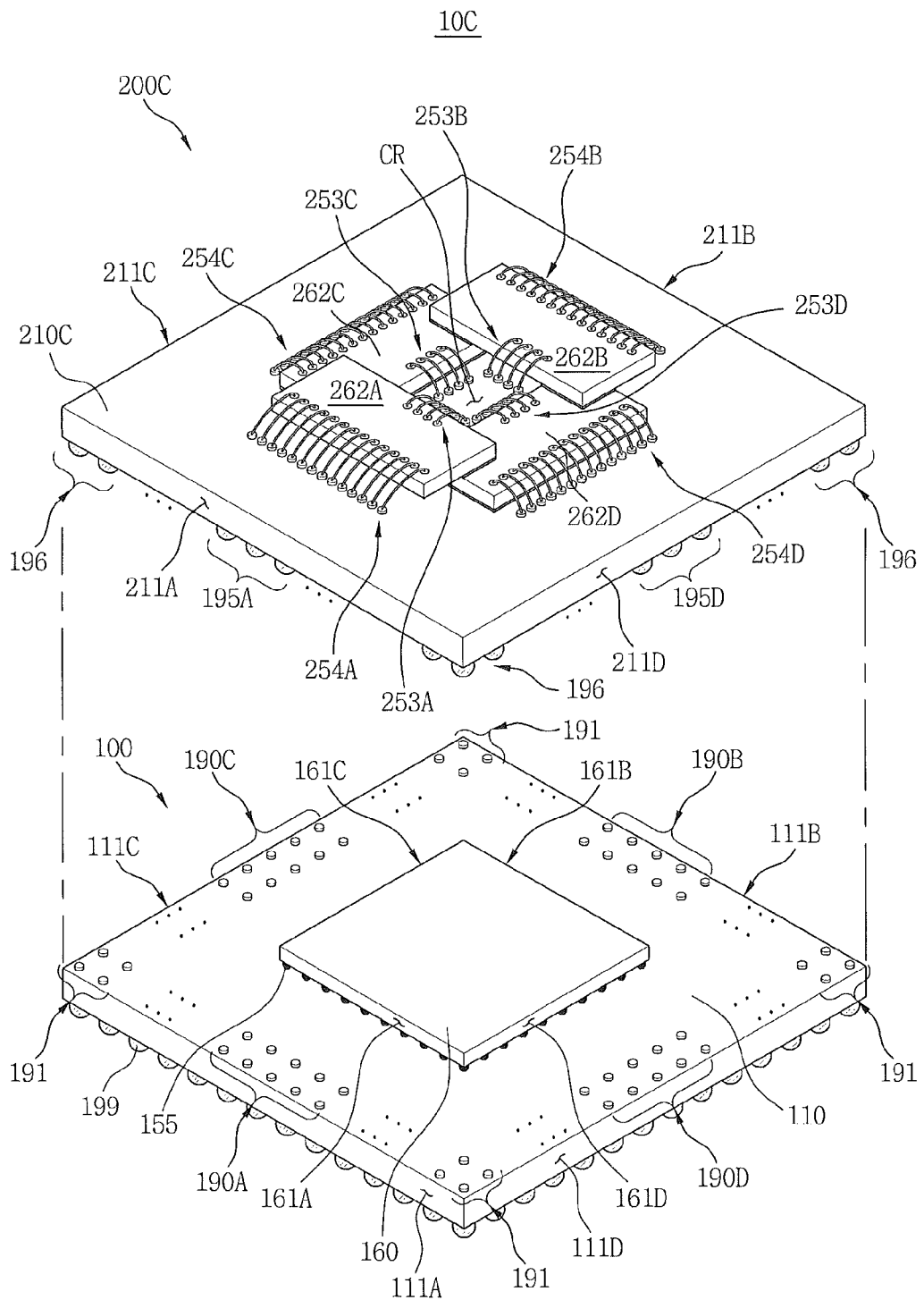
FIG. 3A is a perspective view of a semiconductor package according to various embodiments.
Figure 3B:
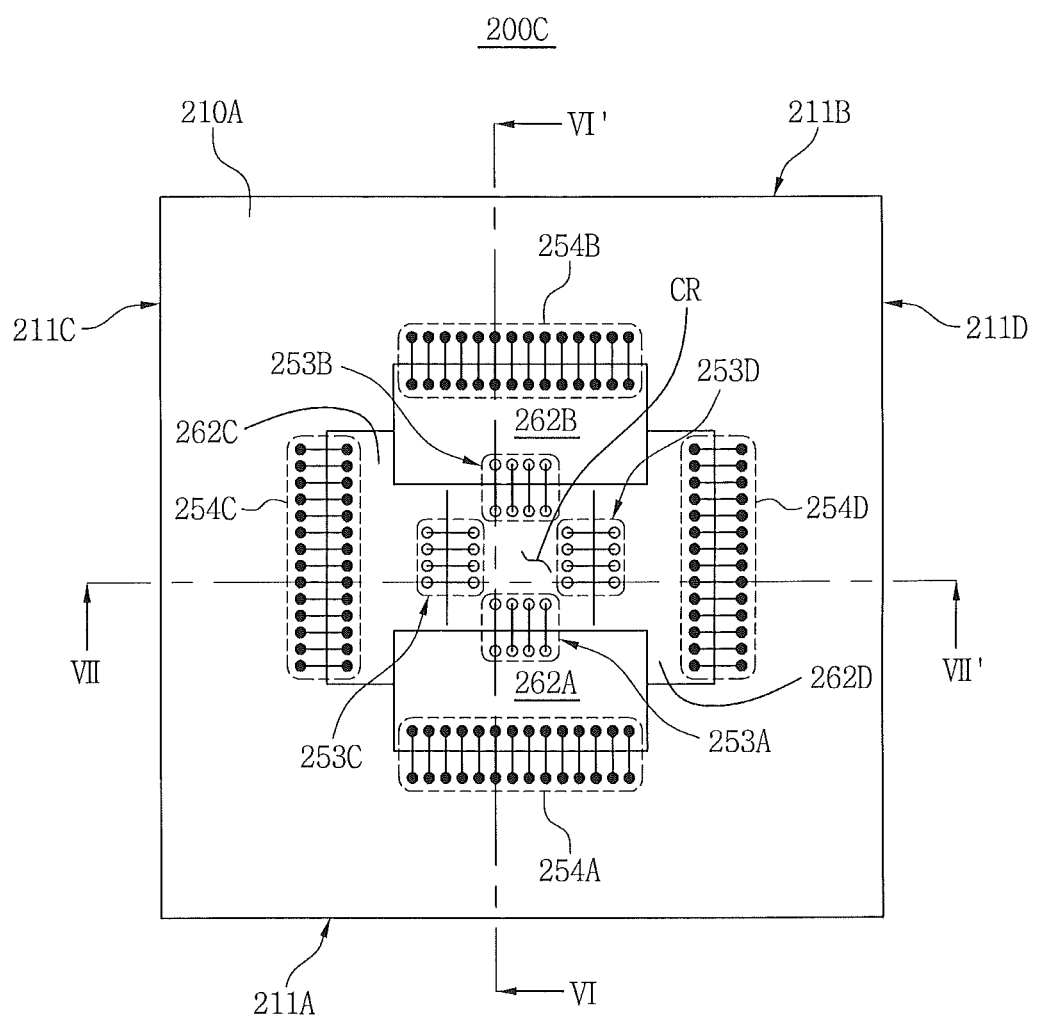
FIG. 3B is a top view of an upper package of FIG. 3A according to various embodiments.

FIG. 3A is a perspective view of a semiconductor package 10C according to various embodiments of the inventive concept, and FIG. 3B is a top view of an upper package 200C of FIG. 3A.

Referring to FIGS. 3A and 3B, the semiconductor package 10C according to various embodiments may include a lower package 100 and the upper package 200C stacked on the lower package 100. The lower package 100 may be understood with reference to FIGS. 1A, 1H through 1K, 1O, and 1P.

The upper package 200C may include first through fourth upper semiconductor devices 262A to 262D stacked thereon with a central region CR therebetween left vacant (i.e., the first through fourth upper semiconductor devices 262A to 262D are absent from the central region CR). For example, the first and second upper semiconductor devices 262A and 262B may be stacked on the third and fourth upper semiconductor devices 262C and 262D. For instance, the third and fourth upper semiconductor devices 262C and 262D may be mounted on an upper package substrate 210C and spaced apart from and parallel to each other. Also, the first and second upper semiconductor devices 262A and 262B may be stacked on the third and fourth upper semiconductor devices 262C and 262D and spaced apart from and parallel to each other.

The first through fourth upper semiconductor devices 262A to 262D may be connected to the upper package substrate 210C using first through fourth inner upper-chip connection elements 253A to 253D and first through fourth outer upper-chip connection elements 254A to 254D. Each of the first through outer upper-chip connection elements 254A to 254D may be disposed near the corresponding one of the first through fourth upper sides 211A to 211D of the upper package substrate 210C. The first through fourth inner upper-chip connection elements 253A to 253D may be connected to the central region CR of the upper package substrate 210C. Each of the first through fourth inner upper-chip connection elements 253A to 253D may be disposed near the corresponding one of the first through fourth upper sides 211A to 211D of the upper package substrate 210C. The number of the first through fourth inner upper-chip connection elements 253A to 253D may be smaller than the number of the first through fourth outer upper-chip connection elements 254A to 254D. The first through fourth inner upper-chip connection elements 253A to 253D may transmit or provide reference voltages Vdda/Vssa for address signals and/or reference voltages Vdd/Vss for control signals. In addition, some of the first through fourth inner upper-chip connection elements 253A to 253D may be electrically connected to one another. That is, some of the first through fourth inner upper-chip connection elements 253A to 253D may transmit or provide the same electrical signal or the same reference voltages. The first through fourth outer upper-chip connection elements 254A to 254D may transmit data signals, reference voltages Vddq/Vssq for the data signals, address signals and/or control signals. The first through fourth outer upper-chip connection elements 254A to 254D may include the upper chip connection elements 250B of FIG. 1C, according to various embodiments of the inventive concept.

Figure 3C:
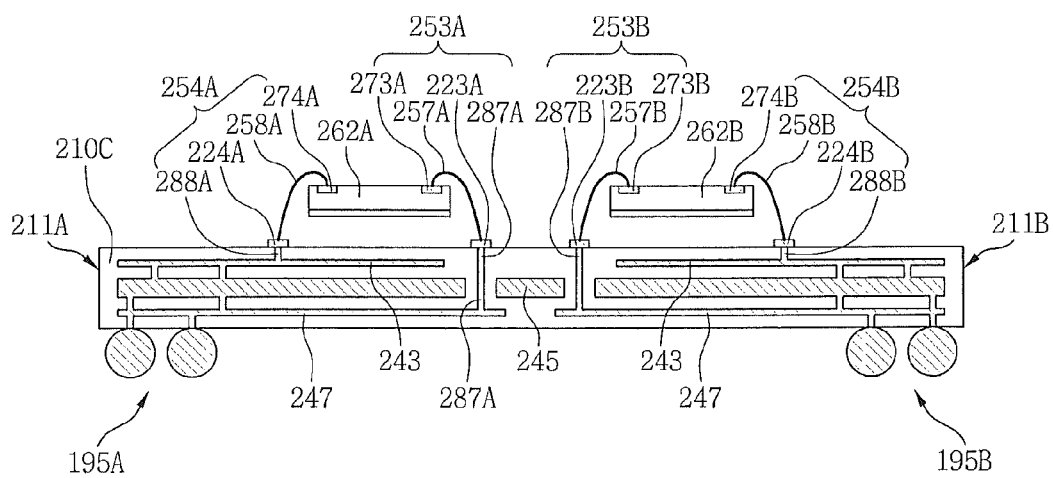
FIGS. 3C and 3D are longitudinal sectional or side views taken along lines VI-VI' and VII-VII' of FIG. 3B according to various embodiments.
Figure 3D:
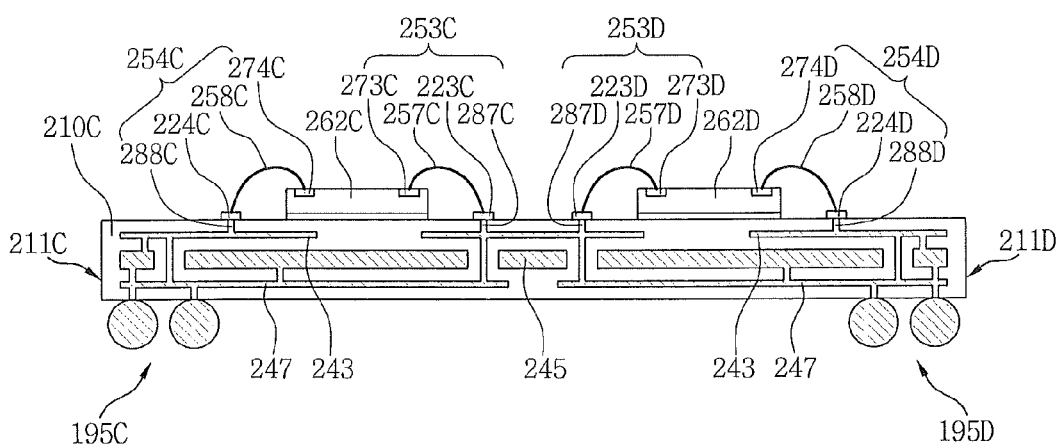

FIGS. 3C and 3D are longitudinal sectional or side views of the upper package 200C, which are taken along lines VI-VI' and VII-VII' of FIG. 3B. Referring to FIGS. 3C and 3D, the first through fourth inner upper-chip connection elements 253A to 253D may include first through fourth inner chip pads 273A to 273D, first through fourth inner wires 257A to 257D, and first through fourth inner upper substrate pads 223A to 223D, respectively. The first through fourth inner upper substrate pads 223A to 223D may be electrically connected to an upper metal interconnection layer 243 or a lower metal interconnection layer 247 using first through fourth inner vias 287A to 287D. The first through fourth inner upper substrate pads 223A to 223D may further include the first through fourth inner vias 287A to 287D.

The first through fourth outer upper-chip connection elements 254A to 254D may include first through fourth outer chip pads 274A to 274D, first through fourth outer wires 258A to 258D, and first through fourth outer upper substrate pads 224A to 224D, respectively. The first through fourth outer upper substrate pads 224A to 224D may be electrically connected to the upper metal interconnection layer 243 or the lower metal interconnection layer 247 using first through fourth outer vias 288A to 288D. The first through fourth outer upper substrate pads 224A to 224D may further include the first through fourth outer vias 288A to 288D, respectively.

Figure 3E:
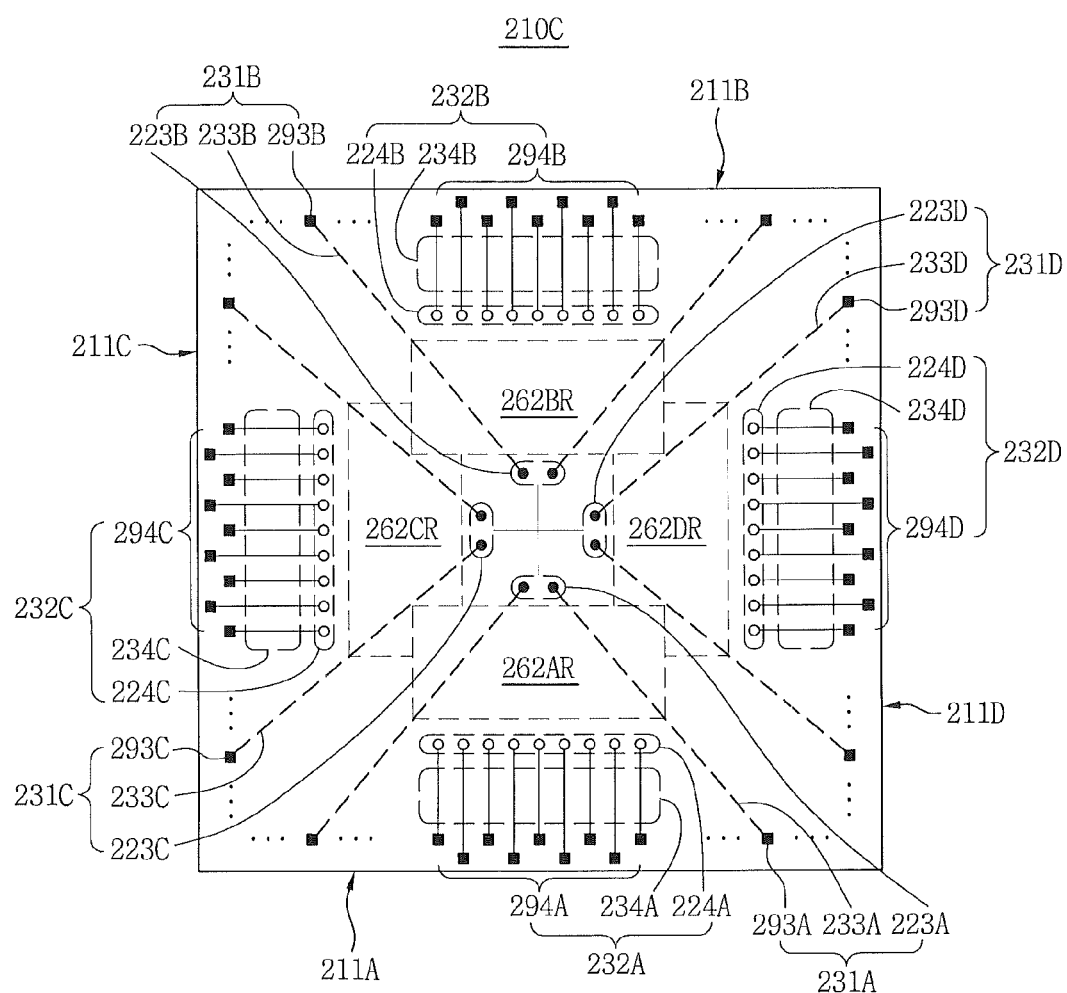
FIG. 3E is a conceptual top view illustrating routing concepts of an upper package substrate according to various embodiments.

FIG. 3E is a conceptual top view illustrating routing concepts of an upper package substrate 210C according to various embodiments of the inventive concept. Referring to FIG.

3E, the upper package substrate 210C may include first through fourth inner substrate interconnection elements 231A to 231D and first through fourth outer substrate interconnection elements 232A to 232D. The first through fourth inner substrate interconnection elements 231A to 231D may include the first through fourth inner upper substrate pads 223A to 223D, first through fourth inner upper bump lands 293A to 293D, and first through fourth inner upper package substrate interconnections 233A to 233D, respectively. The first through fourth outer substrate interconnection elements 232A to 232D may include the first through fourth outer upper substrate pads 224A to 224D, first through fourth outer upper bump lands 294A to 294D, and first through fourth outer upper package substrate interconnections 234A to 234D, respectively. Regions 262AR to 262DR where the first through fourth upper semiconductor devices 262A to 262D are disposed are illustrated with dotted lines.

The first through fourth outer upper package substrate interconnection elements 232A to 232D may include the routing concept described with reference to FIGS. 1F and 1G. The first through fourth outer upper package substrate interconnection elements 232A to 232D may be divided into three groups and transmit data signals, a supply voltage Vddq for the data signals, and address/control signals.

The first through fourth inner upper package substrate interconnection elements 231A to 231D may transmit or provide a supply voltage Vddq or reference voltage Vdda for address/control signals.

The first through fourth inner upper package substrate interconnections 233A to 233D may include the upper metal interconnection layer 243 and/or the lower metal interconnection layer 247. In various applied embodiments, the first through fourth inner upper package substrate interconnections 233A to 233D may include the lower metal interconnection layer 247. The first through fourth outer upper package substrate interconnections 234A to 234D may include the upper metal interconnection layer 243 and the lower metal interconnection layer 247. In applied embodiments, the first through fourth outer upper package substrate interconnections 234A to 234D may include the upper metal interconnection layer 243. In FIG. 3E, the first through fourth inner upper package substrate interconnections 233A to 233D are illustrated with dotted lines to indicate that the first through fourth inner upper package substrate interconnections 233A to 233D may correspond to the lower metal interconnection layer 247.

Figure 3F:
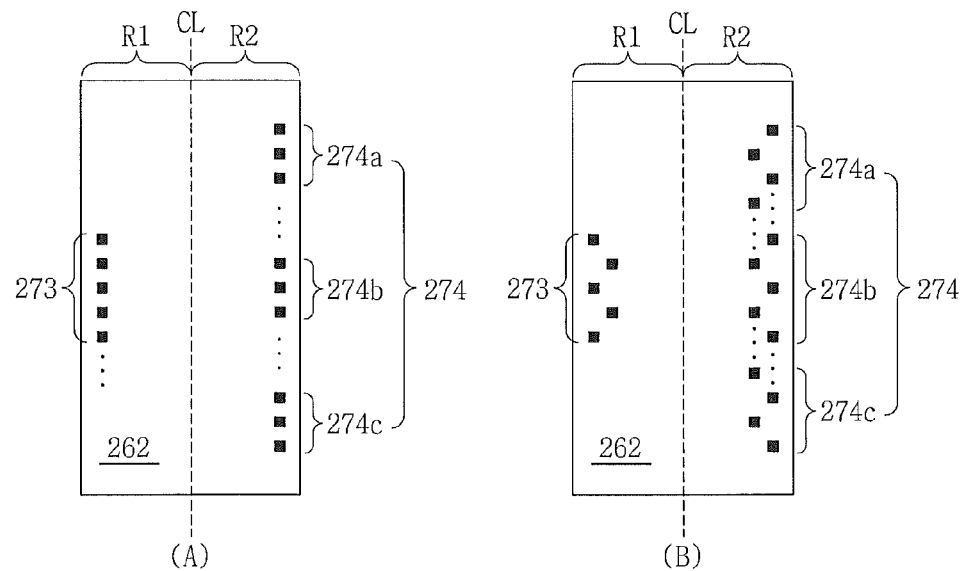
FIGS. 3F (A) through (D) are conceptual diagrams of upper semiconductor devices according to various embodiments.
Figure 3F:
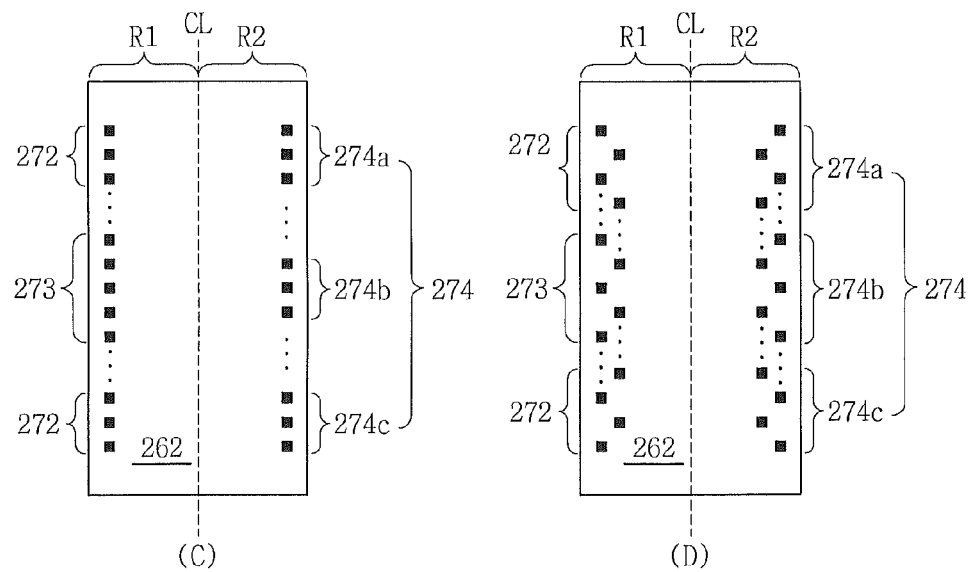

FIGS. 3F (A) through (D) are conceptual diagrams of one of the upper semiconductor devices 262A to 262D according to various embodiments of the inventive concept. Referring to FIGS. 3F(A) and (B), an upper semiconductor device 262 according to various embodiments of the inventive concept may include chip pads 273 and 274 respectively disposed near two opposite sides of four sides thereof. For instance, inner chip pads 273 may be disposed in an opposite position to outer chip pads 274, (e.g., near an opposite side of a side disposed near outer chip pads 274) on the upper semiconductor device 262.

For example, when the upper semiconductor device 262 is bisected into two regions R1 and R2 by an imaginary central line CL, the inner chip pads 273 may be disposed in a first region R1 (e.g., a left region of the drawing), while the outer chip pads 274 may be disposed in a second region R2 (e.g., a right region of the drawing). It will be understood that the first and second regions R1 and R2 may be interchanged. The imaginary central line CL may be provided parallel to a major direction (e.g., the longest side) of the upper semiconductor device 262. As described herein, the inner chip pads 273 may transmit or provide reference voltages Vdda/Vssa for address/control signals, while the outer chip pads 274 may transmit or provide a data signal, a supply voltage Vddq for the data signal, and/or the address/control signals. The inner and outer chip pads 273 and 274 of the upper semiconductor device 262 according to various embodiments of the inventive concept may be arranged using a redistribution structure. Referring to FIG. 3F(B), the chip pads 273 and 274 may be disposed in a zigzag/weaving pattern. Because the chip pads 273 and 274 may be provided in such a large quantity that they may not be arranged in a particular row, the chip pads 273 and 274 may be arranged in a zigzag/weaving pattern. Although FIG. 3F(B) illustrates the chip pads 273 and 274 arranged in two row or columns, the chip pads 273 and 274 may be arranged in three or more rows or columns.

The outer chip pads 274 may include first through third groups of outer chip pads 274a to 274c. The first and third groups of outer chip pads 274a and 274c may transmit data signals, and the second group of outer chip pads 274b may transmit address/control signals. Alternatively, the first and second groups of outer chip pads 274a and 274b may transmit data signals, and the third group of outer chip pads 274c may transmit address/control signals. In yet another example, the second and third groups of outer chip pads 274b and 274c may transmit data signals, and the first group of outer chip pads 274a may transmit address/control signals.

Although FIGS. 3F(A) and (B) illustrate that the number of the inner chip pads 273 is smaller than the number of the outer chip pads 274, referring to FIGS. 3F(C) and (D), some of the inner chip pads 273 (e.g., inner chip pads 272) may be used to transmit data signals, reference voltages for the data signals, or address/control signals. Thus, according to various embodiments, the number of the inner chip pads 272 and 273 may be larger than the number of the outer chip pads 274.

Figure 4A:
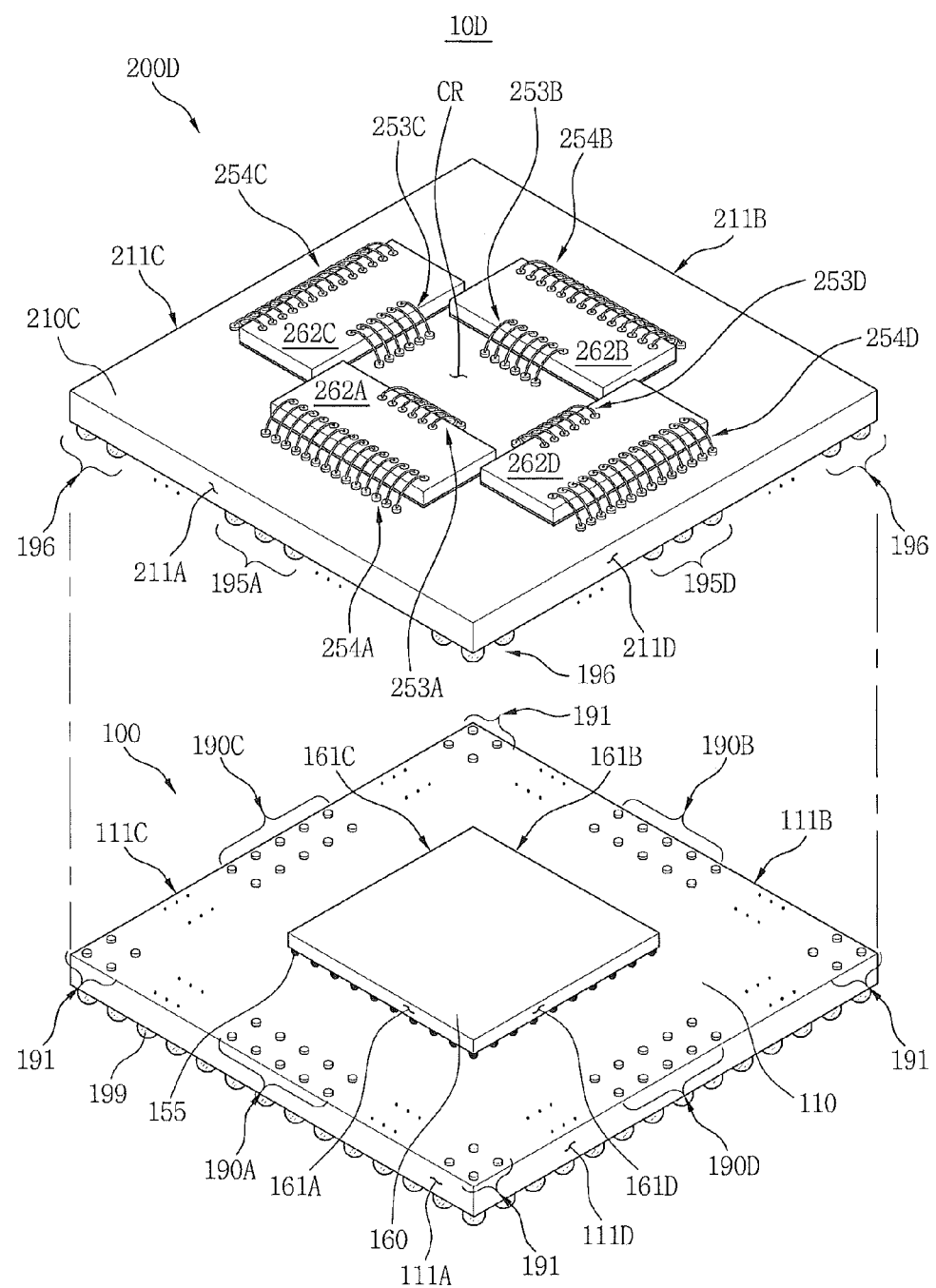
FIG. 4A is a conceptual perspective view of a semiconductor package according to various embodiments.
Figure 4B:
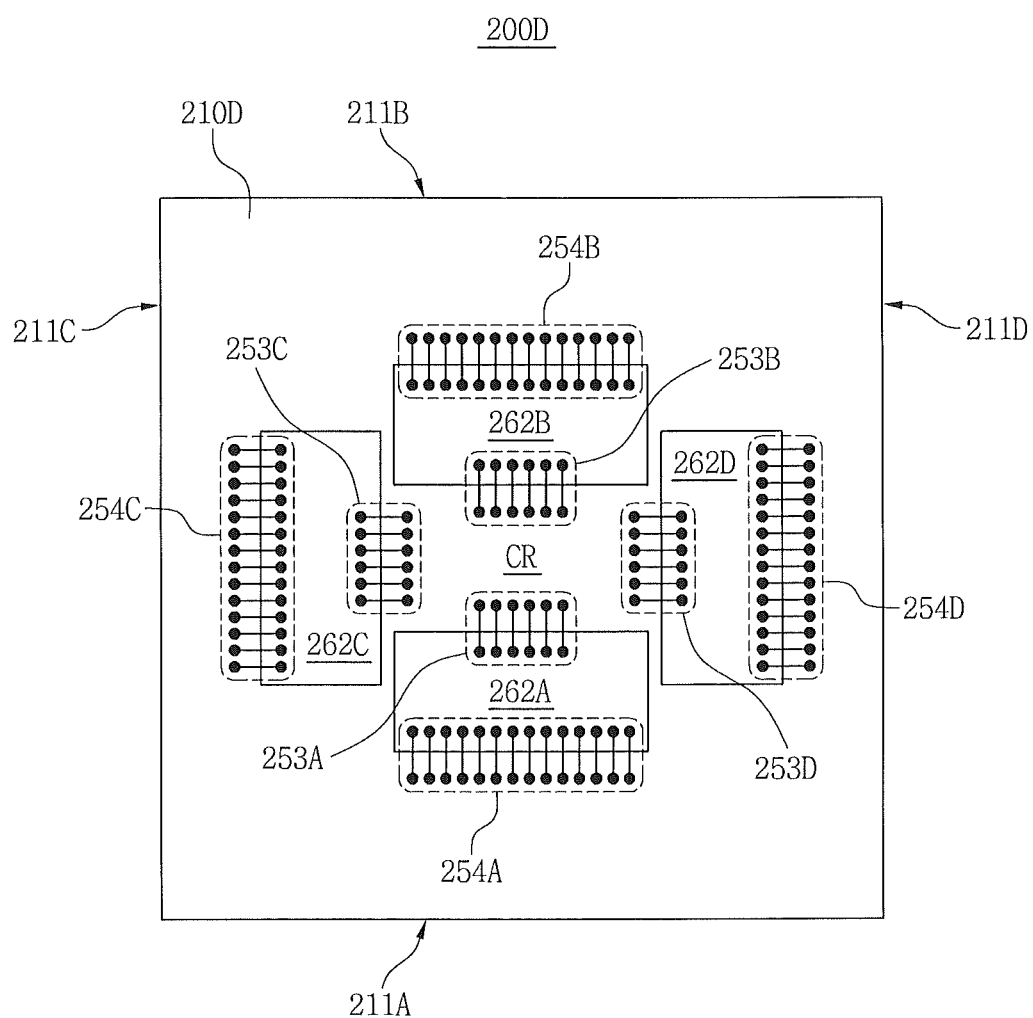
FIG. 4B is a top view of an upper package of FIG. 4A according to various embodiments.

FIG. 4A is a conceptual perspective view of a semiconductor package 10D according to various embodiments of the inventive concept, and FIG. 4B is a top view of an upper package 200D of FIG. 4A. Referring to FIGS. 4A and 4B, the semiconductor package 10D according to the various embodiments may include a lower package 100 and an upper package 200D stacked on the lower package 100. The lower package 100 may be understood with reference to FIGS. 1A, 1H through 1K, 1O and 1P.

The upper package 200D may include first through fourth upper semiconductor devices 262A to 262D spaced apart from one another with a central region CR therebetween left vacant (i.e., the first through fourth upper semiconductor devices 262A to 262D are absent from the central region CR). The first through fourth upper semiconductor devices 262A to 262D may include first through fourth inner upper chip connection elements 253A to 253D and first through fourth outer upper-chip connection elements 254A to 254D, respectively. The first through fourth inner upper-chip connection elements 253A to 253D may be disposed near the central region CR, while the first through fourth outer upper-chip connection elements 254A to 254D may be disposed near first through fourth upper sides 211A to 211D of the upper package substrate 210D. In various embodiments, the first through fourth upper semiconductor devices 262A to 262D may be disposed at the same level in such a way as to not overlap one another. The first through fourth inner upper chip connection elements 253A to 253D, the first through fourth outer upper chip connection elements 254A to 254D, and other elements of the semiconductor package 10D may be understood with reference to other drawings and descriptions of the present disclosure.

In the semiconductor packages 10A to 10D according to various embodiments of the inventive concept, the upper semiconductor devices 260, 260A to 260D, 262, and 262A to 262D may be electrically connected to the lower semiconductor device 160 using independent channels, respectively. Each of the independent channels may be disposed near the corresponding ones of the first through fourth sides 11A to 11D, 111A to 111D, 161A to 161D, and 211A to 211D. The independent channels may include first through fourth inter-package connection elements 120A to 120D, first through fourth lower chip connection elements 150A to 150D, and first through fourth upper chip connection elements 250A to 250D, respectively. Thus, because the quantity/number of the metal layers 141, 143, 145, 147, 149, 243, 245, and 247 of the upper and lower package substrates 210 and 110 may be reduced/minimized, the thicknesses of the entire semiconductor packages 10A to 10D may be reduced.

In the semiconductor packages 10A to 10D according to various embodiments of the inventive concept, the chip pads 270 and 270A to 270D of the upper semiconductor devices 260, 260A to 260D, 262, and 262A to 262D may be exposed/uncovered. By exposing/uncovering the chip pads 270 and 270A to 270D, the entire height of the semiconductor packages 10A to 10D may be reduced/minimized. For example, when the chip pads 270 and 270A to 270D are not exposed/uncovered, a wire bonding process may be performed, and wire protecting units, for example, thick DAFs, may be needed, thereby increasing a chip stacked thickness. When the chip pads 270 and 270A to 270D are exposed/uncovered according to various embodiments of the inventive concept, the wire protecting units may not be required, so that the thickness of an adhesive film configured to stack and fix semiconductor chips may be reduced/minimized. As a result, a chip stacked thickness may be reduced/minimized. Accordingly, the semiconductor packages 10A to 10D according to various embodiments of the inventive concept may be powerfully used in technical fields that need ultrathin electronic devices, such as mobile devices.

Figure 5A:
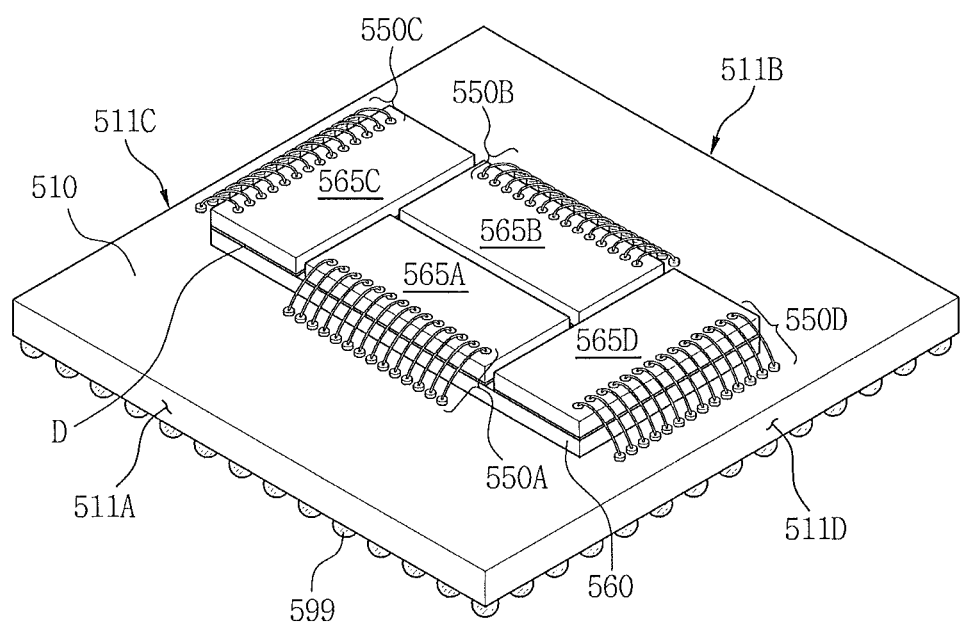
FIG. 5A is a conceptual perspective view of a semiconductor package according to various embodiments.

FIG. 5A is a conceptual perspective view of a semiconductor package 50A according to various embodiments of the inventive concept.

Referring to FIG. 5A, the semiconductor package 50A according to various embodiments of the inventive concept may include a package substrate 510, a lower semiconductor device 560 mounted on the package substrate 510, first through fourth upper semiconductor devices 565A to 565D directly disposed on the lower semiconductor device 560, and first through fourth upper chip connection elements 550A to 550D. The first through fourth upper semiconductor devices 565A to 565D may be disposed on the lower semiconductor device 560 using a die-attach film (DAF) D.

The package substrate 510 may include a printed circuit board (PCB). The package substrate 510 may have first through fourth sides 511A to 511D. For example, the first side 511A may be a front side, and the second side 511B may be a rear side. The third side 511C may be a left side, and the fourth side 511D may be a right side. That is, the first and second sides 511A and 511B may be opposite and parallel to each other, and the third and fourth sides 511C and 511D may be opposite and parallel to each other. Each of the first and second sides 511A and 511B may be adjacent the third side 511C and/or the fourth side 511D to be vertical/perpendicular to the third side 511C and/or the fourth side 511D. For brevity, the first through fourth sides 511A to 511D may be referred to as first through fourth outer sides 511A to 511D, respectively.

The lower semiconductor device 560 may include a logic device, such as a microprocessor (MP). Lower chip connection elements may be disposed between the lower semiconductor device 560 and the package substrate 510. In other words, the lower chip connection elements may be disposed on the package substrate 510 in regions where the lower semiconductor device 560 overlaps the package substrate 510.

Each of the first through fourth upper semiconductor devices 565A to 565D may be disposed near the corresponding one of the first through fourth outer sides 511A to 511D on the lower semiconductor device 560. The first and second upper semiconductor devices 565A and 565B may be opposite and parallel to each other, and the third and fourth upper semiconductor devices 565C and 565D may be opposite and parallel to each other. Each of the first through fourth upper semiconductor devices 565A to 565D may include a memory device, such as a DRAM, an MRAM, a PRAM, an RRAM, or a flash memory. The first through fourth upper semiconductor devices 565A to 565D may be understood with further reference to, for example, FIGS. 1L(A) and (B).

Each of the first through fourth upper chip connection elements 550A to 550D may electrically connect the corresponding one of the first through fourth upper semiconductor devices 565A to 565D with the package substrate 510. Each of the first through fourth upper chip connection elements 550A to 550D may be disposed near the corresponding one of the first through fourth sides 511A to 511D.

Board bumps 599 to be electrically connected to an electronic circuit substrate, such as a mother board or a system board, may be formed under the package substrate 510. The board bumps 599 may include a metal, such as Cu, Ni, Ag, or a solder.

Figure 5B:
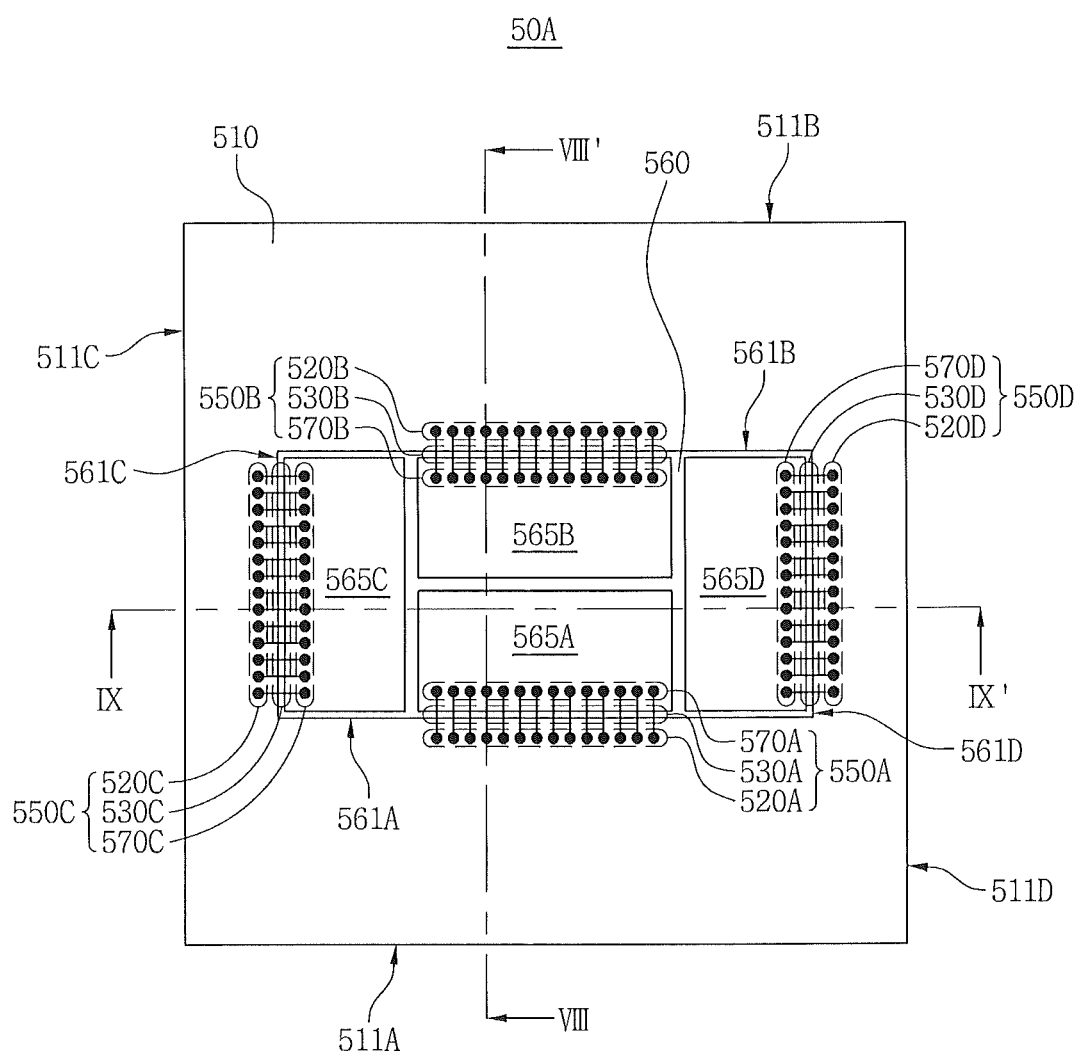
FIG. 5B is a schematic top view of the semiconductor package of FIG. 5A according to various embodiments.

FIG. 5B is a schematic top view of the semiconductor package 50A of FIG. 5A. FIGS. 5A and 5B illustrate that an area of a top surface of the lower semiconductor device 560 is equal to or similar to the sum of areas occupied by the first through fourth upper semiconductor devices 565A to 565D. FIG. 5B exemplarily illustrates that the area of the top surface of the lower semiconductor device 560 is greater than the sum of the areas occupied by the first through fourth upper semiconductor devices 565A to 565D.

Referring to FIG. 5B, the semiconductor package 50A according to various embodiments of the inventive concept may include the lower semiconductor device 560 mounted on the package substrate 510, the first through fourth upper semiconductor devices 565A to 565D disposed in a side-by-side manner on the lower semiconductor device 560, and the first through fourth upper chip connection elements 550A to 550D respectively disposed near the first through fourth outer sides 511A to 511D.

The lower semiconductor device 560 may have first through fourth sides 561A to 561D corresponding respectively to the first through fourth outer sides 511A to 511D of the package substrate 510. For brevity, the first through fourth sides 561A to 561D may be referred to as first through fourth inner sides 561A to 561D, respectively.

The first through fourth upper chip connection elements 550A to 550D may include first through fourth chip pads 570A to 570D, first through fourth substrate pads 520A to 520D, and first through fourth wires 530A to 530D, respectively. The first through fourth chip pads 570A to 570D may include bonding pads for I/O operations of the first through fourth upper semiconductor devices 565A to 565D. The first through fourth substrate pads 520A to 520D may be interpreted as first through fourth bonding lands or bonding fingers.

The first through fourth wires 530A to 530D may electrically connect the first through fourth chip pads 570A to 570D with the first through fourth substrate pads 520A to 520D, respectively. The first through fourth upper semiconductor devices 565A to 565D may be understood in further detail with reference to, for example, FIGS. 1D and 1E, and the lower semiconductor device 560 may be understood with reference to, for example, FIGS. 1I and 1J.

Each of the first through fourth upper chip connection elements 550A to 550D may be disposed near the corresponding one of the first through fourth inner sides 561A to 561D.

The first through fourth upper chip connection elements 550A to 550D may be disposed in the same (or a similar) manner as described with reference to FIG. 1C according to various embodiments of the inventive concept.

Figure 5C:
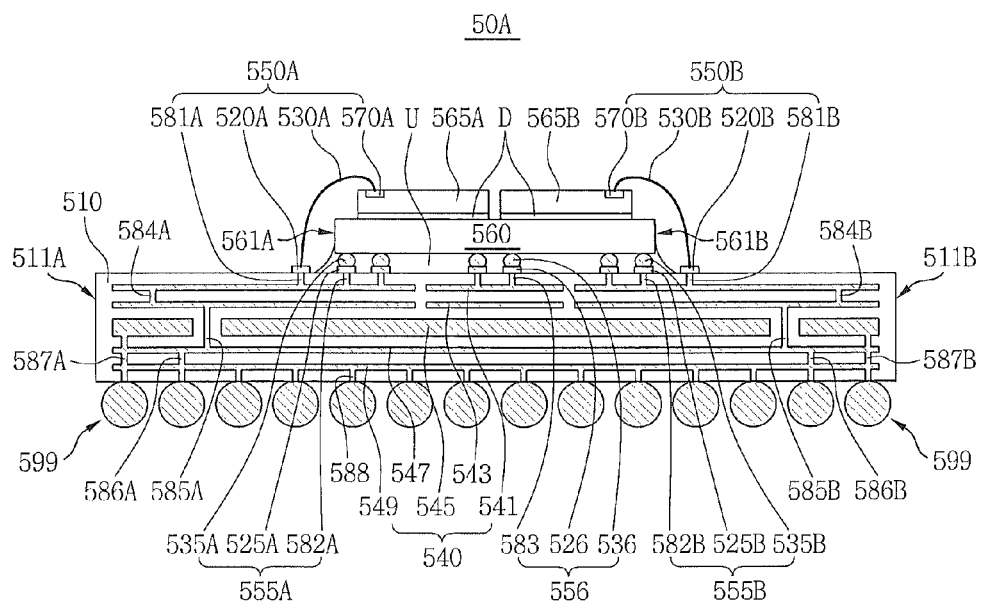
FIGS. 5C and 5D are conceptual longitudinal sectional views or side views taken along directions VIII-VIII' and IX-IX' of FIG. 5B according to various embodiments.
Figure 5D:
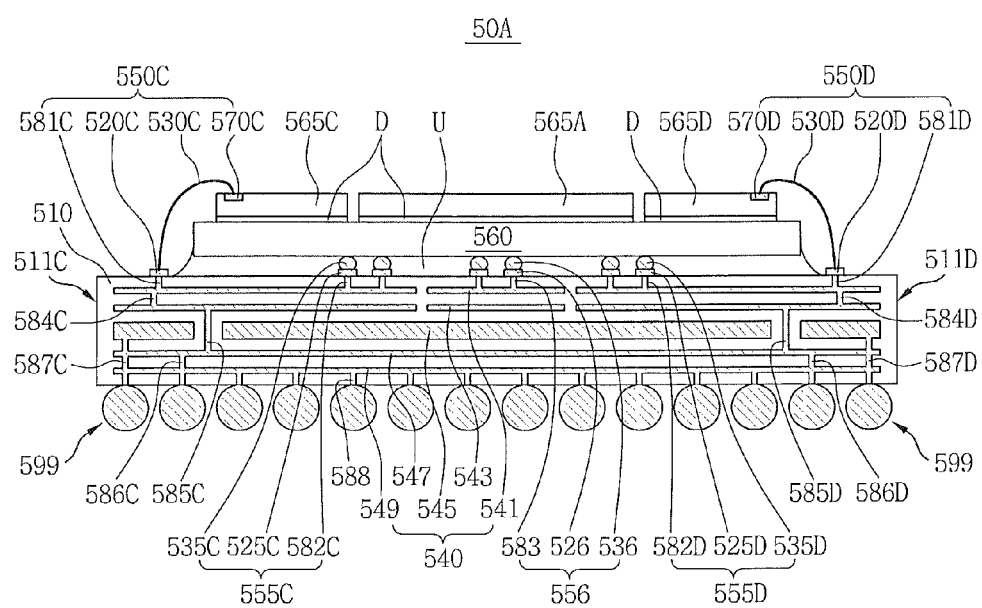

FIG. 5C is a conceptual longitudinal sectional view of the semiconductor package 50A, which is taken along a direction VIII-VIII' of FIG. 5B, and FIG. 5D is a conceptual longitudinal sectional view of the semiconductor package 50A, which is taken along a direction IX-IX' of FIG. 5B. Referring to FIGS. 5C and 5D, the semiconductor package 50A may include the lower semiconductor device 560 mounted on the package substrate 510, the first through fourth upper semiconductor devices 565A to 565D disposed on the lower semiconductor device 560, the first through fourth upper chip connection elements 550A to 550D configured to electrically connect the first through fourth semiconductor devices 565A to 565D with the package substrate 510, and first through fourth lower chip connection elements 555A to 555D configured to electrically connect the lower semiconductor device 560 and the package substrate 510.

Each of the first through fourth chip pads 570A to 570D may be formed on the corresponding one of the first through fourth upper semiconductor devices 565A to 565D. The first through fourth substrate pads 520A to 520D may be formed on a top surface of the package substrate 510. The first through fourth substrate pads 520A to 520D may have top surfaces planar with or leveled lower than the top surface of the package substrate 510. The first through fourth wires 530A to 530D may electrically connect the first through fourth chip pads 570A to 570D with the first through fourth substrate pads 520A to 520D, respectively. The first through fourth chip pads 570A to 570D may include bonding pads for I/O operations of the first through fourth upper semiconductor devices 565A to 565D. The first through fourth substrate pads 520A to 520D may be interpreted as first through fourth bonding lands or bond fingers.

The first through fourth lower chip connection elements 555A to 555D may overlap the lower semiconductor device 560. Each of the first through fourth lower chip connection elements 555A to 555D may be disposed near the corresponding one of the first through fourth inner sides 561A to 561D of the lower semiconductor device 560. The first through fourth lower chip connection elements 555A to 555D may include first through fourth lower chip bumps 535A to 535D and first through fourth lower chip bump lands 525A to 525D, respectively. The first through fourth lower chip bumps 535A to 535D may include a metal, such as Cu, Ni, Ag, or a solder, to perform a flip-chip bonding process.

The package substrate 510 may include a core layer 545, an uppermost metal interconnection layer 541, an upper metal interconnection layer 543, a lower metal interconnection layer 547, and a lowermost metal interconnection layer 549. The core layer 545 may include a metal. The core layer 545 may be thicker than the uppermost metal interconnection layer 541, the upper metal interconnection layer 543, the lower metal interconnection layer 547, and the lowermost metal interconnection layer 549. The core layer 545 and a plurality of metal interconnection layers 541, 543, 547, and 549 of the package substrate 510 may be understood in further detail with reference to, for example, FIG. 1I.

The package substrate 510 may include various vias 581A to 581D, 582A to 582D, 583, 584A to 584D, 585A to 585D, 586A to 586D, 587A to 587D, and 588. As described herein, the package substrate 510 may include first through fourth upper chip-connecting uppermost vias 581A to 581D configured to electrically connect the first through fourth upper semiconductor devices 565A to 565D with the uppermost metal interconnection layer 541 and first through fourth lower chip-connecting uppermost vias 582A to 582D configured to electrically connect the lower semiconductor device 560 with the uppermost metal interconnection layer 541. The first through fourth upper chip-connecting uppermost vias 581A to 581D may be portions of the first through fourth substrate pads 520A to 520D, respectively, and the first through fourth lower chip-connecting uppermost vias 582A to 582D may be portions of the first through fourth lower chip bump lands 525A to 525D, respectively. Thus, each of the first through fourth upper chip-connecting uppermost vias 581A to 581D may be included in the corresponding one of the first through fourth upper chip connection elements 550A to 550D, while each of the first through fourth lower chip-connecting uppermost vias 582A to 582D may be included in the corresponding one of the first through fourth lower chip connection elements 555A to 555D.

The package substrate 510 may further include fifth lower chip-connecting uppermost vias 583 configured to electrically connect the fifth lower chip bump lands 526 with the core layer 545 or the metal interconnection layers 541, 543, 547, and 549. Thus, the fifth lower chip bump lands 526 may be included in fifth lower chip connection elements 556.

The first through fourth upper chip connection elements 550A to 550D may be electrically connected to the first through fourth lower chip connection elements 555A to 555D using the metal interconnection layers 541, 543, 545, 547, and 549 of the package substrate 510. In particular, the first through fourth upper chip connection elements 550A to 550D may be electrically connected to the first through fourth lower chip connection elements 555A to 555D using the uppermost metal interconnection layer 541 or the upper metal interconnection layer 543 of the package substrate 510. Thus, the uppermost metal interconnection layer 541 may mainly/primarily transmit electrical signals between the first through fourth upper semiconductor devices 565A to 565D and the lower semiconductor device 560. The electrical signals transmitted between the first through fourth upper semiconductor devices 565A to 565D and the lower semiconductor device 560 may include data signals and address/control signals.

In addition, functions of the various vias 584A to 584D, 585A to 585D, 586A to 586D, 587A to 587D, and 588 may be understood with reference to, for example, FIGS. 1D and 1E. To avoid complexity of the drawings, lands for the board bumps 599 may be omitted. Alternatively, the lands for the board bumps 599 may be portions of the lowermost vias 588. An under-fill material U may be filled between the package substrate 510 and the lower semiconductor device 560.

Each of the uppermost metal interconnection layer 541 and the upper metal interconnection layer 543 may be used as a signal transmission interconnection or a ground plane. For instance, when the uppermost metal interconnection layer 541 is mainly/primarily used as a signal transmission interconnection, the uppermost metal interconnection layer 543 may be mainly/primarily used as a ground plane. Conversely, the uppermost metal interconnection layer 541 may be mainly/primarily used as a ground plane, and the upper metal interconnection layer 543 may be mainly/primarily used as a signal transmission interconnection. Also, each of the lower metal interconnection layer 547 and the lowermost metal interconnection layer 549 may be used as a signal transmission interconnection or ground plane. For example, when the lower metal interconnection layer 547 is mainly/primarily used as a signal transmission interconnection, the lowermost metal interconnection layer 549 may be mainly/primarily used as a ground plane. Conversely, the lower metal interconnection layer 547 may be mainly/primarily used as a ground plane, and the lowermost metal interconnection layer 549 may be mainly/primarily used as a signal transmission interconnection. Each of the uppermost metal interconnection layer 541 and the lowermost metal interconnection layer 549 may be used as a land.

Figure 5E:
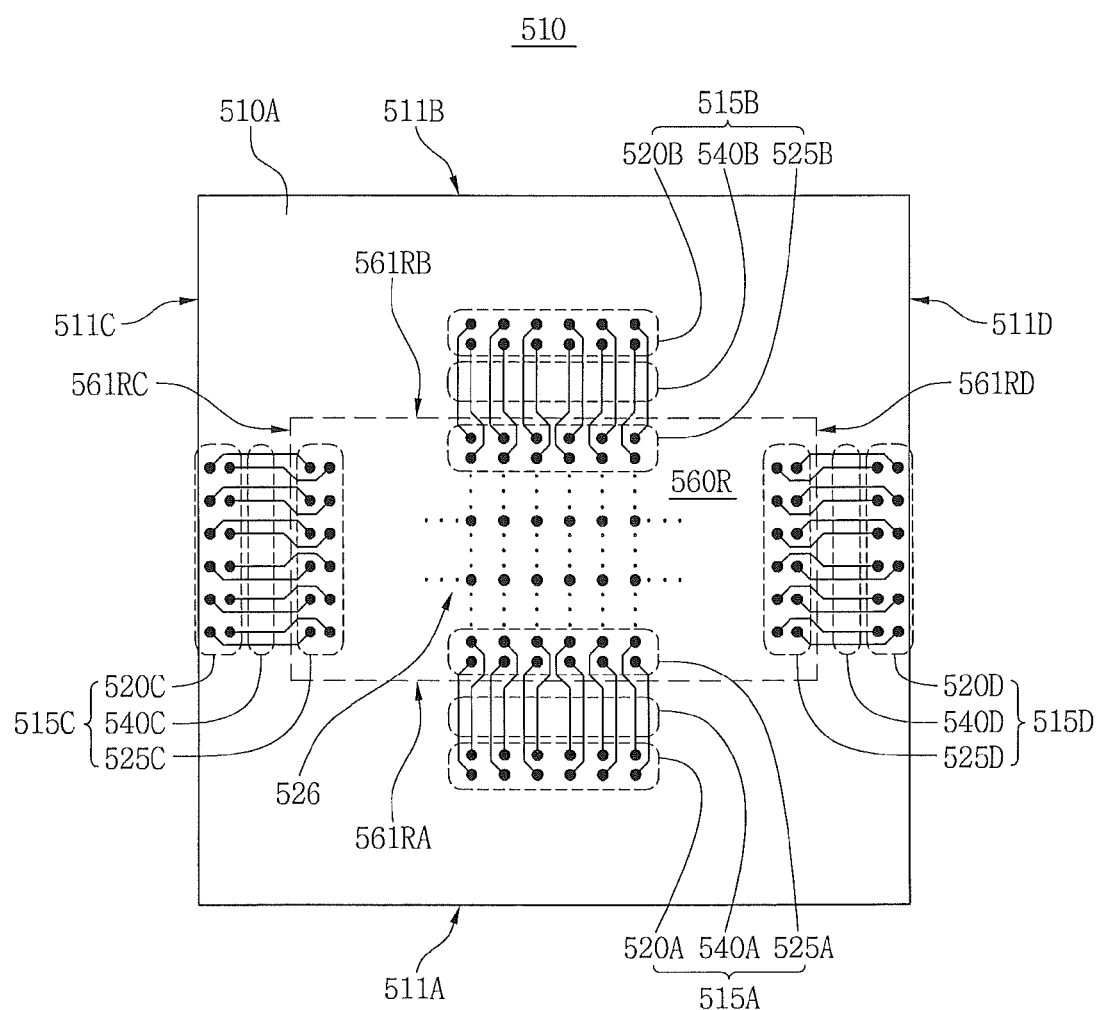
FIG. 5E is a conceptual top view illustrating routing concepts of a package substrate of FIGS. 5A through 5D according to various embodiments.

FIG. 5E is a conceptual top view illustrating routing concepts of the package substrate 510 of FIGS. 5A through 5D. Referring to FIG. 5E, the package substrate 510 may include first through fourth interconnection elements 515A to 515D, each of which is disposed near the corresponding one of the outer sides 511A to 511D of the package substrate 510. The first through fourth interconnection elements 515A to 515D may include the first through fourth substrate pads 520A to 520D, the first through fourth lower chip bump lands 525A to 525D, and first through fourth substrate interconnections 540A to 540D, respectively. The first through fourth substrate interconnections 540A to 540D may electrically connect the first through fourth substrate pads 520A to 520D with the first through fourth lower chip bump lands 525A to 525D, respectively. The first through fourth substrate interconnections 540A to 540D may include the plurality of metal interconnection layers 541, 543, 547, and 549 and/or the core layer 545 of FIGS. 5C and 5D. In particular, the first through fourth substrate interconnections 540A to 540D may include the uppermost metal interconnection layer 541 of FIGS. 5C and 5D. Alternatively, it will be understood that the first through fourth substrate interconnections 540A to 540D may be included in the uppermost metal interconnection layer 541. Each of the first through fourth lower chip bump lands 525A to 525D may be disposed near the corresponding one of the first through fourth sides 561RA to 561RD of the lower semiconductor device 560. The semiconductor package 50A of FIGS. 5C and 5D according to various embodiments of the inventive concept may be arranged according to various embodiments of the inventive concept described with reference to, for example, FIGS. 1F and/or 1M.

The semiconductor package 50A according to various embodiments of the inventive concept may include at least four channels. The four channels may include the first through fourth lower chip connection elements 555A to 555D disposed near the first through fourth sides of the package substrate 510, the first through fourth interconnection elements 515A to 515D, and the first through fourth upper chip connection elements 550A to 550D, respectively. Respective elements may be duplicated according to circumstances.

The first through fourth interconnection elements 515A to 515D may be disposed according to various embodiments of the inventive concept described with reference to, for example, FIGS. 1K and 1J.

Figure 6A:
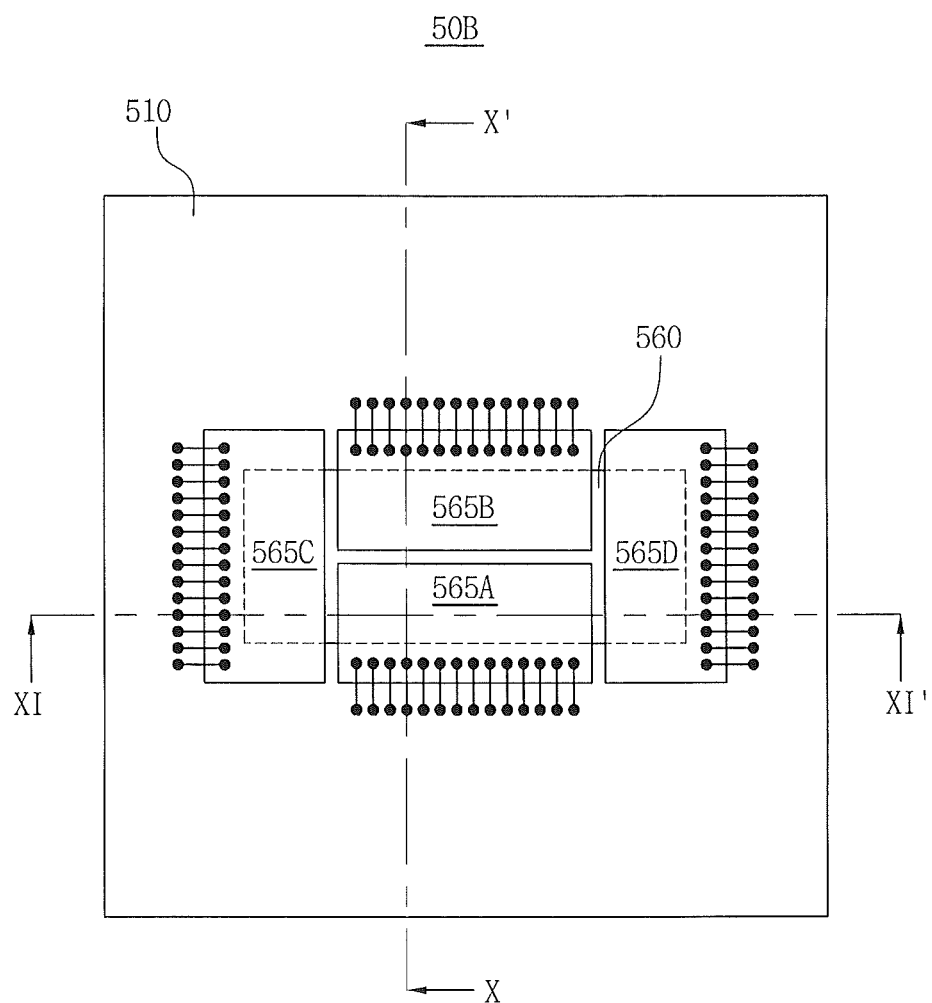
FIG. 6A is a top view of a semiconductor package according to various embodiments.
Figure 6B:
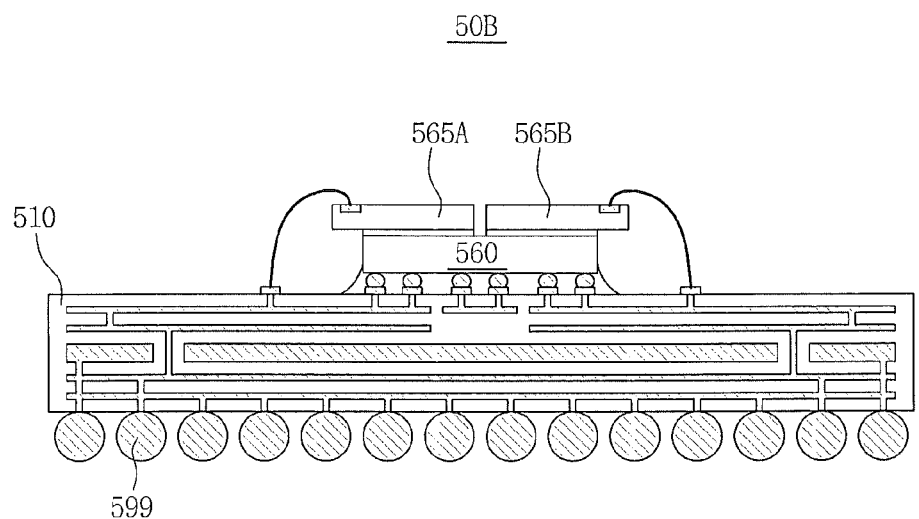
FIGS. 6B and 6C are conceptual longitudinal sectional views or side views taken along directions X-X' and XI-XI' of FIG. 6A according to various embodiments.
Figure 6C:
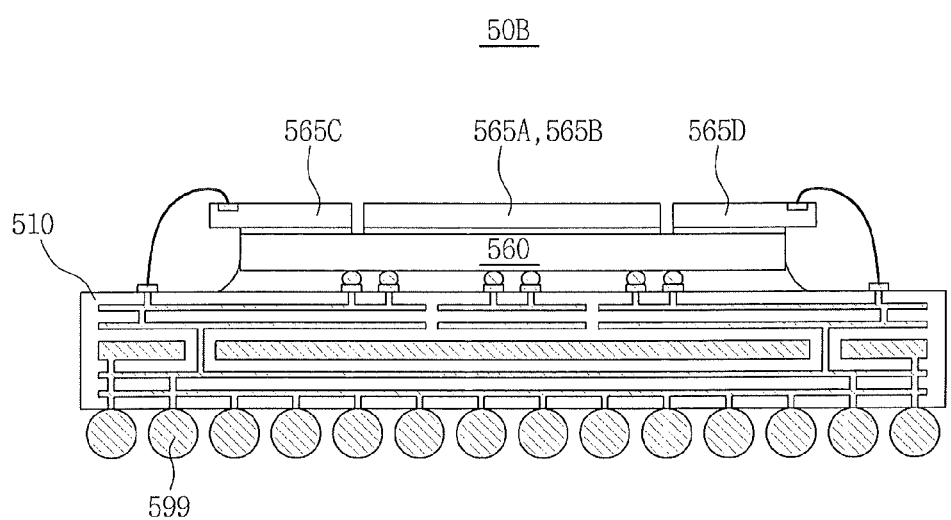

FIG. 6A is a top view of a semiconductor package 50B according to various embodiments of the inventive concept, and FIGS. 6B and 6C are conceptual longitudinal sectional views or side views taken along directions X-X' and XI-XI' of FIG. 6A. FIGS. 6A through 6C may be understood in further detail as compared with FIGS. 5B through 5D. Referring to FIGS. 6A through 6C, a semiconductor package 50B according to various embodiments may include a lower semiconductor device 560 mounted on a package substrate 510 and first through fourth upper semiconductor devices 565A to 565D stacked in overhang shapes on the lower semiconductor device 560. An overhang shape may refer to a shape of each of the lateral surfaces of the first through fourth upper semiconductor devices 565A to 565D, where the shape protrudes outward from the corresponding one of lateral surfaces of the lower semiconductor device 560. In other words, portions of the first through fourth upper semiconductor devices 565A to 565D extend/hang beyond/over the perimeter of the lower semiconductor device 560. A stack structure of the semiconductor devices 560 and 565A to 565D according to various embodiments may be effectively applied when an area of a top surface of the lower semiconductor device 560 is smaller than an area occupied by the first through fourth upper semiconductor devices 565A to 565D. Some elements in FIGS. 6A-6C may be understood with reference to FIGS. 5A through 5E. Moreover, referring to FIG. 6A, the lower semiconductor device 560 is illustrated with a dotted line because the lower semiconductor device 560 is shielded/covered by the first through fourth upper semiconductor devices 565A to 565D and thus unseen in implementation.

Figure 7A:
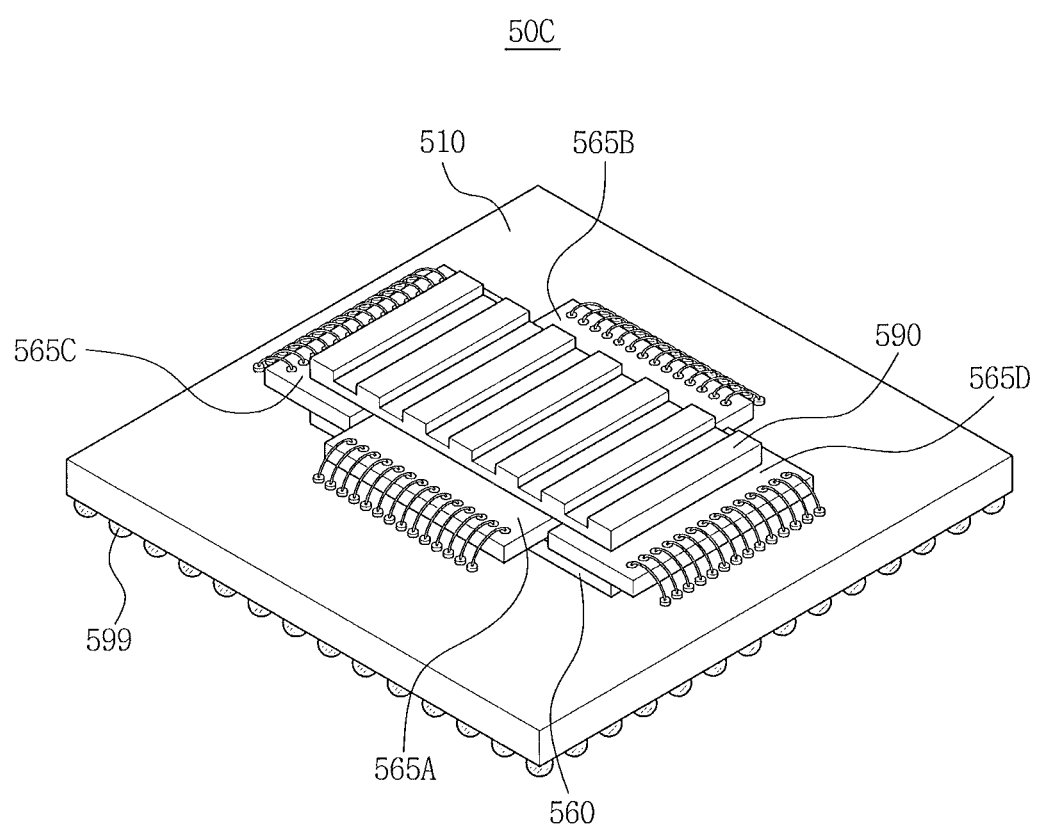
FIGS. 7A and 7B are respectively conceptual perspective and top views of a semiconductor package according to various embodiments.
Figure 7B:
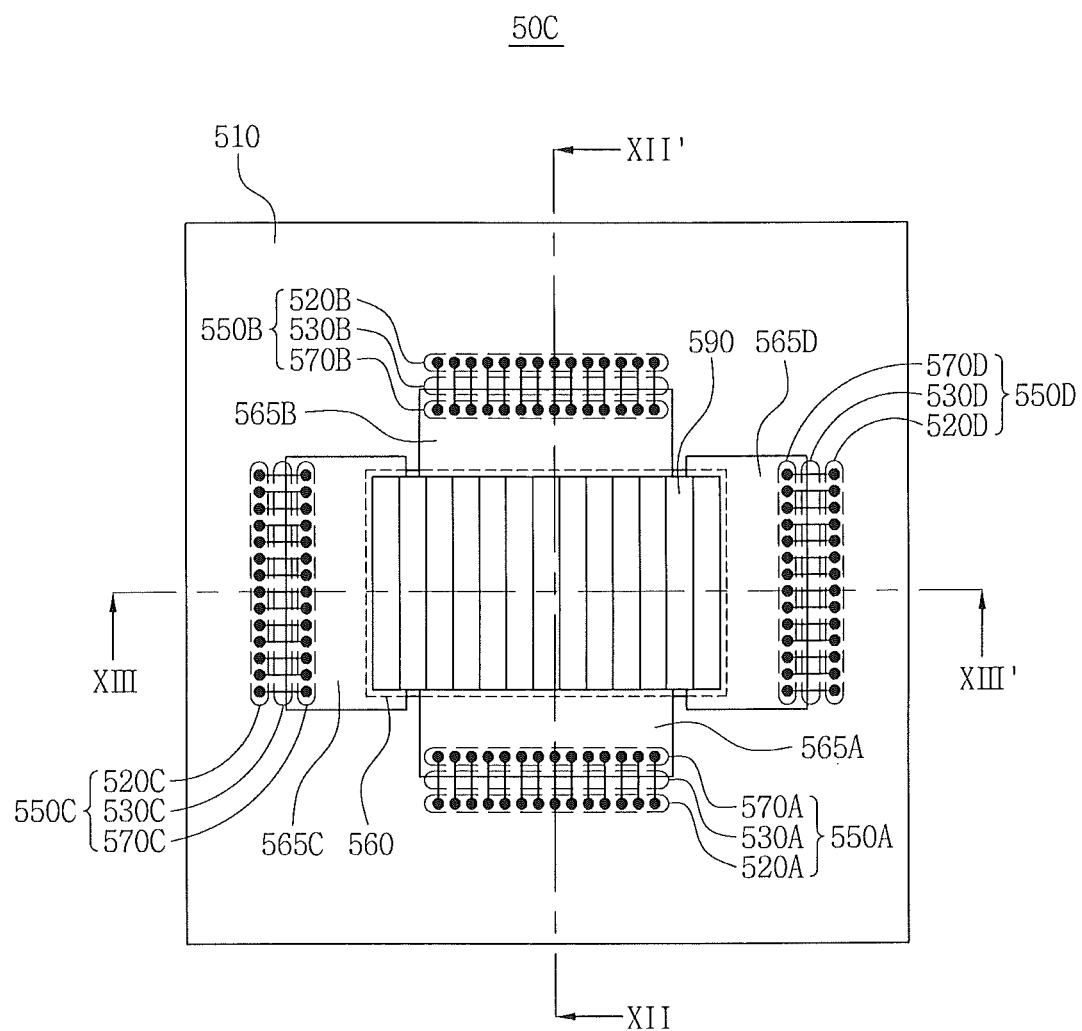

FIGS. 7A and 7B are respectively conceptual perspective and top views of a semiconductor package 50C according to various embodiments of the inventive concept. Referring to FIGS. 7A and 7B, the semiconductor package 50C according to various embodiments may include a lower semiconductor device 560 mounted on a package substrate 510, first through fourth upper semiconductor devices 565A to 565D disposed on the lower semiconductor device 560, and a heat sink 590. For example, the first through fourth upper semiconductor devices 565A to 565D may be disposed to expose (e.g., leave uncovered) a portion of a top surface of the lower semiconductor device 560, and the heat sink 590 may be disposed on the exposed/uncovered top surface of the lower semiconductor device 560. The heat sink 590 may have a washboard shape, a fin shape, a grating shape, or various other shapes. For brevity, FIGS. 7A and 7B illustrate the heat sink 590 having a washboard or small fin shape. Alternatively, the heat sink 590 may be replaced by a fan. The heat sink 590 may be in direct contact with a portion of the top surface of the lower semiconductor device 560. The heat sink 590 may be formed of a highly thermally conductive material (e.g., a metal such as Al). Referring now to FIG. 7B, the heat sink 590 may not cover first through fourth upper chip connection elements 550A to 550D. Thus, first through fourth chip pads 570A to 570D may not be covered with the heat sink 590 but rather may be exposed. As a result, the semiconductor package 50C according to various embodiments may have a reduced thickness.

Figure 7C:
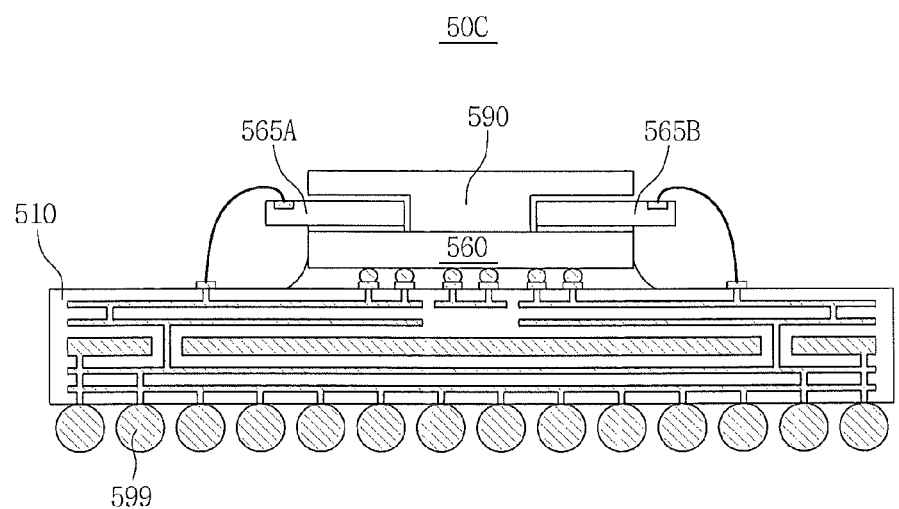
FIGS. 7C and 7D are conceptual longitudinal sectional views taken along directions XII-XII' and XIII-XIII' of FIG. 7B according to various embodiments.
Figure 7D:
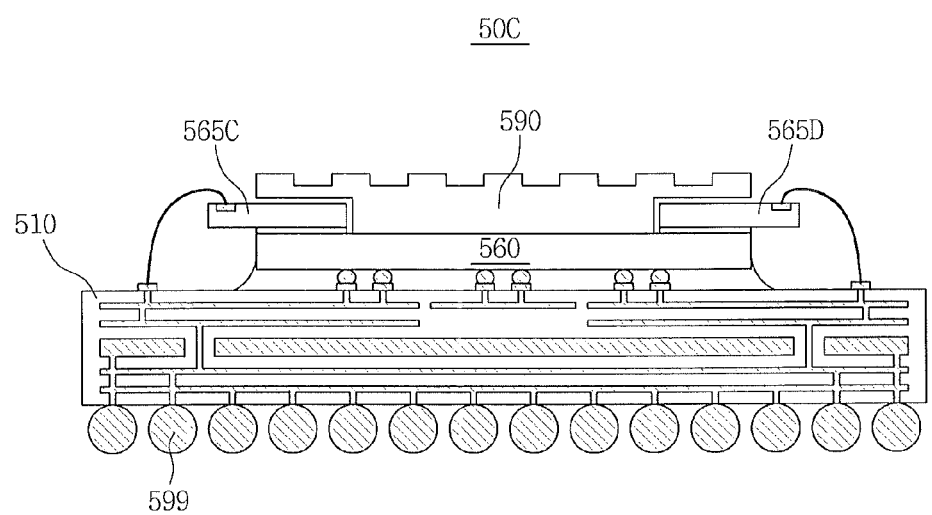

FIGS. 7C and 7D are conceptual longitudinal sectional views of a semiconductor package 50C according to various embodiments of the inventive concept, which are taken along directions XII-XII' and XIII-XIII' of FIG. 7B. Referring to FIGS. 7C and 7D, the semiconductor package 50C according to various embodiments may include a lower semiconductor device 560 mounted on a package substrate 510, first through fourth upper semiconductor devices 565A to 565D disposed in overhang shapes over the lower semiconductor device 560, and a heat sink 590. The first through fourth upper semiconductor devices 565A to 565D may be disposed to expose (e.g., leave uncovered) a central region of the lower semiconductor device 560. The heat sink 590 may be disposed on the exposed/uncovered central region of the lower semiconductor device 560. The heat sink 590 may also have an overhang shape. Thus, the heat sink 590 may partially overlap top surfaces of the first through fourth upper semiconductor devices 565A to 565D.

Figure 8A:
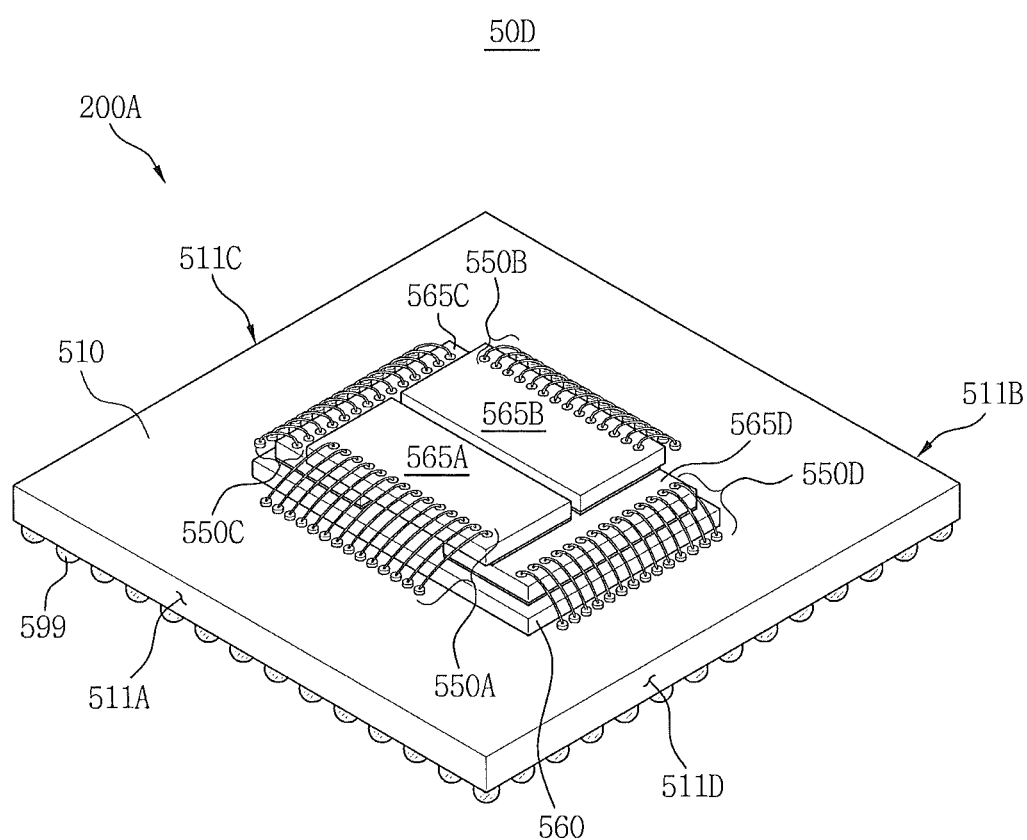
FIGS. 8A and 8B are respectively conceptual perspective and top views of a semiconductor package according to various embodiments.
Figure 8B:
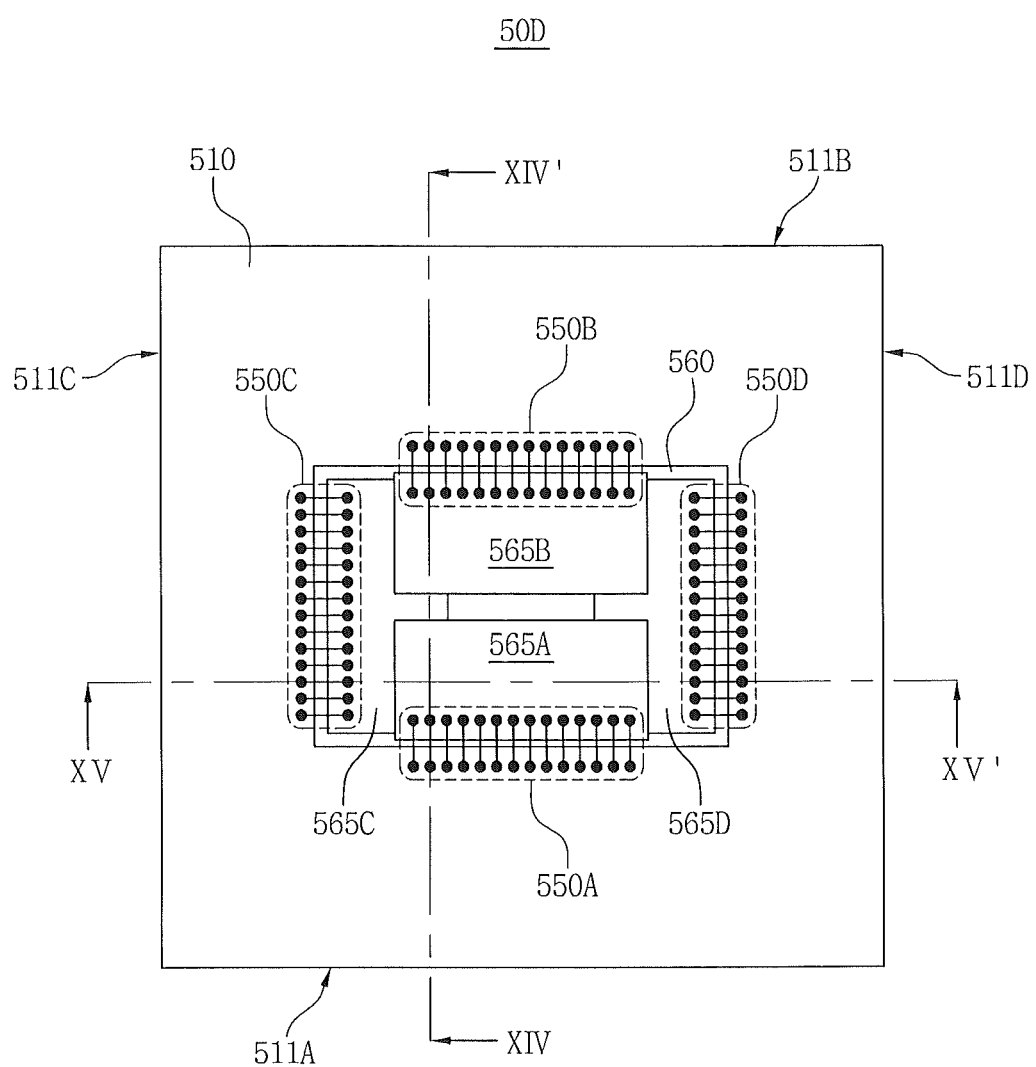

FIGS. 8A and 8B are respectively conceptual perspective and top views of a semiconductor package 50D according to various embodiments of the inventive concept. Referring to FIGS. 8A and 8B, the semiconductor package 50D according to various embodiments of the inventive concept may include a lower semiconductor device 560 mounted on a package substrate 510, and first through fourth upper semiconductor devices 565A to 565D stacked on the lower semiconductor device 560 in a side-by-side manner. For example, the third and fourth upper semiconductor devices 565C and 565D may be disposed on a top surface of the lower semiconductor device 560, and the first and second upper semiconductor devices 565A and 565B may be stacked on the third and fourth upper semiconductor devices 565C and 565D in a side-by-side manner. The first through fourth upper semiconductor devices 565A to 565D may respectively include first through fourth upper chip connection elements 550A to 550D disposed near first through fourth outer sides 511A to 511D of the package substrate 510.

For brevity, FIGS. 8A and 8B exemplarily illustrate that an area of the top surface of the lower semiconductor device 560 is greater than a stacked area of the first through fourth upper semiconductor devices 565A to 565D. Thus, it may be understood that the area of the top surface of the lower semiconductor device 560 may be less than the sum of areas occupied by the first through fourth upper semiconductor devices 565A to 565D.

Figure 8C:
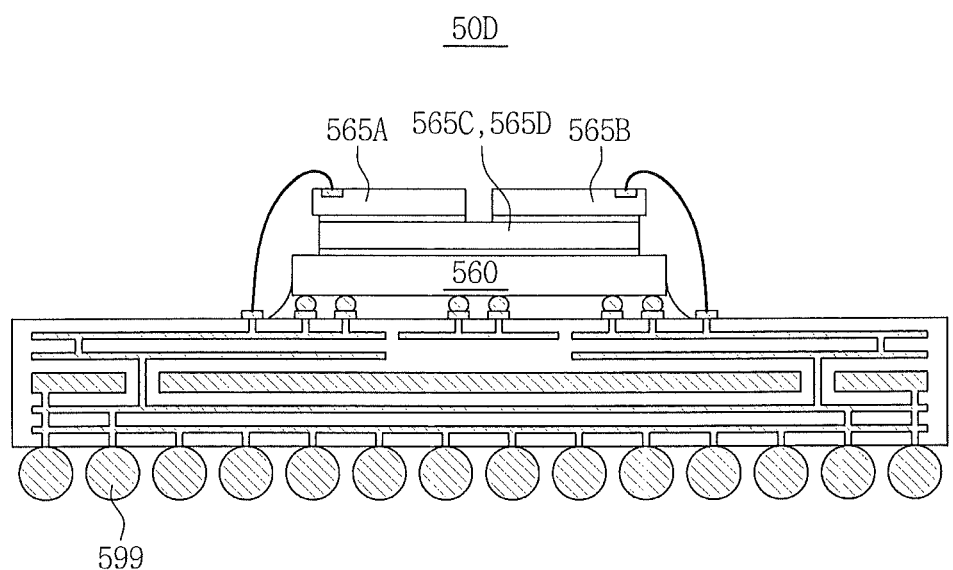
FIGS. 8C and 8D are longitudinal sectional views or side views taken along directions XIV-XIV' and XV-XV' of FIG. 8B according to various embodiments.
Figure 8D:
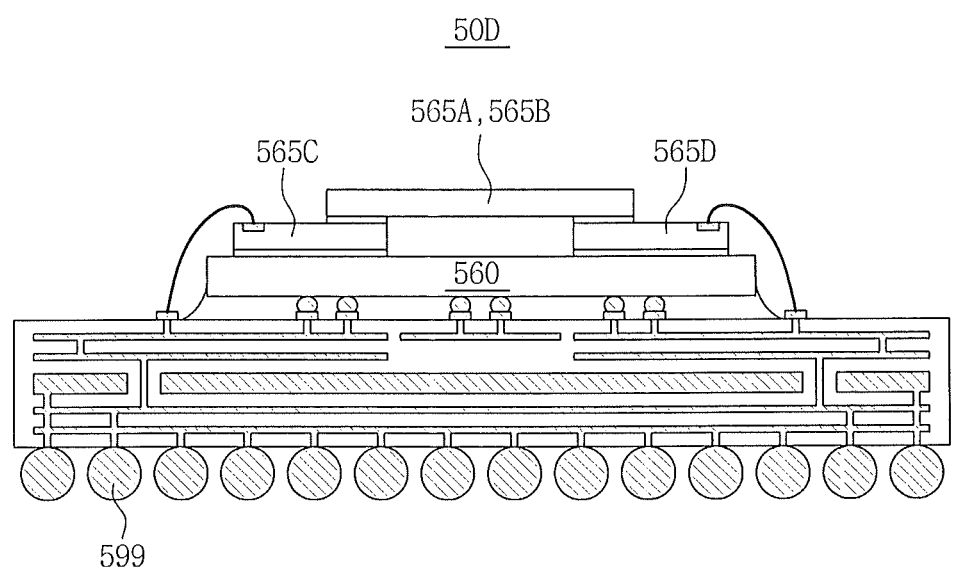

FIGS. 8C and 8D are longitudinal sectional views or side views taken along directions XIV-XIV' and XV-XV' of FIG. 8B. Referring to FIGS. 8C and 8D, a semiconductor package 50D according to various embodiments of the inventive concept may include a lower semiconductor device 560 mounted on a package substrate 510 and first through fourth upper semiconductor devices 565A to 565D stacked on the lower semiconductor device 560 in a side-by-side manner. For example, the third and fourth upper semiconductor devices 565C and 565D may be disposed on the lower semiconductor device 560 in a side-by-side manner, and the first and second upper semiconductor devices 565A and 565B may be stacked on the third and fourth upper semiconductor devices 565C and 565D. The first through fourth upper semiconductor devices 565A to 565D may be disposed within an area of a top surface of the lower semiconductor device 560 (e.g., such that the first through fourth upper semiconductor devices 565A to 565D are absent from at least a portion of the perimeter of the top surface of the lower semiconductor device 560). Alternatively, lateral surfaces of the first through fourth upper semiconductor devices 565A to 565D may be vertically aligned with lateral surfaces of the lower semiconductor device 560. Stacked and disposed shapes of the first through fourth upper semiconductor devices 565A to 565D may be understood with further reference to, for example, FIGS. 2A through 2D. Some elements of the semiconductor package 50D may be understood with reference to various drawings of the present disclosure.

Figure 9A:
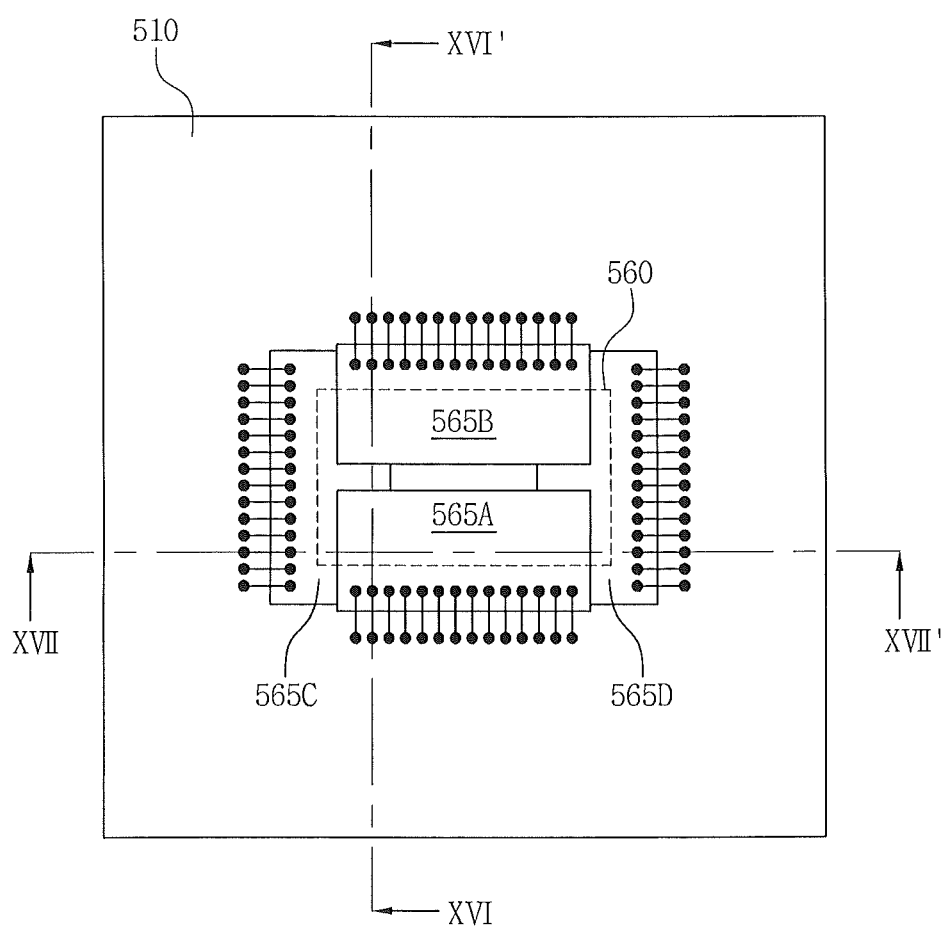
FIG. 9A is a top view of a semiconductor package according to various embodiments.
Figure 9B:
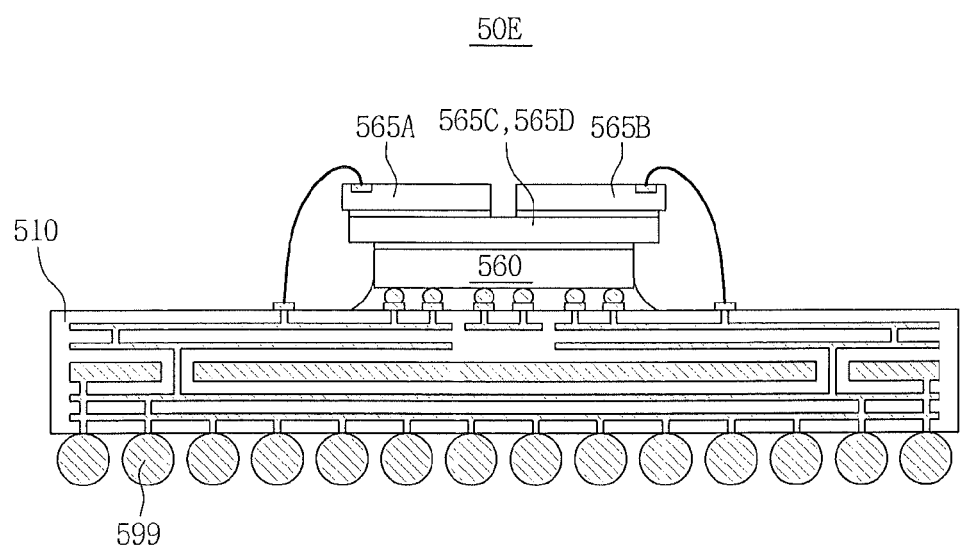
FIGS. 9B and 9C are conceptual longitudinal sectional views or side views taken along directions XVI-XVI' and XVII-XVII' of FIG. 9A according to various embodiments.
Figure 9C:
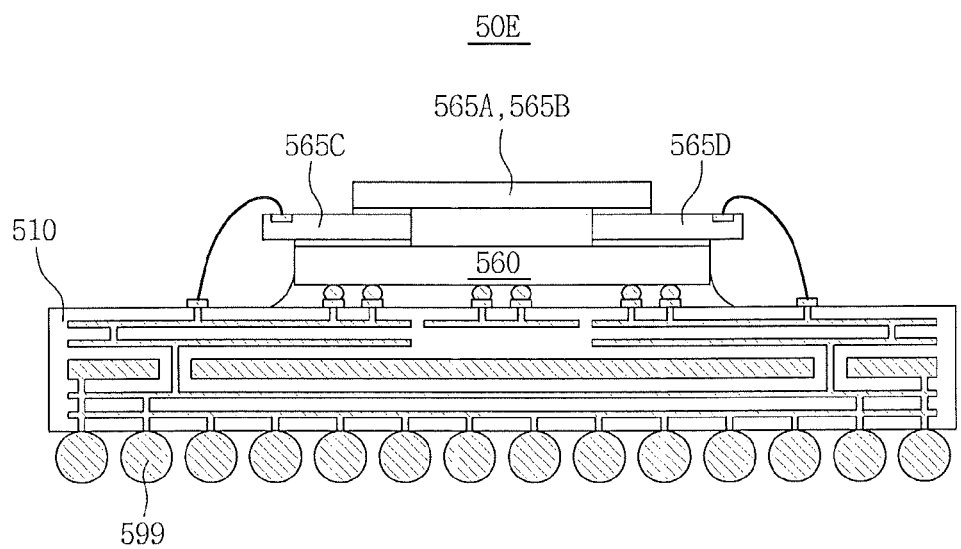

FIG. 9A is a top view of a semiconductor package according to various embodiments of the inventive concept, and FIGS. 9B and 9C are conceptual longitudinal sectional views or side views taken along directions XVI-XVI' and XVII-XVII' of FIG. 9A. FIGS. 9A through 9C may be understood in further detail when compared with FIGS. 8A through 8D. Referring to FIGS. 9A through 9C, a semiconductor package 50E according to various embodiments may include a lower semiconductor device 560 mounted on a package substrate 510 and first through fourth upper semiconductor devices 565A to 565D stacked in overhang shapes on the lower semiconductor device 560. For example, the third and fourth upper semiconductor devices 565C and 565D may be disposed in overhang shapes on the lower semiconductor device 560, and the first and second upper semiconductor devices 565A and 565B may be stacked in overhang shapes on the third and fourth upper semiconductor devices 565C and 565D. A stack structure of the semiconductor devices 560 and 565A to 565D according to various embodiments may be effectively applied when an area of a top surface of the lower semiconductor device 560 is less than an area occupied by the first through fourth upper semiconductor devices 565A to 565D together. Some elements may be understood with reference to various drawings of the present disclosure.

Figure 10A:
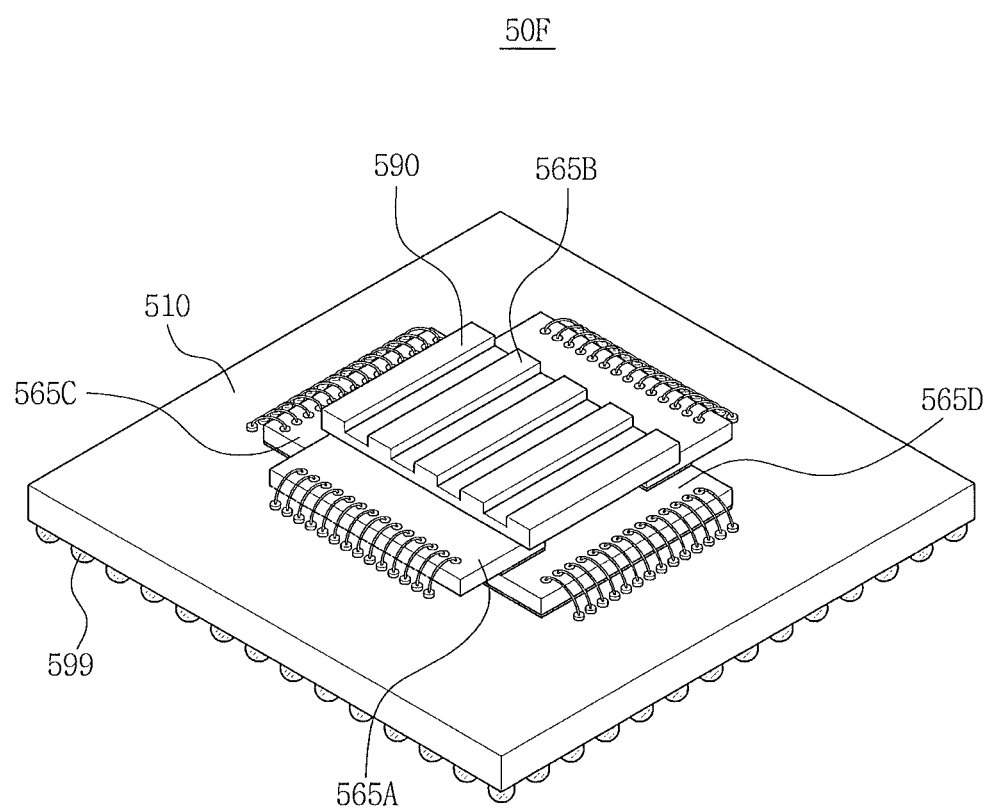
FIGS. 10A and 10B are respectively perspective and top views of a semiconductor package according to various embodiments.
Figure 10B:
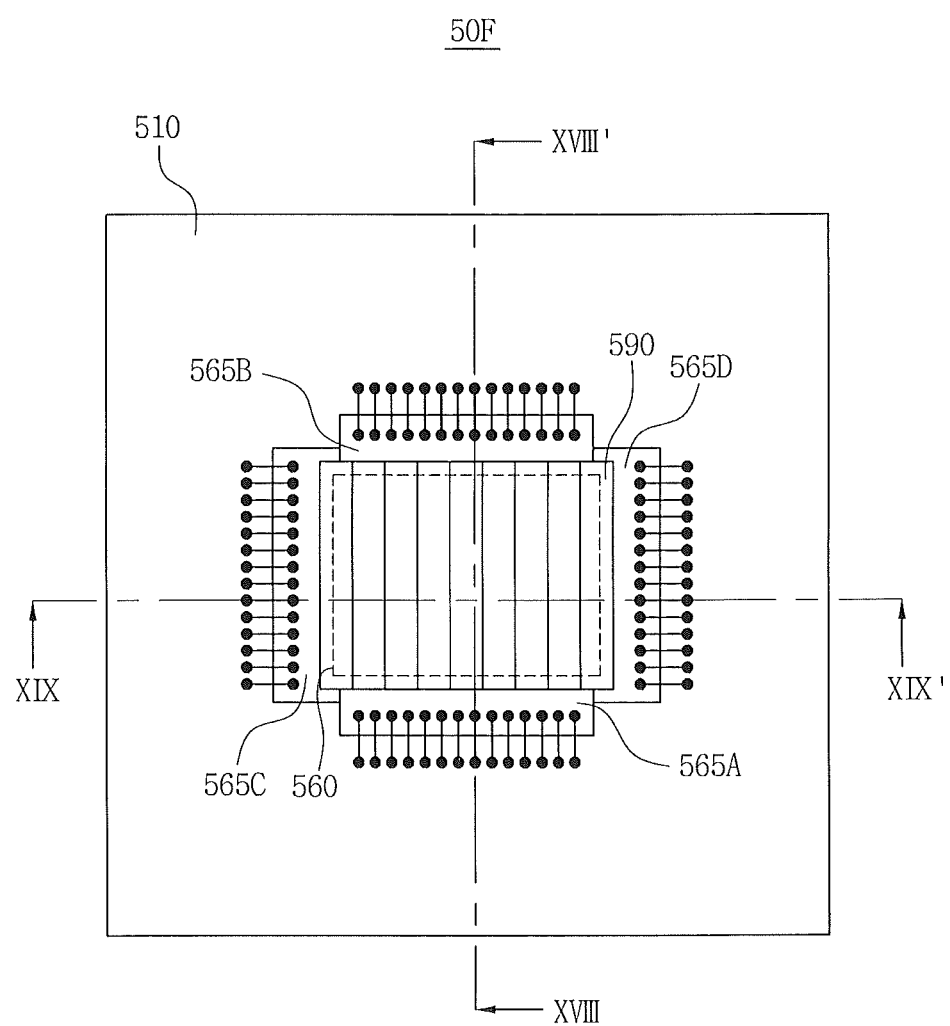

FIGS. 10A and 10B are respectively perspective and top views of a semiconductor package 50F according to various embodiments of the inventive concept. Referring to FIGS. 10A and 10B, the semiconductor package 50F according to various embodiments may include a lower semiconductor device 560 mounted on a package substrate 510, first through fourth upper semiconductor devices 565A to 565D disposed in overhang shapes on the lower semiconductor device 560, and a heat sink 590. In FIGS. 10A and 10B, the lower semiconductor device 560 may be shielded/covered by the first through fourth upper semiconductor devices 565A to 565D and the heat sink 590 and thus may be unseen in implementation. The semiconductor package 50F according to various embodiments may be understood in further detail with reference to the semiconductor package 50C of FIGS. 7A and 7B.

Figure 10C:
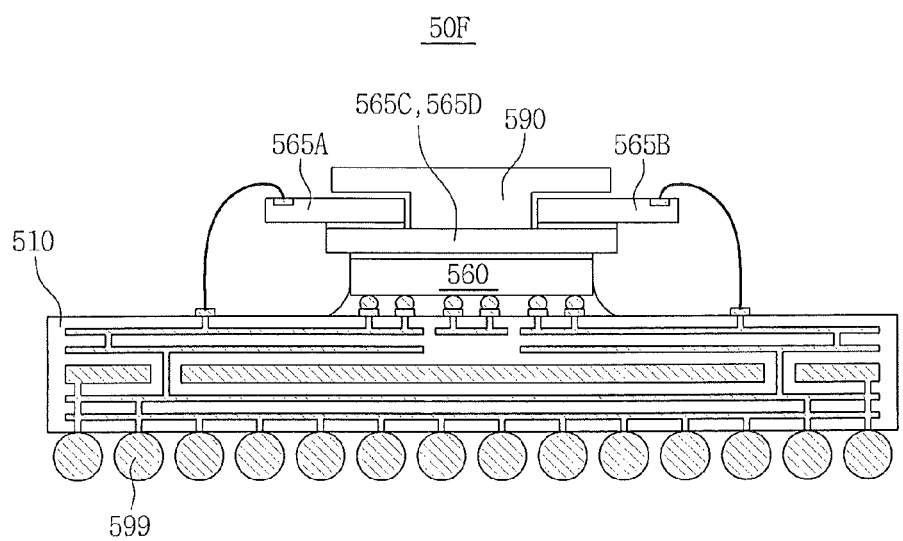
FIGS. 10C and 10D are conceptual longitudinal sectional views taken along directions XVIII-XVIII' and XIX-XIX' of FIG. 10B according to various embodiments.
Figure 10D:
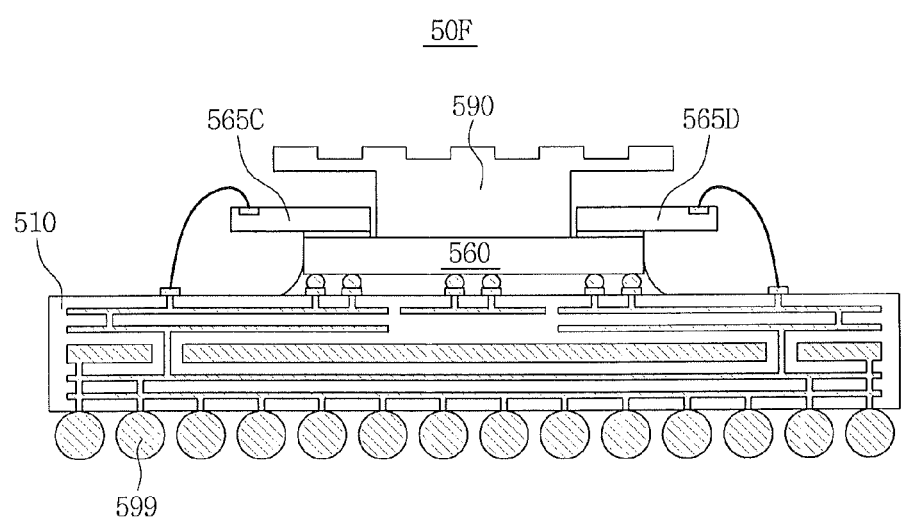

FIGS. 10C and 10D are conceptual longitudinal sectional views of a semiconductor package 50F, which are taken along directions XVIII-XVIII' and XIX-XIX' of FIG. 10B. Referring to FIGS. 10C and 10D, a semiconductor package 50F according to various embodiments may include a lower semiconductor device 560 mounted on a package substrate 510, first through fourth upper semiconductor devices 565A to 565D disposed in overhang shapes over the lower semiconductor device 560, and a heat sink 590. The first through fourth upper semiconductor devices 565A to 565D may be disposed to expose (e.g., leave uncovered) a central region of the lower semiconductor device 560. The heat sink 590 may be disposed on the exposed/uncovered central region of the lower semiconductor device 560. The heat sink 590 may have an overhang shape. For example, the heat sink 590 may partially overlap top surfaces of the first through fourth upper semiconductor devices 565A to 565D.

Figure 11A:
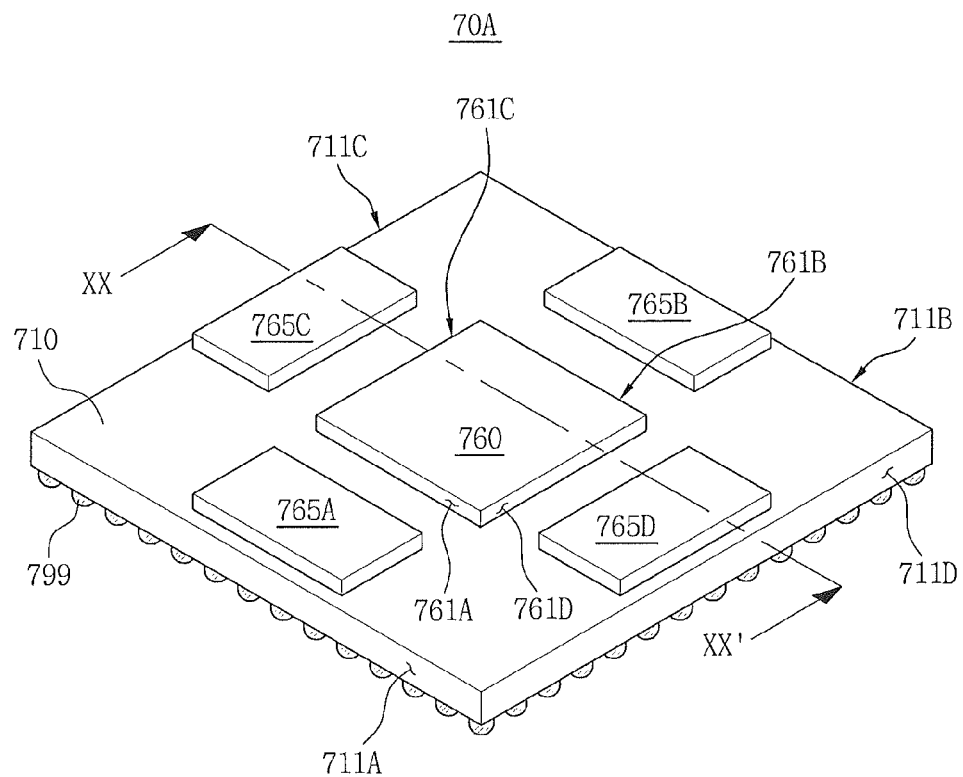
FIG. 11A is a conceptual perspective view of a semiconductor package according to various embodiments.

FIG. 11A is a conceptual perspective view of a semiconductor package 70A according to various embodiments of the inventive concept.

Referring to FIG. 11A, the semiconductor package 70A according to various embodiments of the inventive concept may include a central semiconductor device 760 disposed in a central region of a package substrate 710 and first through fourth peripheral semiconductor devices 765A to 765D disposed in a peripheral region. The package substrate 710 may have first through fourth sides 711A to 711D. Thus, each of the first through fourth peripheral semiconductor devices 765A to 765D may be disposed near the corresponding one of the first through fourth sides 711A to 711D. The first through fourth sides 711A to 711D of the package substrate 710 will be referred to as first through fourth outer sides 711A to 711D, respectively. The central semiconductor device 760 may have first through fourth sides 761A to 761D respectively disposed near the first through fourth outer sides 711A to 711D of the package substrate 710. The first through fourth sides 761A to 761D of the central semiconductor device 760 may be referred to as first through fourth inner sides 761A to 761D, respectively.

The central semiconductor device 760 may be electrically connected to the package substrate 710 using a flip-chip bonding technique. The first through fourth peripheral semiconductor devices 765A to 765D may also be electrically connected to the package substrate 710 using a flip-chip bonding technique. Flip-chip bonding elements may be described with reference to other drawings herein. The central semiconductor device 760 may be a logic device, and the first through fourth peripheral semiconductor devices 765A to 765D may be memory devices. A plurality of board bumps 799 may be disposed under the package substrate 710.

Figure 11B:
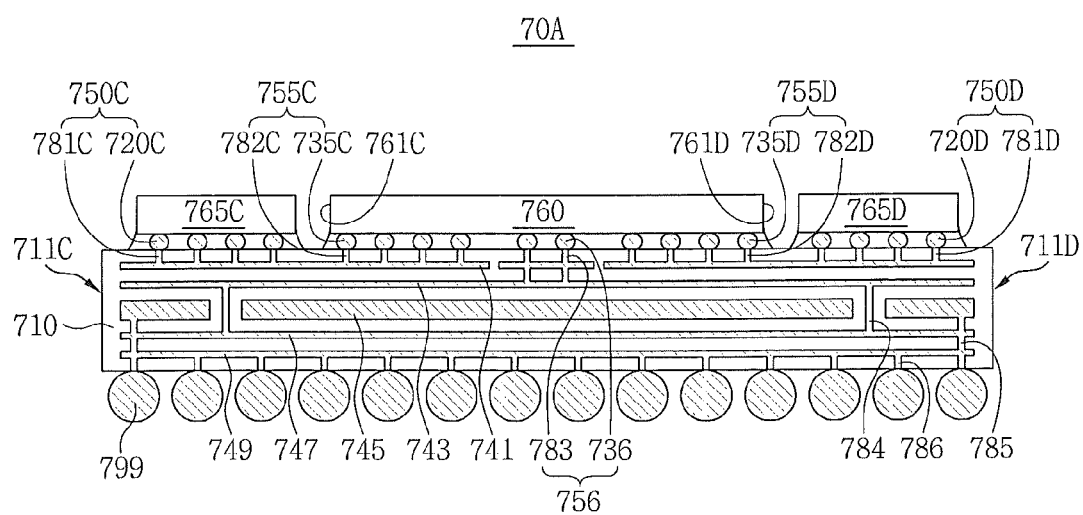
FIG. 11B is a longitudinal sectional or side view taken along a direction XX-XX' of FIG. 11A according to various embodiments.

FIG. 11B is a longitudinal sectional or side view of the semiconductor package 70A, which is taken along a direction XX-XX' of FIG. 11A. Moreover, a longitudinal sectional view or side view of the semiconductor package 70A taken along a direction perpendicular to the direction XX-XX' may be substantially the same or similar to that of FIG. 11B. Referring to FIG. 11B, the semiconductor package 70A according to various embodiments may include the central semiconductor device 760 disposed in the central region of the package substrate 710, and the first through fourth peripheral semiconductor devices 765A to 765D disposed in the peripheral region near the first through fourth outer sides 711A to 711D of the package substrate 710.

The package substrate 710 may include an uppermost metal interconnection layer 741, an upper metal interconnection layer 743, a core layer 745, a lower metal interconnection layer 747, and a lowermost metal interconnection layer 749. A description of the uppermost metal interconnection layer 741, the uppermost metal interconnection layer 743, the core layer 745, the lower metal interconnection layer 747, and the lowermost metal interconnection layer 749 may be fully understood with reference to other drawings herein. Also, the package substrate 710 may include a plurality of vias 784, 785, and 786. A description of the plurality of vias 784, 785, and 786 may be fully understood with reference to other drawings herein.

The central semiconductor device 760 may be electrically connected to the first through fourth peripheral semiconductor devices 765A to 765D through the uppermost metal interconnection layer 741 of the package substrate 710. In addition, the central semiconductor device 760 may be electrically connected to the first through fourth peripheral semiconductor devices 765A to 765D through the uppermost metal interconnection layer 741 and/or the upper metal interconnection layer 743 of the package substrate 710.

The central semiconductor device 760 may include first through fourth central chip connection elements 755A to 755D respectively disposed near the first through fourth inner sides 761A to 761D. The first through fourth central chip connection elements 755A to 755D may include first through fourth central chip bumps 735A to 735D and first through fourth central chip connection bumps 782A to 782D, respectively. The first through fourth central chip bumps 735A to 735D may include a metal, such as Cu, Ni, Ag, or a solder. The first through fourth central chip connection bumps 782A to 782D may include lands or via plugs. Thus, the central semiconductor device 760 may be electrically connected to the uppermost metal interconnection layer 741 through the first through fourth central chip connection elements 755A to 755D (i.e., the first through fourth central chip bumps 735A to 735D and the first through fourth central chip connection bumps 782A to 782D).

The central semiconductor device 760 may further include fifth central chip connection elements 756, which may not be electrically connected to the first through fourth peripheral semiconductor devices 765A to 765D. The fifth central chip connection elements 756 may include fifth central chip bumps 736 and fifth central chip connection bumps 783.

The first through fourth peripheral semiconductor devices 765A to 765D may include first through fourth peripheral chip connection elements 750A to 750D, respectively. The first through fourth peripheral chip connection elements 750A to 750D may include first through fourth peripheral chip bumps 720A to 720D and first through fourth peripheral chip connection bumps 781A to 781D, respectively. The first through fourth peripheral chip bumps 720A to 720D may include a metal, such as Cu, Ni, Ag, or a solder. The first through fourth peripheral chip connection bumps 781A to 781D may include lands or via plugs. Thus, the first through fourth peripheral semiconductor devices 765A to 765D may be electrically connected to the uppermost metal interconnection layer 741 through the first through fourth peripheral chip connection elements 750A to 750D (i.e., the first through fourth peripheral chip bumps 720A to 720D and the first through fourth peripheral chip connection bumps 781A to 781D).

In various embodiments of the inventive concept, each of the first through fourth central chip connection elements 755A to 755D may be electrically connected to the corresponding one of the first through fourth peripheral chip connection elements 750A to 750D.

Figure 11C:
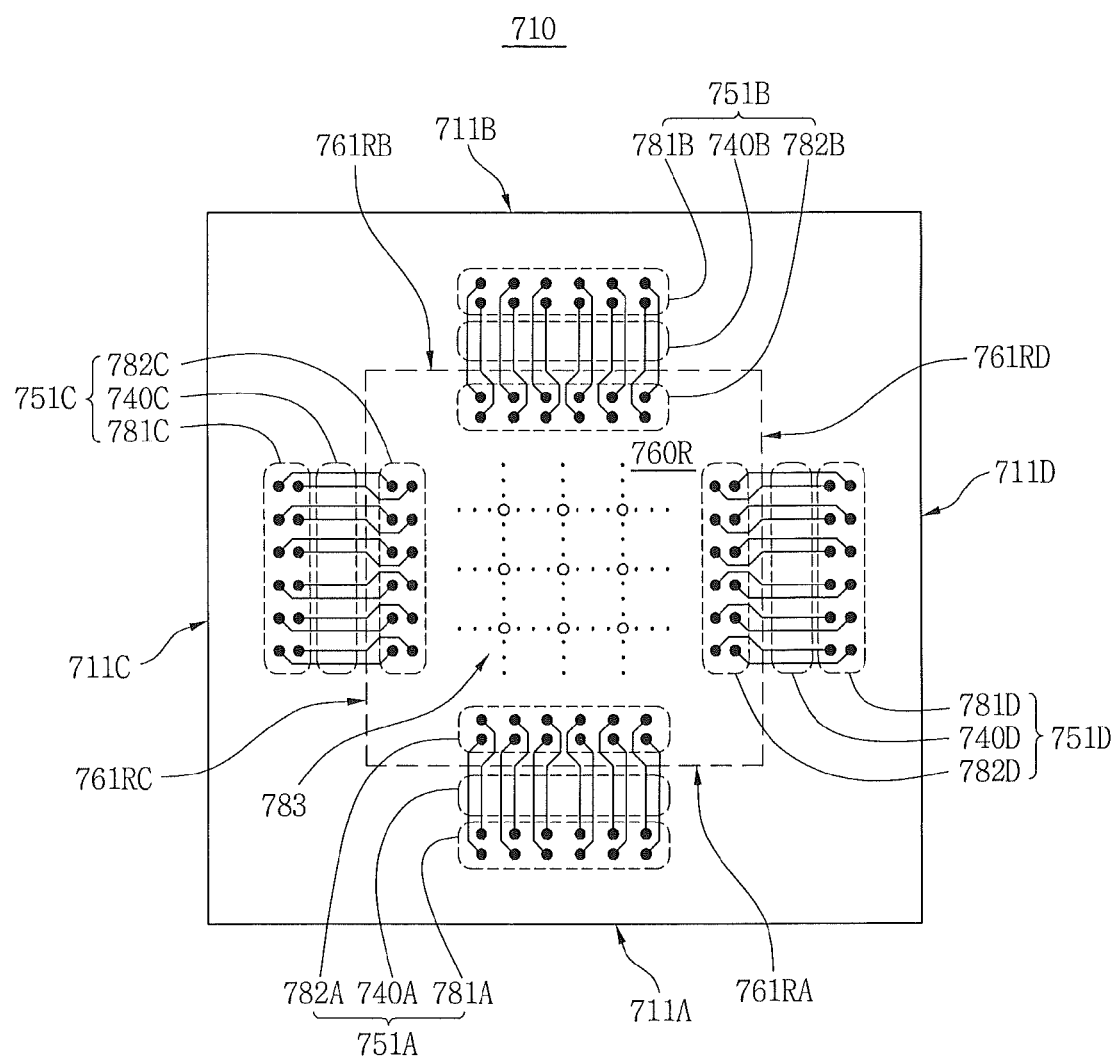
FIG. 11C is a conceptual top view illustrating routing concepts of a package substrate of the semiconductor package of FIGS. 11A and 11B according to various embodiments.

FIG. 11C is a conceptual top view illustrating routing concepts of the package substrate 710 of the semiconductor package 70A of FIGS. 11A and 11B. Referring to FIG. 11C, the package substrate 710 may include first through fourth substrate interconnection elements 751A to 751D respectively disposed near the first through fourth outer sides 711A to 711D. The first through fourth substrate interconnection elements 751A to 751D may include the first through fourth peripheral chip connection bumps 781A to 781D, first through fourth substrate interconnections 740A to 740D, and the first through fourth central chip connection bumps 782A to 782D, respectively. The first through fourth substrate interconnections 740A to 740D may include one of the uppermost metal interconnection layer 741, the upper metal interconnection layer 743, the core layer 745, the lower metal interconnection layer 747, or the lowermost metal interconnection layer 749. For example, the first through fourth substrate interconnections 740A to 740D may include the uppermost metal interconnection layer 741.

Each of the first through fourth substrate interconnection elements 751A to 751D may be disposed near the corresponding one of first through fourth sides 761RA to 761RD of a central semiconductor device region 760R.

Figure 11D:
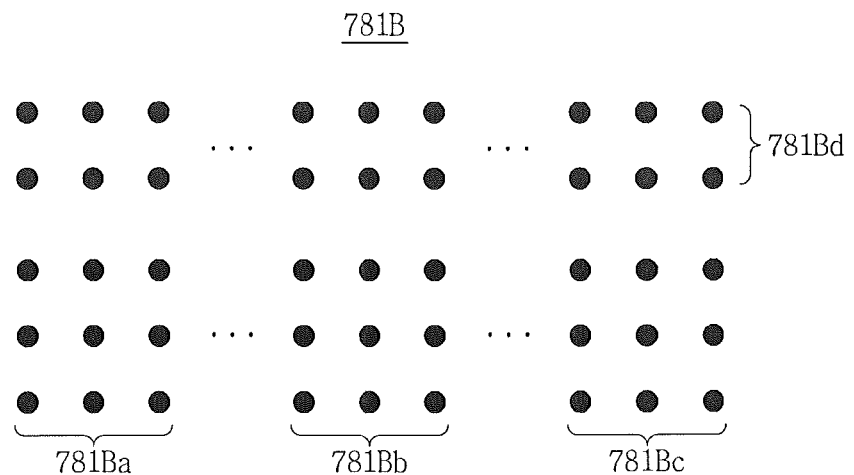
FIG. 11D is a conceptual top view illustrating disposition concepts of second peripheral chip connection bumps (out of first through fourth peripheral chip connection bumps) of a semiconductor package according to various embodiments.

FIG. 11D is a conceptual top view illustrating disposition concepts of second peripheral chip connection bumps 781B (among the first through fourth peripheral chip connection bumps 781A to 781D) of a semiconductor package 710 according to various embodiments of the inventive concept. The same concept may be applied to the remaining peripheral chip connection bumps 781A, 781C, and 781D.

Referring to FIG. 11D, the second peripheral chip connection bumps 781B may include first through fourth groups of peripheral chip connection bumps 781Ba to 781Bd.

Among the first through third groups of peripheral chip connection bumps 781Ba to 781Bc, two groups may transmit data signals and/or voltages for the data signals, and the remaining one group may transmit address/control signals. For instance, the first and third groups of peripheral chip connection bumps 781Ba and 781Bc may transmit data signals and/or a supply voltage Vddq for the data signals, and the second group of peripheral chip connection bumps 781Bb may transmit address/control signals. For example, the first and third groups of peripheral chip connection bumps 781Ba and 781Bc may be disposed on both sides on the second peripheral chip connection bumps 781B, and the second group of peripheral chip connection bumps 781Bb may be disposed in a middle region between the first and third groups of peripheral chip connection bumps 781Ba and 781Bc. The address/control signals may be transmitted to the middle region and the data signals may be transmitted to both of the sides so that a signal balance may be symmetrically stabilized.

In another example, the first and second groups of peripheral chip connection bumps 781Ba and 781Bb may transmit data signals and/or voltages for the data signals, and the third group of peripheral chip connection bumps 781Bc may transmit address/control signals. In yet another example, the second and third groups of peripheral chip connection bumps 781Bb and 781Bc may transmit data signals and/or voltages for the data signals, and the first group of peripheral chip connection bumps 781Ba may transmit address/control signals.

In various embodiments, among the first through third groups of peripheral chip connection bumps 781Ba, 781Bb, and 781Bc, two groups configured to transmit data signals and/or reference voltages for the data signals may include the same number of conductive elements. In other words, all the elements configured to transmit the data signals and/or the reference voltages for the data signals may be divided into two groups by half.

Referring still to FIG. 11D, the first through fourth peripheral chip connection bumps 781A to 781D of the semiconductor package 710 according to various embodiments of the inventive concept may include a fourth group of peripheral chip connection bumps disposed on any one side of the first through third groups of peripheral chip connection bumps. For example, referring again to FIG. 11C, the fourth group of peripheral chip connection bumps 781Bd may be disposed near the first through fourth sides 711A to 711D of the semiconductor package 710. The first through fourth groups of peripheral chip connection bumps 781Ba to 781Bd may transmit or provide a supply voltage Vdd, a ground voltage GND, or various reference voltages.

Figure 11E:
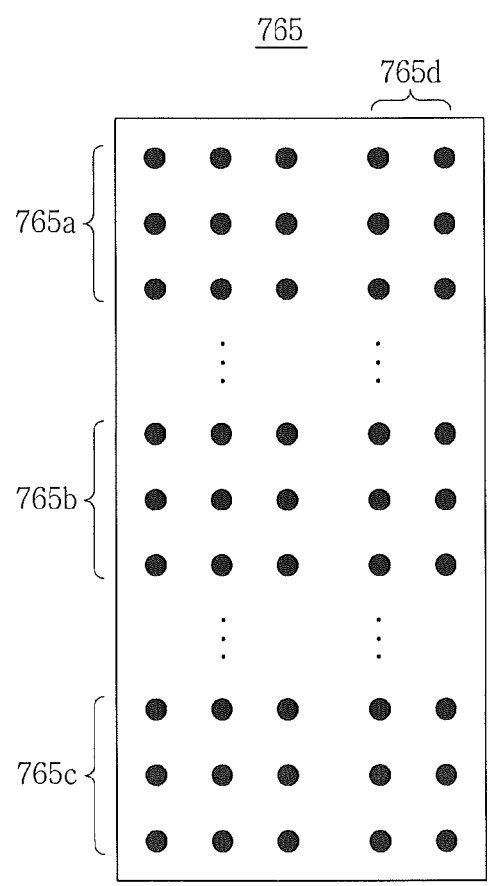
FIG. 11E is a conceptual bottom view illustrating disposition concepts of bump lands of one peripheral semiconductor device (out of first through fourth peripheral semiconductor devices) according to various embodiments.

FIG. 11E is a conceptual bottom view illustrating disposition concepts of bump lands of one peripheral semiconductor device (among the first through fourth peripheral semiconductor devices 765A to 765D) according to various embodiments of the inventive concept. Referring to FIG. 11E, a peripheral semiconductor device 765 according to various embodiments of the inventive concept may include first through fourth groups of chip bump lands 765a to 765d. The first through third groups of chip bump lands 765a to 765c may be disposed opposite the fourth group of chip bump lands 765d. For instance, the first through third groups of chip bump lands 765a to 765c may be disposed near a left side, and the fourth chip bump lands 765d may be disposed near a right side. It will be understood that the left and right sides may be interchanged.

Among the first through third groups of chip bump lands 765a to 765c, two groups may transmit data signals and/or voltages for the data signals, and the remaining one group may transmit address/control signals. For instance, the first and third groups of chip bump lands 765a and 765c may transmit data signals and/or a supply voltage Vddq for the data signals, and the second group of chip bump lands 765b may transmit address/control signals. For example, the first and third groups of chip bump lands 765a and 765c may be disposed on both sides of the peripheral semiconductor device 765, and the second group of chip bump lands 765b may be disposed in a middle region between the first and third groups of chip bump lands 765a and 765c. The address/control signals may be transmitted to the middle region and the data signals may be transmitted to both of the sides so that a signal balance may be symmetrically stabilized.

In another example, the first and second groups of peripheral chip bump lands 765a and 765b may transmit data signals and/or voltages for the data signals, and the third group of peripheral chip bump lands 765c may transmit address/control signals. In yet another example, the second and third groups of chip bump lands 765b and 765c may transmit data signals and/or voltages for the data signals, and the first group of chip bump lands 765a may transmit address/control signals.

In various embodiments, among the first through third groups of chip bump lands 765a to 765c, two groups configured to transmit data signals and/or reference voltages for the data signals may include the same number of conductive elements. In other words, all elements configured to transmit the data signals and/or the reference voltages for the data signals may be divided into two groups by half.

Figure 12A:
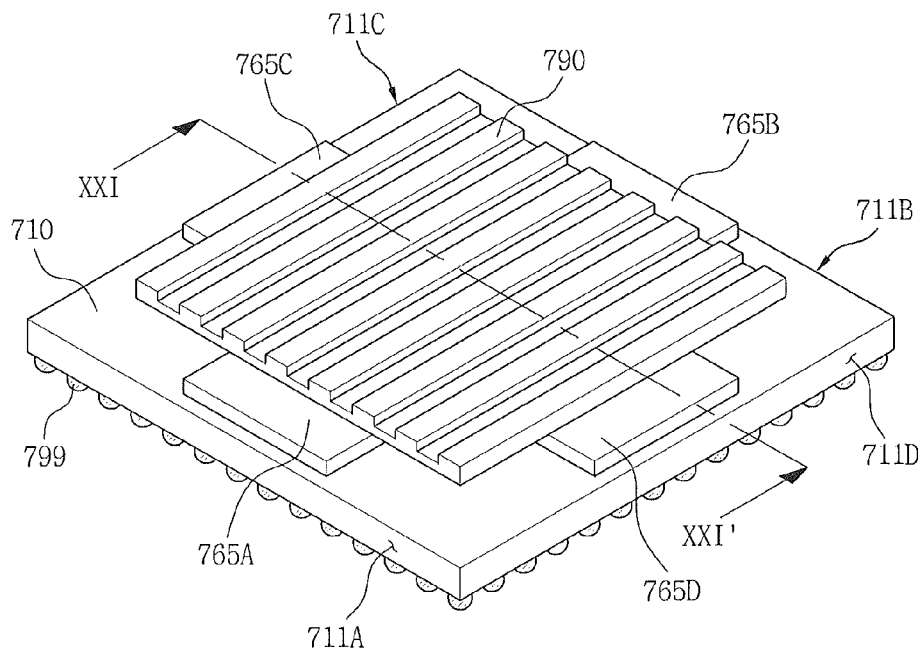
FIG. 12A is a conceptual perspective view of a semiconductor package according to various embodiments.
Figure 12B:
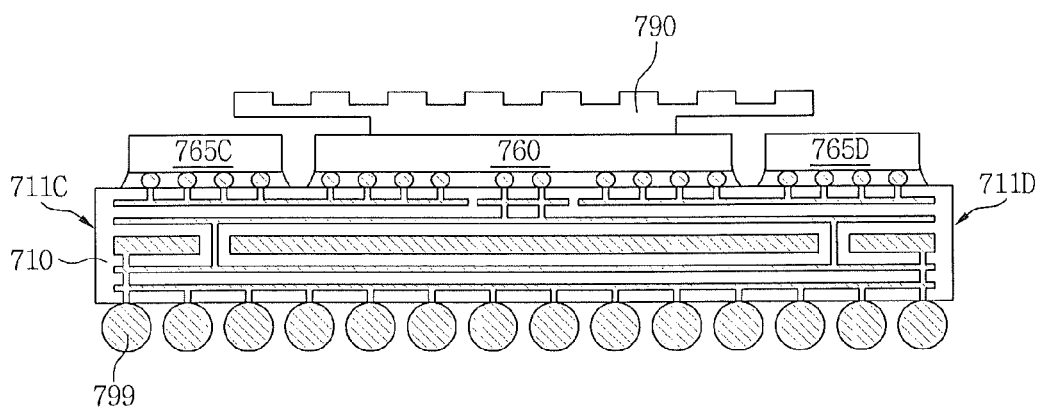
FIG. 12B is a longitudinal sectional view or side view taken along a direction XXI-XXI' of FIG. 12A according to various embodiments.

FIG. 12A is a conceptual perspective view of a semiconductor package 70B according to various embodiments of the inventive concept, and FIG. 12B is a longitudinal sectional view or side view taken along a direction XXI-XXI' of FIG. 12A. Referring to FIGS. 12A and 12B, the semiconductor package 70B according to various embodiments of the inventive concept may include a central semiconductor device 760 disposed in a central region of a package substrate 710, first through fourth peripheral semiconductor devices 765A to 765D disposed in a peripheral region of the package substrate 710, and a heat sink 790 disposed on the central semiconductor device 760. The heat sink 790 may have an overhang shape to enhance heat dissipation efficiency. For example, the heat sink 790 may extend over/above the first through fourth peripheral semiconductor devices 765A to 765D. Moreover, the semiconductor package 70B according to various embodiments may be understood with reference to FIGS. 11A through 11D and other drawings described herein.

Figure 13A:
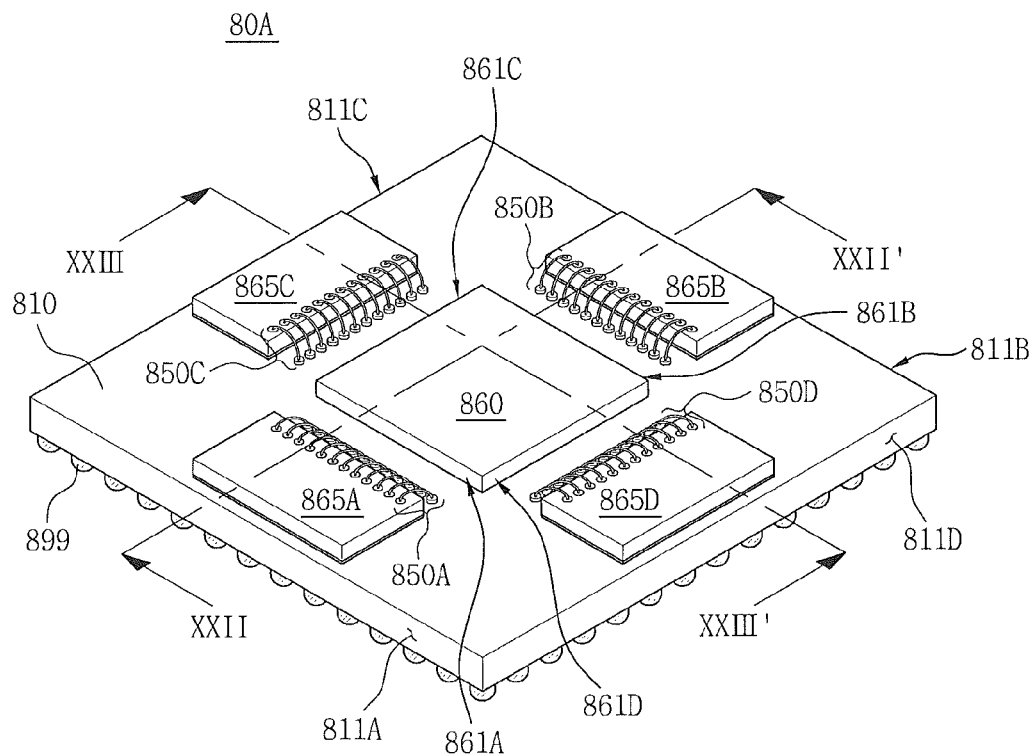
FIG. 13A is a conceptual perspective view of a semiconductor package according to various embodiments.
Figure 13B:
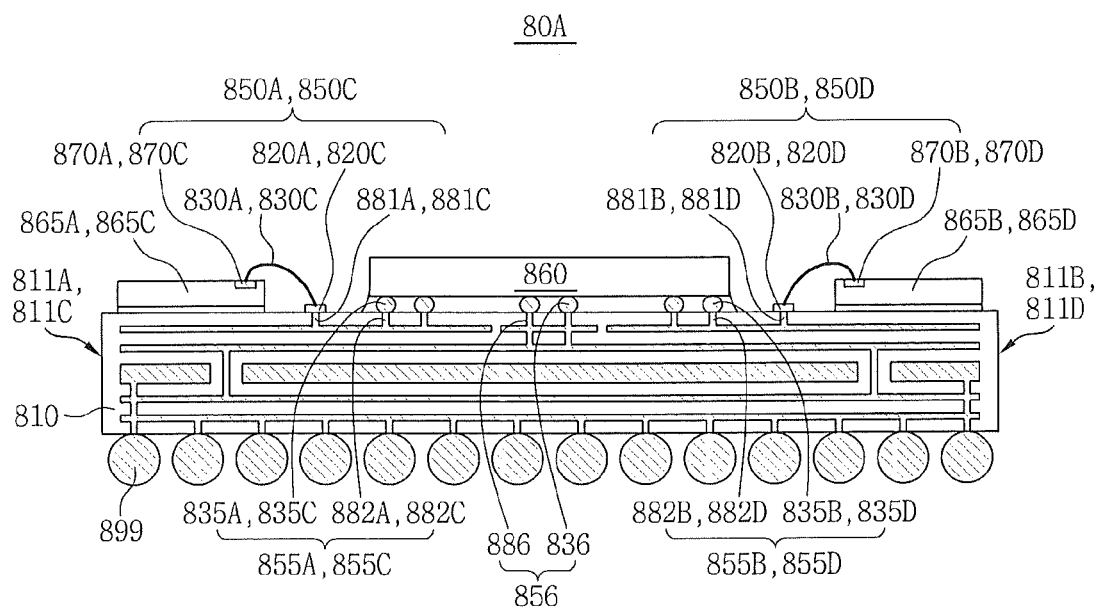
FIG. 13B is a longitudinal sectional view or side view taken along a direction XXII-XXII' or XXIII-XXIII' of FIG. 13A according to various embodiments.

FIG. 13A is a conceptual perspective view of a semiconductor package 80A according to various embodiments of the inventive concept, and FIG. 13B is a longitudinal sectional view or side view taken along a direction XXII-XXII' or XXIII-XXIII' of FIG. 13A. Referring to FIG. 13A, the semiconductor package 80A may include a central semiconductor device 860 disposed in a central region of the package substrate 810, and first through fourth peripheral semiconductor devices 865A to 865D disposed in a peripheral region of the package substrate 810.

The package substrate 810 may include first through fourth sides 811A to 811D. Thus, each of the first through fourth peripheral semiconductor devices 865A to 865D may be disposed near the corresponding one of the first through fourth sides 811A to 811D of the package substrate 810. The first through fourth sides 811A to 811D of the package substrate 810 may be referred to as first through fourth outer sides 811A to 811D, respectively. The central semiconductor device 860 may include first through fourth sides 861A to 861D corresponding respectively to the first through fourth outer sides 811A to 811D of the package substrate 810. The first through fourth sides 861A to 861D of the central semiconductor device 860 may be referred to as first through fourth inner sides 861A to 861D, respectively.

The central semiconductor device 860 may be electrically connected to the package substrate 810 using a flip-chip bonding technique. Flip-chip bonding elements corresponding with the flip-chip bonding technique will be understood by those skilled in the art. The first through fourth peripheral semiconductor devices 865A to 865D may be electrically connected to the package substrate 810 using first through fourth peripheral chip connection elements 850A to 850D. The first through fourth peripheral chip connection elements 850A to 850D may be understood in further detail with reference to other drawings herein. The central semiconductor device 860 may be a logic device, and the first through fourth peripheral semiconductor devices 865A to 865D may be memory devices. A plurality of board bumps 899 may be disposed under the package substrate 810.

Referring to FIG. 13B, the central semiconductor device 860 may be electrically connected to metal interconnection layers of the package substrate 810 through fifth central chip connection elements 856. The metal interconnection layers of the package substrate 810 may be understood with reference to the other drawings of the present disclosure.

The central semiconductor device 860 may include first through fourth central chip connection elements 855A to 855D disposed near the first through fourth inner sides 861A to 861D, respectively. The first through fourth central chip connection elements 855A to 855D may include first through fourth central chip bumps 835A to 835D and first through fourth central chip connection bumps 882A to 882D, respectively. The first through fourth central chip bumps 835A to 835D may include a metal, such as Cu, Ni, Ag, or a solder. The first through fourth central chip connection bumps 882A to 882D may include pads, lands, or via plugs. Thus, the central semiconductor device 860 may be electrically connected to metal interconnection layers of the package substrate 810 through the first through fourth central chip connection elements 855A to 855D (i.e., the first through fourth central chip bumps 835A to 835D and the first through fourth central chip connection bumps 882A to 882D).

The central semiconductor device 860 may further include the fifth central chip connection elements 856, which may not be electrically connected to the first through fourth peripheral semiconductor devices 865A to 865D. The fifth central chip connection elements 856 may include fifth central chip bumps 836 and fifth central chip connection bumps 886. The fifth central chip connection bumps 886 may include pads, lands and/or vias.

Each of the first through fourth peripheral semiconductor devices 865A to 865D may include first through fourth peripheral chip connection elements 850A to 850D disposed near the first through fourth inner sides 861A to 861D, respectively. The first through fourth peripheral chip connection elements 850A to 850D may respectively include first through fourth substrate pads 820A to 820D, first through fourth chip pads 870A to 870D, and first through fourth wires 830A to 830D configured to electrically connect the first through fourth substrate pads 820A to 820D with the first through fourth chip pads 870A to 870D. The first through fourth peripheral chip connection elements 850A to 850D may include first through fourth peripheral chip connection bumps 881A to 881D, respectively. The first through fourth peripheral chip connection bumps 881A to 881D may be vias of the package substrate 810. Thus, the first through fourth peripheral semiconductor devices 865A to 865D may be electrically connected to metal interconnection layers of the package substrate 810 through the first through fourth peripheral chip connection elements 850A to 850D (i.e., the first through fourth chip pads 870A to 870D, the first through fourth wires 830A to 830D, the first through fourth substrate pads 820A to 820D, and the first through fourth peripheral chip connection bumps 881A to 881D).

In the semiconductor package 80A according to various embodiments, each of the first through fourth peripheral semiconductor devices 865A to 865D may be disposed near the corresponding one of the first through fourth outer sides 811A to 811D of the package substrate 810, and each of the first through fourth peripheral chip connection elements 850A to 850D may be disposed near the corresponding one of the first through fourth inner sides 861A to 861D. The semiconductor package 80A according to various embodiments may be effectively applied to (i.e., implemented in) electronic devices, particularly, electronic devices that would benefit from thin elements.

Figure 14A:
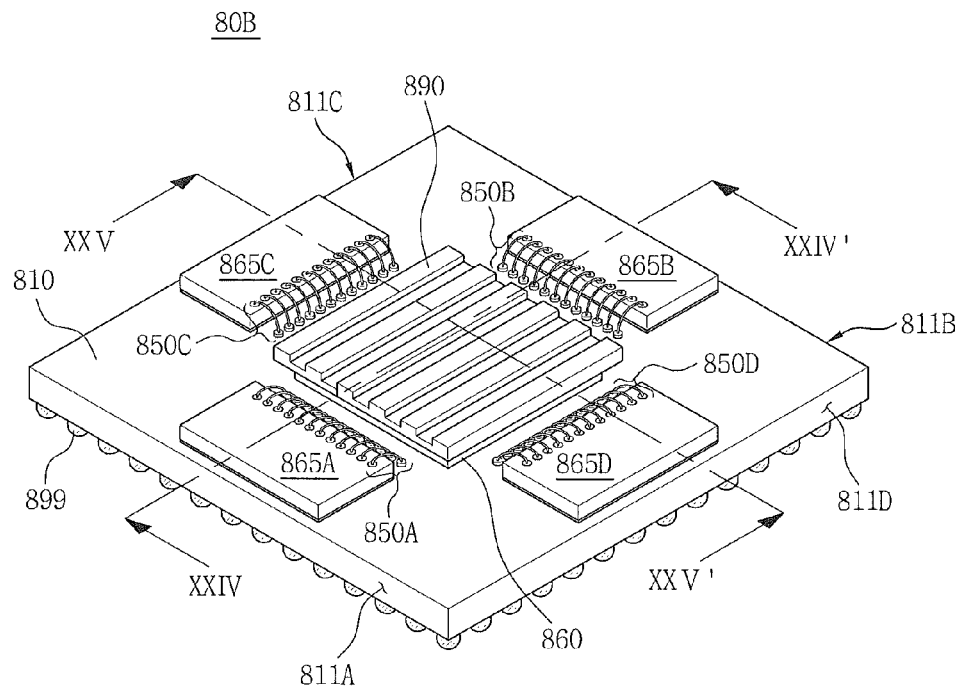
FIG. 14A is a conceptual perspective view of a semiconductor package according to various embodiments.
Figure 14B:
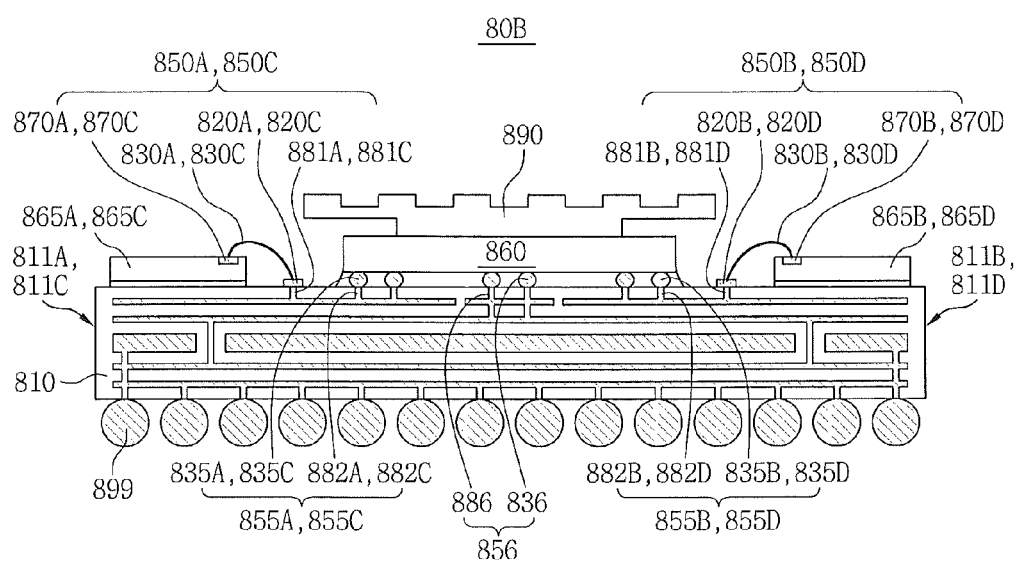
FIG. 14B is a longitudinal sectional view or side view taken along a direction XXIV-XXIV' or XXV-XXV' of FIG. 14A according to various embodiments.

FIG. 14A is a conceptual perspective view of a semiconductor package 80B according to various embodiments of the inventive concept, and FIG. 14B is a longitudinal sectional view or side view taken along a direction XXIV-XXIV' or XXV-XXV' of FIG. 14A. Referring to FIGS. 14A and 14B, the semiconductor package 80B according to various embodiments may include a central semiconductor device 860 disposed in a central region of a package substrate 810, first through fourth peripheral semiconductor devices 865A to 865D disposed in a peripheral region of the package substrate 810, and a heat sink 890 disposed on the central semiconductor device 860. Various elements of the semiconductor package 80B may be understood with reference to the semiconductor package 80A described with reference to FIGS. 13A and 13B.

Figure 15A:
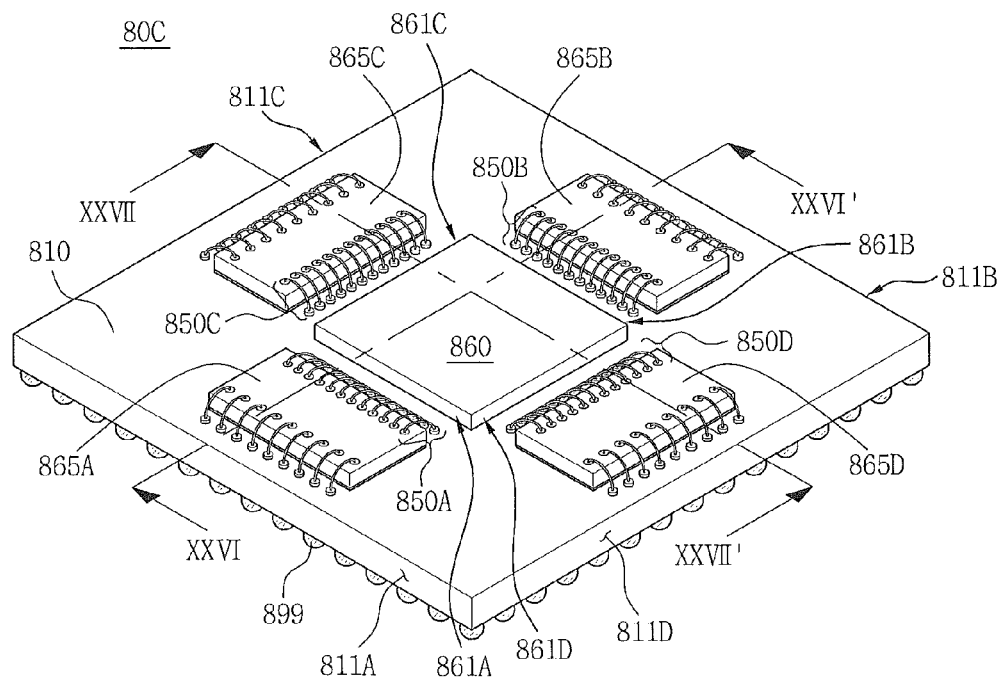
FIG. 15A is a conceptual perspective view of a semiconductor package according to various embodiments.
Figure 15B:
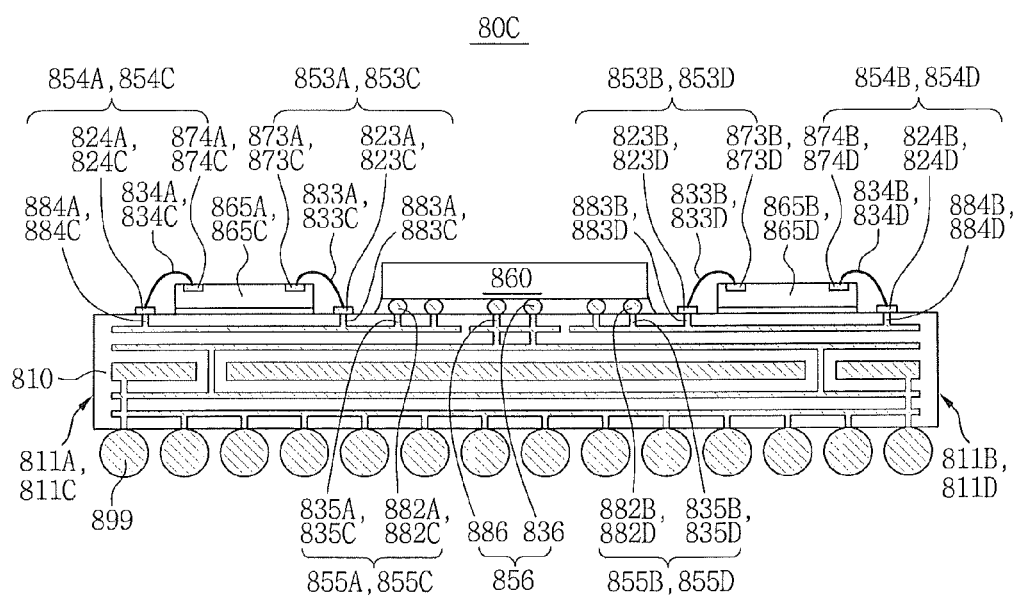
FIG. 15B is a longitudinal sectional view or side view taken along a direction XXVI-XXVI' or XXVII-XXVII' of FIG. 15A according to various embodiments.

FIG. 15A is a conceptual perspective view of a semiconductor package 80C according to various embodiments of the inventive concept, and FIG. 15B is a longitudinal sectional view or side view taken along a direction XXVI-XXVI' or XXVII-XXVII' of FIG. 15A. Referring to FIG. 15A, as compared with the semiconductor package 80A of FIG. 13A, the semiconductor package 80C may include first through fourth inner peripheral chip connection elements 853A to 853D and first through fourth outer peripheral chip connection elements 854A to 854D. The first through fourth inner peripheral chip connection elements 853A to 853D may transmit data signals, reference voltages for the data signals, and/or address/control signals. The first through fourth outer peripheral chip connection elements 854A to 854D may transmit or provide a supply voltage or a reference voltage.

The first through fourth inner peripheral chip connection elements 853A to 853D may respectively include first through fourth inner substrate pads 823A to 823D, first through fourth inner chip pads 873A to 873D, and first through fourth inner wires 833A to 833D configured to electrically connect the first through fourth inner substrate pads 823A to 823D with the first through fourth inner chip pads 873A to 873D. The first through fourth outer peripheral chip connection elements 854A to 854D may respectively include first through fourth outer substrate pads 824A to 824D, first through fourth outer chip pads 874A to 874D, and first through fourth outer wires 834A to 834D configured to electrically connect the first through fourth outer substrate pads 824A to 824D with the first through fourth outer chip pads 874A to 874D.

Figure 15C:
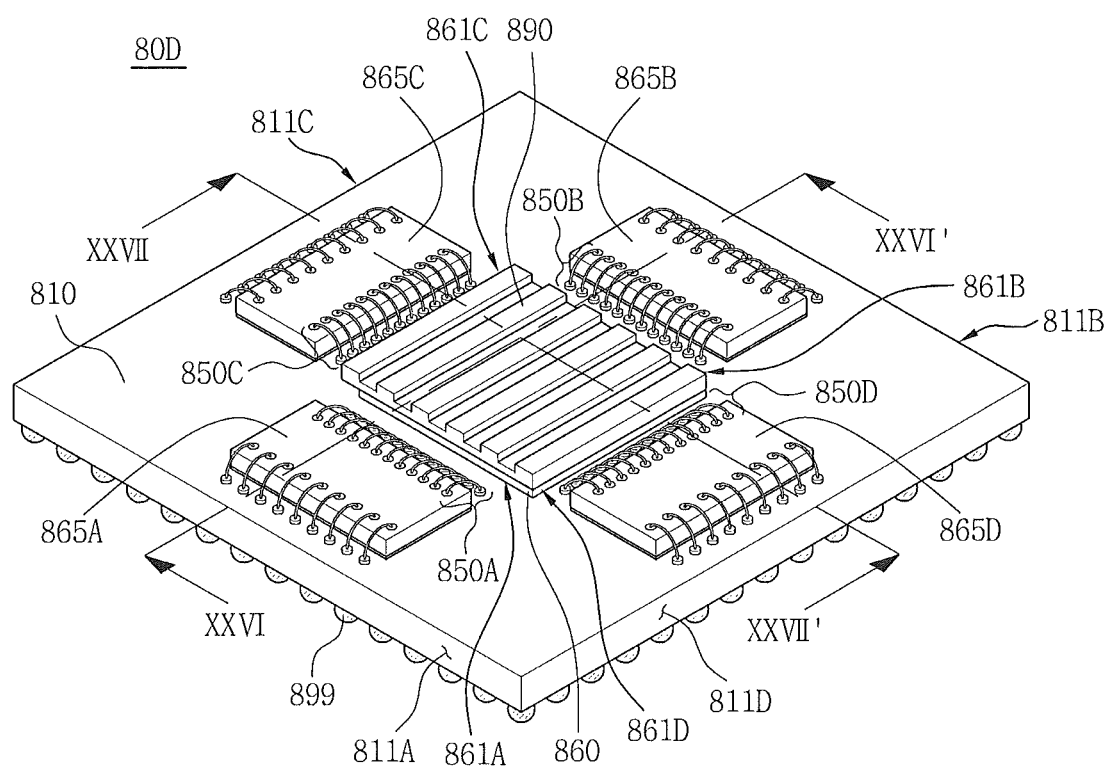
FIG. 15C is a conceptual perspective view of a semiconductor package according to various embodiments.

FIG. 15C is a conceptual perspective view of a semiconductor package 80D according to various embodiments of the inventive concept. Referring to FIG. 15C, the semiconductor package 80D according to various embodiments may include a heat sink 890 disposed on a central semiconductor device 860. A detailed description of the semiconductor package 80D will be understood with further reference to other appended drawings herein.

Figure 16:
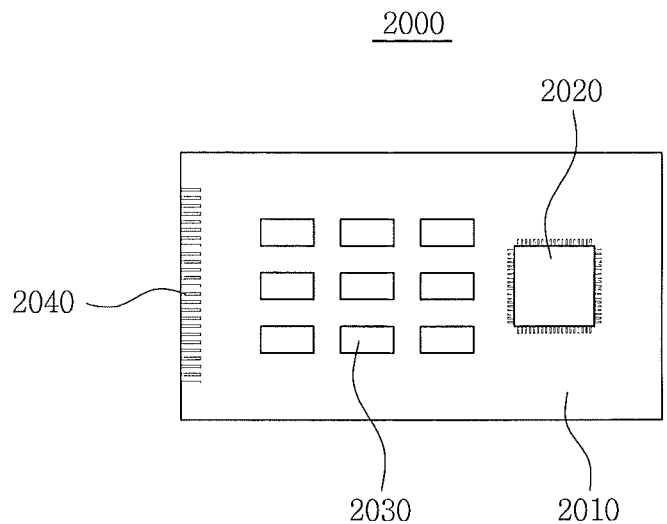
FIG. 16 is a conceptual diagram of a module including at least one semiconductor package, according to various embodiments.

FIG. 16 is a conceptual diagram of a module, which includes at least one semiconductor package, according to various embodiments of the inventive concept.

Referring to FIG. 16, a module 2000 according to various embodiments of the inventive concept may include at least one of semiconductor package 2030 according to various embodiments of the inventive concept, which may be mounted on a module substrate 2010. The module 2000 may further include an microprocessor (MP) 2020 mounted on the module substrate 2010. I/O terminals 2040 may be disposed on at least one side of the module substrate 2010. According to various embodiments, package stack structures 2030 may be mounted on the module substrate 2010 using a flip-chip technique.

Figure 17:
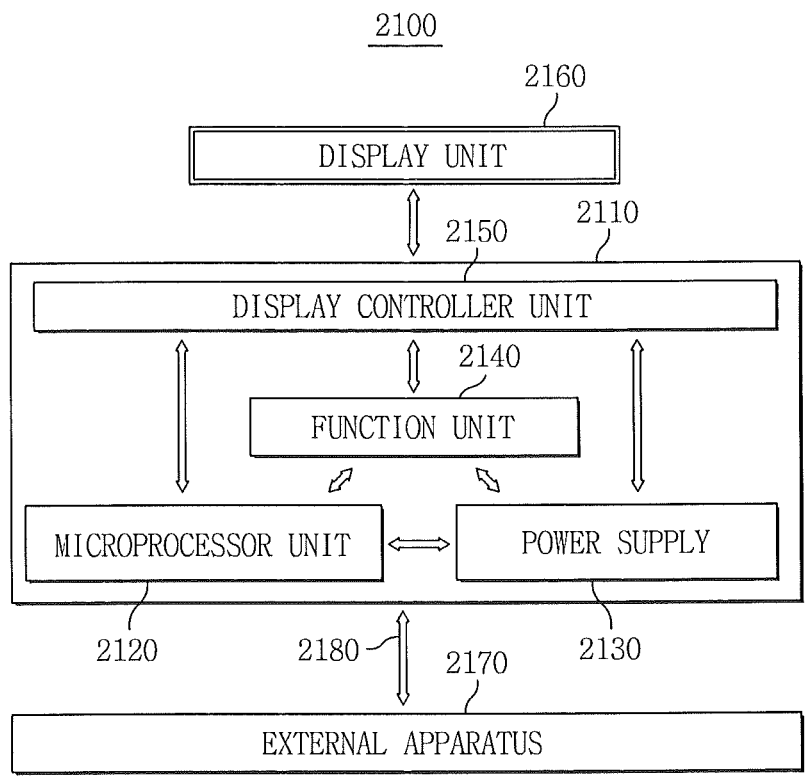
FIG. 17 is a conceptual block diagram of an electronic system including various semiconductor packages, according to various embodiments.

FIG. 17 is a conceptual block diagram of an electronic system 2100 including various semiconductor packages according to various embodiments of the inventive concept.

Referring to FIG. 17, various semiconductor packages according to various embodiments of the inventive concept may be applied to the electronic system 2100. The electronic system 2100 may include a body 2110, an MP unit 2120, a power unit 2130, a function unit 2140, and/or a display controller unit 2150. The body 2110 may be a system board or mother board having a PCB. The MP unit 2120, the power unit 2130, the function unit 2140, and the display controller unit 2150 may be mounted on the body 2110. A display unit 2160 may be disposed on a top surface of the body 2110 and/or outside the body 2110. For example, the display unit 2160 may be disposed on a surface of the body 2110 and may display an image processed by the display controller unit 2150.

The power unit 2130 may receive a predetermined voltage from an external power source, divide the predetermined voltage into voltages having various voltage levels, and transmit the divided voltages to the MP unit 2120, the function unit 2140, and the display controller unit 2150. The MP unit 2120 may receive a voltage from the power unit 2130, and control the function unit 2140 and the display unit 2160. The function unit 2140 may implement various functions of the electronic system 2100. For instance, when the electronic system 2100 is a mobile electronic product, such as a portable phone, the function unit 2140 may include several elements corresponding to and/or capable of wireless communication functions, such as the output of an image to the display unit 2160 or the output of voices to a speaker, by dialing or communication with an external unit 2170. Moreover, when the function unit 2140 includes a camera, the function unit 2140 may serve as an image processor.

In various applied embodiments, when the electronic system 2100 is connected to a memory card to increase the capacity of the electronic system 2100, the function unit 2140 may be a memory card controller. The function unit 2140 may transmit and receive signals to and from the external apparatus 2170 through a wired or wireless communication unit 2180. In addition, when the electronic system 2100 needs a universal serial bus (USB) to expand functions thereof, the function unit 2140 may serve as an interface controller.

Semiconductor packages according to various embodiments of the inventive concept described herein may be included in at least one of the MP unit 2120 and the function unit 2140.

Figure 18:
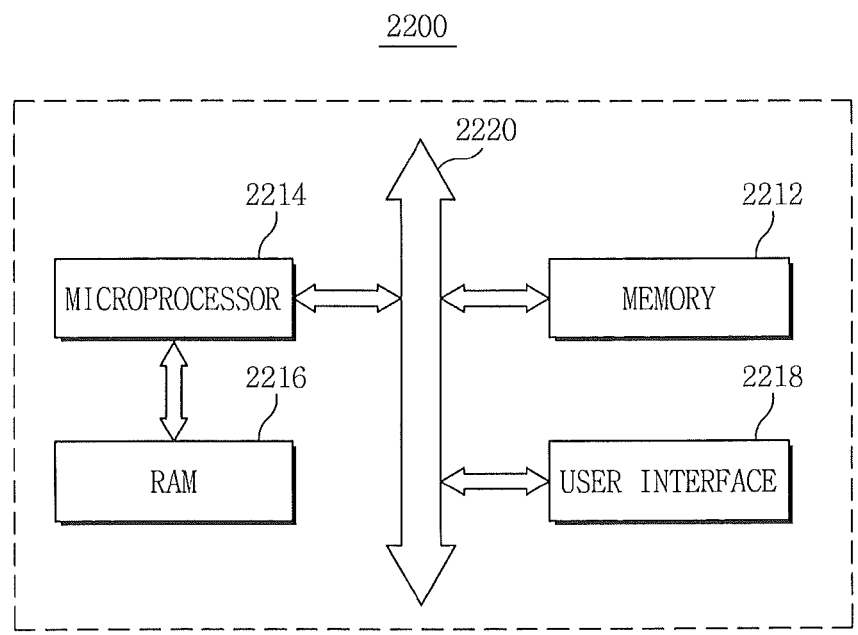
FIG. 18 is a schematic block diagram of an electronic system including a semiconductor package, according to various embodiments.

FIG. 18 is a schematic block diagram of an electronic system 2200 including a semiconductor package according to various embodiments of the inventive concept. Referring to FIG. 18, the electronic system 2200 may include at least one of semiconductor packages according to various embodiments of the inventive concept described herein. The electronic system 2200 may be used for/within a mobile device or computer. For example, the electronic system 2200 may include a user interface 2218 configured to communicate data using a memory system 2212, an MP 2214, a RAM 2216, and a bus 2220. The MP 2214 may program and control the electronic system 2200. The RAM 2216 may be used as an operation memory of the MP 2214. For example, the MP 2214 or the RAM 2216 may include a semiconductor device or semiconductor package according to various embodiments of the inventive concept. The MP 2214, the RAM 2216, and/or other elements may be assembled within a single package. The user interface 2218 may be used to input data to the electronic system 2200 or output data from the electronic system 2200. The memory system 2212 may store codes for operating the MP 2214, data processed by the MP 2214, or external input data. The memory system 2212 may include a controller and a memory.

Figure 19:
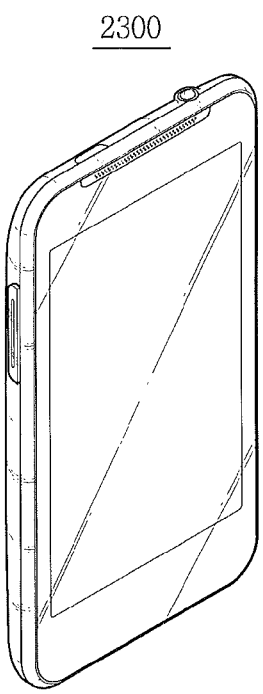
FIG. 19 is a schematic diagram of a mobile wireless phone including a semiconductor package, according to various embodiments.

FIG. 19 is a schematic diagram of a mobile wireless phone 2300 including any one of semiconductor packages described herein according to various embodiments of the inventive concept. In various embodiments, the mobile wireless phone 2300 may be interpreted as a tablet personal computer (PC). In addition, at least one of the semiconductor packages according to various embodiments of the inventive concept may be used not only for a tablet PC but also for a portable computer such as a laptop computer, an MPEG-1 audio layer 3 (MP3) player, an MP4 player, a navigation device, a solid-state disk (SSD), a table (or desktop) computer, or various electronic devices for automotive and household uses.

A semiconductor device according to various embodiments of the inventive concept can include a plurality of semiconductor devices capable of electrically communicating data or signals through a plurality of independent channels. Since the plurality of channels may be formed not to overlap one another, various conductive elements required for forming the channels can be simply configured. Thus, an area and thickness of the entire semiconductor package can be reduced. Also, signal interconnections can be separated to ensure signal stability.

While the inventive concept has been particularly shown and described with reference to various embodiments thereof, it will be understood by those of ordinary skill in the art that various changes in form and details may be made therein without departing from the spirit and scope of the inventive concept as defined by the following claims. Therefore, the above-disclosed subject matter is to be considered illustrative and not restrictive.

What is claimed is:

1. A semiconductor package comprising:
a package substrate comprising first through fourth outer sides;
a lower semiconductor device that is on the package substrate and that comprises first through fourth inner sides corresponding respectively to the first through fourth outer sides;
first through fourth upper semiconductor devices on the lower semiconductor device at positions corresponding to the first through fourth inner sides, respectively; and
first through fourth lower chip connection elements between the package substrate and the lower semiconductor device,
wherein each of the first through fourth lower chip connection elements is adjacent a corresponding one of the first through fourth inner sides and is electrically connected to a corresponding one of the first through fourth upper semiconductor devices.

2. The semiconductor package of claim 1, further comprising first through fourth upper chip connection elements configured to electrically connect the first through fourth upper semiconductor devices with the first through fourth lower chip connection elements, respectively.

3. The semiconductor package of claim 2, wherein each of the first through fourth upper chip connection elements is adjacent a corresponding one of the first through fourth outer sides.

4. The semiconductor package of claim 3, wherein the first through fourth upper chip connection elements respectively comprise first through fourth chip pads on the first through fourth upper semiconductor devices, first through fourth substrate pads on the package substrate, and first through fourth wires configured to electrically connect the first through fourth chip pads with the first through fourth substrate pads.

5. The semiconductor package of claim 4, wherein the first through fourth chip pads are only on one half of respective surfaces of the first through fourth upper semiconductor devices.

6. The semiconductor package of claim 5, wherein each of the first through fourth chip pads is adjacent the corresponding one of the first through fourth outer sides.

7. The semiconductor package of claim 2, wherein the first through fourth lower chip connection elements respectively comprise first through fourth lower chip bump lands on the package substrate and first through fourth lower chip bumps on the first through fourth lower chip bump lands.

8. The semiconductor package of claim 1, further comprising fifth lower chip connection elements between the package substrate and the lower semiconductor device, wherein the fifth lower chip connection elements are not connected to any of the first through fourth upper semiconductor devices.

9. The semiconductor package of claim 1, wherein each of the first through fourth lower chip connection elements is configured to transmit data signals and/or address/control signals of the corresponding one of the first through fourth upper semiconductor devices.

10. The semiconductor package of claim 1,
wherein the third upper semiconductor device is beside the fourth upper semiconductor device on the package substrate, and
wherein the first upper semiconductor device is beside the second upper semiconductor device on the third and fourth upper semiconductor devices.

11. The semiconductor package of claim 10, wherein the first through fourth upper semiconductor devices comprise respective lateral surfaces that horizontally protrude outward beyond corresponding lateral surfaces of the lower semiconductor device.

12. The semiconductor package of claim 1, further comprising a heat sink on the lower semiconductor device.

13. The semiconductor package of claim 12, wherein the heat sink directly contacts a top surface of the lower semiconductor device and extends to overlap the first through fourth upper semiconductor devices.

14. The semiconductor package of claim 1, wherein the package substrate comprises a core layer, an upper metal interconnection layer on the core layer, and an uppermost metal interconnection layer on the upper metal interconnection layer, wherein at least two of the first through fourth lower chip connection elements are electrically connected to the uppermost metal interconnection layer.

15. A semiconductor package comprising:
a package substrate;
a lower semiconductor device that is on the package substrate and that comprises first through fourth inner sides;
first through fourth upper semiconductor devices on the lower semiconductor device at positions corresponding to the first through fourth inner sides, respectively;
first through fourth substrate pads that are on the package substrate and are adjacent the first through fourth inner sides, respectively; and
first through fourth wires configured to electrically connect the first through fourth upper semiconductor devices with the first through fourth substrate pads, respectively.

* * * * *